(12) United States Patent
Park et al.

(10) Patent No.: US 12,232,364 B2
(45) Date of Patent: Feb. 18, 2025

(54) PIXEL AND DISPLAY DEVICE INCLUDING THE SAME

(71) Applicant: Samsung Display Co., Ltd., Yongin-si (KR)

(72) Inventors: Ji Eun Park, Yongin-si (KR); Dal Rae Jin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 494 days.

(21) Appl. No.: 17/451,052

(22) Filed: Oct. 15, 2021

(65) Prior Publication Data

US 2022/0130922 A1  Apr. 28, 2022

(30) Foreign Application Priority Data

Oct. 23, 2020  (KR) .................. 10-2020-0138673

(51) Int. Cl.
| | |
|---|---|
| H01L 27/32 | (2006.01) |
| H10K 50/813 | (2023.01) |
| H10K 50/822 | (2023.01) |
| H10K 59/122 | (2023.01) |
| H10K 59/124 | (2023.01) |

(52) U.S. Cl.
CPC ......... *H10K 59/122* (2023.02); *H10K 50/813* (2023.02); *H10K 50/822* (2023.02); *H10K 59/124* (2023.02)

(58) Field of Classification Search
None
See application file for complete search history.

(56) References Cited

U.S. PATENT DOCUMENTS

| | | | |
|---|---|---|---|
| 8,872,214 B2 | 10/2014 | Negishi et al. | |
| 9,287,242 B2 | 3/2016 | Shibata et al. | |
| 9,570,425 B2 | 2/2017 | Do | |
| 9,773,761 B2 | 9/2017 | Do | |
| 10,205,051 B2 | 2/2019 | Kim et al. | |
| 11,380,657 B2* | 7/2022 | Park | H01L 24/32 |
| 2011/0089850 A1 | 4/2011 | Shibata et al. | |
| 2018/0019369 A1* | 1/2018 | Cho | H05K 1/181 |
| 2020/0210006 A1* | 7/2020 | Son | H10K 50/844 |
| 2021/0217739 A1 | 7/2021 | Lee et al. | |

(Continued)

FOREIGN PATENT DOCUMENTS

| | | | |
|---|---|---|---|
| JP | 4814394 B2 | 11/2011 | |
| JP | 4914929 B2 | 4/2012 | |

(Continued)

*Primary Examiner* — William C Trapanese
(74) *Attorney, Agent, or Firm* — Lewis Roca Rothgerber Christie LLP

(57) ABSTRACT

An embodiment provides a pixel including: a first bank pattern on a substrate; a first electrode and a second electrode on the first bank pattern and extending in a first direction; an insulating layer on the first electrode and the second electrode; a plurality of light emitting elements on the insulating layer between the first electrode and the second electrode; a first contact electrode electrically connecting the first electrode and the light emitting elements; and a second contact electrode electrically connecting the second electrode and the light emitting elements. The first electrode and the second electrode may be spaced from each other in a second direction different from the first direction on the first bank pattern.

19 Claims, 32 Drawing Sheets

(56) References Cited

U.S. PATENT DOCUMENTS

| | | | |
|---|---|---|---|
| 2021/0242380 A1 | 8/2021 | Kim et al. |
| 2021/0305222 A1 | 9/2021 | Min et al. |
| 2021/0327954 A1 | 10/2021 | Cho et al. |
| 2021/0399181 A9 | 12/2021 | Kang et al. |

FOREIGN PATENT DOCUMENTS

| | | |
|---|---|---|
| JP | 5492822 B2 | 5/2014 |
| KR | 10-1436123 B1 | 11/2014 |
| KR | 10-1490758 B1 | 2/2015 |
| KR | 10-2018-0082667 A | 7/2018 |
| KR | 10-2019-0124359 A | 11/2019 |
| KR | 10-2020-0001649 A | 1/2020 |
| KR | 10-2020-0004936 A | 1/2020 |
| KR | 10-2020-0006209 A | 1/2020 |
| KR | 10-2020-0027136 A | 3/2020 |

\* cited by examiner

PIXEL AND DISPLAY DEVICE INCLUDING THE SAME

CROSS-REFERENCE TO RELATED APPLICATION

This application claims priority to and the benefit of Korean Patent Application No. 10-2020-0138673 filed in the Korean Intellectual Property Office on Oct. 23, 2020, the entire content of which is incorporated herein by reference.

BACKGROUND

1. Field

The present disclosure relates to a pixel and a display device including the same.

2. Description of the Related Art

As an interest in an information display largely increases and a demand for using a portable information medium increases, a demand and commercialization for display devices have been progressed in priority.

SUMMARY

The present disclosure has been made in an effort to provide a pixel that may improve light emission efficiency of light emitting elements.

Further, the present disclosure has been made in an effort to provide a display device including the above-mentioned pixel.

An embodiment of the present disclosure provides a pixel including: a first bank pattern on a substrate; a first electrode and a second electrode on the first bank pattern and extending in a first direction; an insulating layer on the first electrode and the second electrode; a plurality of light emitting elements on the insulating layer between the first electrode and the second electrode; a first contact electrode electrically connecting the first electrode and the light emitting elements; and a second contact electrode electrically connecting the second electrode and the light emitting elements. The first electrode and the second electrode may be spaced from each other in a second direction different from the first direction on the first bank pattern.

The first electrode may be on one side of the first bank pattern and partially overlaps the first bank pattern, and the second electrode may be on an other side of the first bank pattern and partially overlaps the first bank pattern.

The light emitting elements may be on the insulating layer between the first electrode and the second electrode on the first bank pattern.

The light emitting elements may overlap the first bank pattern when viewed in a plan view and in a cross-sectional view. A width of the first bank pattern in the second direction may be longer than a length of each of the light emitting elements.

The first bank pattern may include a black matrix.

The pixel may further include a bank surrounding the first and second electrodes; and a light blocking pattern on the bank. The bank and the light blocking pattern may include a same material.

The bank and the light blocking pattern may be a dam portion surrounding the first and second electrodes and the light emitting elements.

The pixel may further include a color conversion layer on the light emitting elements. The color conversion layer may fill an area in which the light emitting elements surrounded by the dam portion are located.

The pixel may further include a third electrode on the substrate adjacent the second electrode in the second direction.

The second electrode may include a first side surface opposite the first electrode and a second side surface opposite the third electrode, in the second direction.

The pixel may further include a second bank pattern on the substrate adjacent to the first bank pattern in the second direction. The second electrode and the third electrode may be spaced from each other on the second bank pattern.

The first electrode may be on one side of the first bank pattern and partially overlaps the first bank pattern. The first side surface of the second electrode may be on an other side of the first bank pattern and partially overlaps the first bank pattern. The second side surface of the second electrode may be on one side of the second bank pattern and partially overlaps the second bank pattern. The third electrode may be on an other side of the second bank pattern and partially overlaps the second bank pattern.

The light emitting elements may include: at least one first light emitting element on the first bank pattern between the first electrode and the second electrode; and at least one second light emitting element on the second bank pattern between the second electrode and the third electrode.

The second electrode and the third electrode may be spaced from each other on the substrate. The third electrode may include a first side surface opposite the second electrode and a second side surface opposite the first side surface, in the second direction.

The first electrode may be on one side of the first bank pattern and partially overlaps the first bank pattern. A first side surface of the second electrode may be on an other side of the first bank pattern and partially overlaps the first bank pattern; and a second side surface of the second electrode may be on the substrate and partially overlaps the substrate. The first side surface of the third electrode may be on the substrate and partially overlaps the substrate; and the second side surface of the third electrode may be on one side of the second bank pattern and partially overlaps the second bank pattern.

The light emitting elements may include: at least one first light emitting element on the first bank pattern between the first electrode and the first side surface of the second electrode; and at least one second light emitting element on the substrate between the second side surface of the second electrode and the first side surface of the third electrode.

Another embodiment of the present disclosure provides a display device including: a substrate including a plurality of pixel areas; and a pixel in a corresponding one of the pixel areas. The pixel may include: a bank pattern on the substrate; a first electrode and a second electrode on the bank pattern and extending in a first direction; an insulating layer on the first electrode and the second electrode; a plurality of light emitting elements on the insulating layer between the first electrode and the second electrode; a first contact electrode electrically connecting the first electrode and the light emitting elements; and a second contact electrode electrically connecting the second electrode and the light emitting elements. The first electrode and the second electrode may be spaced from each other in a second direction different from the first direction on the bank pattern.

According to the embodiment of the present disclosure, it is possible to provide a pixel and a display device including the same that may increase an amount of light emitted from light emitting elements and proceeding to a light conversion pattern layer and thereby to improve light emission efficiency of the light emitting elements, by disposing the light emitting elements on a bank pattern to reduce a gap with the light conversion pattern layer disposed on the light emitting elements.

In addition, according to the embodiment of the present disclosure, it is possible to provide a pixel and a display device including the same that may sufficiently secure an alignment area of a light emitting element between alignment electrodes such that the alignment number of light emitting elements per unit area can be increased.

Effects and aspects of the embodiments of the present disclosure are not limited by what is illustrated in the above, and more various effects and aspects of the embodiments are included in the present disclosure.

DETAILED DESCRIPTION

Figure 1:
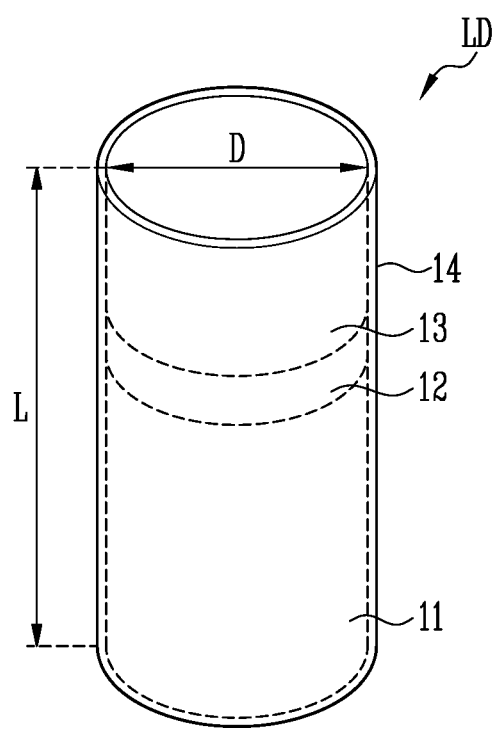
FIG. 1 illustrates a schematic perspective view of a light emitting element according to an embodiment of the present disclosure.

Because the present disclosure may be variously modified and have various forms, embodiments will be illustrated and described in detail in the following. This, however, by no means restricts the disclosure to the specific embodiments, and it is to be understood as embracing all included in the spirit and scope of the present disclosure changes, equivalents, and substitutes.

Like reference numerals are used for like constituent elements in describing each drawing. In the accompanying drawings, the dimensions of the structure are exaggerated and shown for clarity of the present disclosure. Terms such as first, second, and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the scope of the present disclosure. Singular forms are intended to include plural forms unless the context clearly indicates otherwise.

In the present disclosure, it should be understood that the term "include", "comprise", "have", or "configure" indicates that a feature, a number, a step, an operation, a constituent element, a part, or a combination thereof described in the present disclosure is present, but does not exclude a possibility of presence or addition of one or more other features, numbers, steps, operations, constituent elements, parts, or combinations, in advance. It will be understood that when an element such as a layer, film, region, area, or substrate is referred to as being "on" another element, it can be directly on the other element or intervening elements may also be present. Further, in the present disclosure, when an element of a layer, film, region, plate, or the like is referred to as being formed "on" another element, the formed direction is not limited to an upper direction but includes a lateral or lower direction. In contrast, when an element of a layer, film, region, plate, or the like is referred to as being "below" another element, it may be directly below the other element, or intervening elements may be present.

It is to be understood that, in the present disclosure, when it is described for one constituent element (for example, a first constituent element) to be (functionally or communicatively) "coupled or connected with/to" another constituent element (for example, a second constituent element), the one constituent element may be directly coupled or connected with/to the another constituent element, or may be coupled or connected with/to through the other constituent element (for example, a third constituent element). In contrast, it is to be understood that when it is described for one constituent element (for example, a first constituent element) to be "directly coupled or connected with/to" another constituent element (for example, a second constituent element), there is no other constituent element (for example, a third constituent element) between the one constituent element and the another constituent element.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Hereinafter, with reference to accompanying drawings, embodiments of the present disclosure and others required for those skilled in the art to understand the contents of the present disclosure will be described in more detail. In the description below, singular forms are to include plural forms unless the context clearly indicates only the singular.

Figure 2:
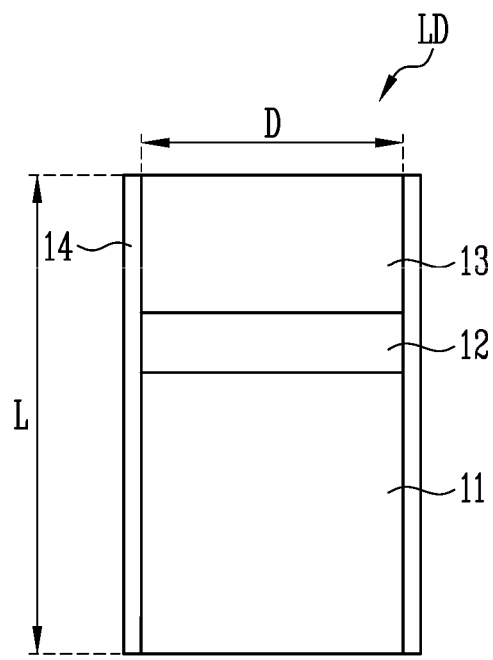
FIG. 2 illustrates a cross-sectional view of the light emitting element of FIG. 1.

FIG. 1 illustrates a schematic perspective view of a light emitting element LD according to an embodiment of the present disclosure, and FIG. 2 illustrates a cross-sectional view of the light emitting element LD of FIG. 1.

In an embodiment of the present disclosure, a type and/or shape of the light emitting element is not limited to embodiments shown in FIG. 1 and FIG. 2.

Referring to FIG. 1 and FIG. 2, a light emitting element LD may include a first semiconductor layer 11, a second semiconductor layer 13, and an active layer 12 interposed between the first and second semiconductor layers 11 and 13. For example, the light emitting element LD may be implemented as a stacked light emitting body in which the first semiconductor layer 11, the active layer 12, and the second semiconductor layer 13 are sequentially stacked along the direction of length of the light emitting element LD.

The light emitting element LD may be provided to have a shape extending in one direction. When the extending direction of the light emitting element LD is a length direction, the light emitting element LD may include one end portion (or lower end portion) and the other end portion (or upper end portion) along the extending direction. One of the first and second semiconductor layers 11 and 13 may be disposed at one end portion (or lower end portion) of the light emitting element LD, and the remaining one of the first and second semiconductor layers 11 and 13 may be disposed at the other end portion (or upper end portion) of the light emitting element LD. For example, the first semiconductor layer 11 may be disposed at one end portion (or lower end portion) of the light emitting element LD, and the second semiconductor layer 13 may be disposed at the other end portion (or upper end portion) of the light emitting element LD.

The light emitting element LD may be provided in various shapes. For example, the light emitting element LD may have a rod-like shape, a bar-like shape, or a cylindrical shape that is long in a length L direction (that is, an aspect ratio is greater than 1). However, the present disclosure is not limited thereto, and in some embodiments, the light emitting element LD may have a rod-like shape, a bar-like shape, or a cylindrical shape that is short in a length L direction (that is, an aspect ratio is smaller than 1). In some embodiments, the light emitting element LD may have a rod-like shape, a bar-like shape, or a cylindrical shape in which a length L and a diameter D are the same.

In the embodiment of the present disclosure, the length L of the light emitting element LD may be larger than the diameter D thereof (or a width of a cross-section thereof). For example, the light emitting element LD may include a light emitting diode (LED) manufactured in a ultra-small size having the diameter D and/or the length L of nano scale to micro scale.

When the aspect ratio of the light emitting element LD is larger than 1, the diameter D of the light emitting element LD may be about 0.5 μm to 6 μm, and the length L thereof may be about 1 μm to 10 μm. However, the diameter D and the length L of the light emitting element LD are not limited thereto, and the size of the light emitting element LD may be changed so that the light emitting element LD meets certain requirements (or design conditions) of a lighting device or a self-luminous display device to which the light emitting element LD is applied.

For example, the first semiconductor layer 11 may include at least one n-type semiconductor layer. For example, the first semiconductor layer 11 may include a semiconductor material of one of InAlGaN, GaN, AlGaN, InGaN, AlN, and InN, and may be a n-type semiconductor layer doped with a first conductive dopant (or n-type dopant) such as Si, Ge, Sn, or the like. However, the material included in the first semiconductor layer 11 is not limited thereto, and the first semiconductor layer 11 may be made of various materials. In the embodiment of the present disclosure, the first semiconductor layer 11 may include a gallium nitride (GaN) semiconductor material doped with the first conductive dopant (or n-type dopant). The first semiconductor layer 11 may include an upper surface contacting the active layer 12 along the direction of the length L of the light emitting device LD and a lower surface exposed to the outside. The lower surface of the first semiconductor layer 11 may be one end portion (or lower end portion) of the light emitting element LD.

The active layer 12 is disposed on the first semiconductor layer 11, and may be formed to have a single or multi-quantum well structure. For example, when the active layer 12 is formed of a multi-quantum well structure, the active layer 12 may have a structure in which a barrier layer, a strain reinforcing layer, and a well layer, which consist of one unit, are periodically and repeatedly stacked. Because the strain reinforcing layer has a smaller lattice constant than that of the barrier layer, it may further reinforce strain applied to the well layer, for example, compressive strain. However, the structure of the active layer 12 is not limited to the above-described embodiment.

The active layer 12 may emit light having a wavelength of 400 nm to 900 nm, and may have a double heterostructure. In some embodiments of the present disclosure, a cladding layer doped with a conductive dopant may be formed on upper and/or lower portions of the active layer 12 along the direction of the length L of the light emitting element LD. For example, the clad layer may be formed as an AlGaN layer or an InAlGaN layer. In some embodiments, a material such as AlGaN and InAlGaN may be used to form the active layer 12, and in addition, various materials may form the active layer 12. The active layer 12 may include a first surface contacting the first semiconductor layer 11 and a second surface contacting the second semiconductor layer 13.

When an electric field of a suitable voltage (e.g., a set or predetermined voltage) or more is applied between respective end portions of the light emitting element LD, the light emitting element LD emits light while electron-hole pairs are combined in the active layer 12. By controlling the light emission of the light emitting element LD by using this principle, the light emitting element LD may be used as a light source (or light emitting source) for various light emitting devices in addition to pixels of a display device.

The second semiconductor layer 13 is disposed on the second surface of the active layer 12, and may include a semiconductor layer of a type different from that of the first semiconductor layer 11. For example, the second semiconductor layer 13 may include at least one p-type semiconductor layer. For example, the second semiconductor layer 13 may include at least one semiconductor material of InAlGaN, GaN, AlGaN, InGaN, AlN, and InN, and may include a p-type semiconductor layer doped with a second conductive dopant (or p-type dopant) such as Mg. However, the material included in the second semiconductor layer 13 is not limited thereto, and the second semiconductor layer 13 may be formed of various materials. In the embodiment of the present disclosure, the second semiconductor layer 13 may include a gallium nitride (GaN) semiconductor material doped with the second conductive dopant (or p-type dopant). The second semiconductor layer 13 may include a lower surface contacting the second surface of the active layer 12 along the length L direction of the light emitting element LD and an upper surface exposed to the outside. Here, the upper surface of the second semiconductor layer 13 may be the other end portion (or upper end portion) of the light emitting element LD.

In some embodiments of the present disclosure, the first semiconductor layer 11 and the second semiconductor layer 13 may have different thicknesses from each other in the length L direction of the light emitting element LD. For example, the first semiconductor layer 11 may have a relatively thicker thickness than that of the second semiconductor layer 13 along the length L direction of the light emitting element LD. Accordingly, the active layer 12 of the light emitting element LD may be disposed to be closer to the upper surface of the second semiconductor layer 13 than the lower surface of the first semiconductor layer 11.

Although not shown directly in the drawing, an ohmic layer may be provided on one side (e.g., an exposed side) of at least one of the first and second semiconductor layers 11 and 13 of the light emitting element LD described above.

While it is illustrated that each of the first semiconductor layer 11 and the second semiconductor layer 13 are formed as one layer, the present disclosure is not limited thereto. In some embodiments of the present disclosure, each of the first semiconductor layer 11 and the second semiconductor layer 13 may further include at least one or more layers, for example, a cladding layer and/or a tensile strain barrier reducing (TSBR) layer according to the material of the active layer 12. The TSBR layer may be a strain reducing layer disposed between semiconductor layers having different lattice structures and serving as a buffer to reduce a difference in lattice constant. The TSBR layer may be formed of a p-type semiconductor layer such as p-GaInP, p-AlInP, or p-AlGaInP, but the present disclosure is not limited thereto.

In some embodiments, the light emitting element LD may further include an additional electrode (hereinafter referred to as a "first additional electrode") disposed on the second semiconductor layer 13 (e.g., the exposed side of the second semiconductor layer 13) in addition to the first semiconductor layer 11, the active layer 12, and the second semiconductor layer 13 described above. In another embodiment, another additional electrode (hereinafter referred to as a "second additional electrode") disposed on one end of the first semiconductor layer 11 (e.g., the exposed side of the first semiconductor layer 11) may be further included.

Each of the first and second additional electrodes may be an ohmic contact electrode, but the present disclosure is not limited thereto. In some embodiments, the first and second additional electrodes may be a Schottky contact electrode. The first and second additional electrodes may include a conductive material (or substance). For example, the first and second additional electrodes may include an opaque metal in which chromium (Cr), titanium (Ti), aluminum (Al), gold (Au), nickel (Ni), and an oxide or alloy thereof are used alone or in combination, but the present disclosure is not limited thereto. In some embodiments, the first and second additional electrodes may include a transparent conductive oxide such as an indium tin oxide (ITO), an indium zinc oxide (IZO), a zinc oxide (ZnO), an indium gallium zinc oxide (IGZO), and an indium tin zinc oxide (ITZO).

Materials included in the first and second additional electrodes may be the same or different from each other. The first and second additional electrodes may be substantially transparent or translucent. Accordingly, light generated by the light emitting element LD may transmit through each of the first and the second additional electrodes to be outputted to the outside of the light emitting element LD. In some embodiments, when the light generated by the light emitting element LD does not transmit through the first and the second additional electrodes and is discharged to the outside through a region except for respective end portions of the light emitting element LD, the first and the second additional electrodes may include an opaque metal.

In the embodiment of the present disclosure, the light emitting element LD may further include an insulating layer 14 (or an insulating film). However, in some embodiments, the insulating film 14 may be omitted, or it may be provided so as to cover only some of the first semiconductor layer 11, the active layer 12, and the second semiconductor layer 13.

The insulating film 14 may prevent an electrical short circuit that may occur when the active layer 12 contacts conductive materials other than the first and second semiconductor layers 11 and 13. Further, the insulating film 14 may reduce or minimize surface defects of the light emitting element LD to improve lifespan and luminous efficiency of the light emitting element LD. Further, when a plurality of light emitting elements LD are closely disposed, the insulating film 14 may prevent unwanted short circuits that may occur between the light emitting elements LD. As long as the active layer 12 may prevent a short circuit with an external conductive material from being caused, whether or not the insulating film 14 is provided is not limited.

The insulating film 14 may be provided in a form that entirely surrounds an outer peripheral surface (e.g., an outer circumferential surface) of a light emitting stacked structure including the first semiconductor layer 11, the active layer 12, and the second semiconductor layer 13.

In the above-described embodiment, the structure in which the insulating film 14 entirely surrounds the outer peripheral surfaces of the first semiconductor layer 11, the active layer 12, and the second semiconductor layer 13 is described, but the present disclosure is not limited thereto. In some embodiments, when the light emitting element LD includes a first additional electrode, the insulating film 14 may entirely surround the outer peripheral surface of each of the first semiconductor layer 11, the active layer 12, the second semiconductor layer 13, and the first additional electrode. According to another embodiment, the insulating film 14 may not entirely surround the outer peripheral surface of the first additional electrode, or may only surround a portion of the outer peripheral surface of the first additional electrode and may not surround the remaining portion of the external peripheral surface of the first additional electrode. In some embodiments, when the first additional electrode is disposed at the other end portion (or an upper end portion) of the light emitting element LD and a second additional electrode is disposed at one end portion (or a lower end portion) of the light emitting element LD, the insulating film 14 may expose at least one region of each of the first and second additional electrodes.

The insulating film 14 may include a transparent insulating material. For example, the insulating film 14 may include one or more insulating material of a silicon oxide (SiOx), a silicon nitride (SiNx), a silicon oxynitride (SiOxNy), an aluminum oxide (AlOx), and a titanium oxide (TiO2), but the present disclosure is not limited thereto, and various materials having insulating properties may be used as the material of the insulating film 14. The insulating film 14 may be provided as a single film, or may be provided as a multifilm including at least a double film.

In some embodiments, the light emitting element LD may be implemented in a light emitting pattern having a core-shell structure. In this case, the above-described first semiconductor layer 11 may be positioned at a core, that is, a middle (or a center or a central region) of the light emitting element LD, and the active layer 12 may surround the outer peripheral surface of the first semiconductor layer 11, and the second semiconductor layer 13 may be provided and/or formed to surround the active layer 12 (e.g., the second semiconductor layer 13 may be provided and/or formed to surround the outer peripheral surface of the active layer 12). Further, the light emitting element LD may include an additional electrode surrounding at least one side of the second semiconductor layer 13. In some embodiments, the light emitting element LD may further include the insulating film 14 provided on the outer peripheral surface of the light emitting pattern having a core-shell structure and including a transparent insulating material. Here, at least an end portion of the insulating film 14 may be removed to enable making an electrical contact with the second semiconductor layer 13 and/or the additional electrode that surrounds at least one side of the second semiconductor layer 13. The light emitting element LD implemented in the light emitting pattern having the core-shell structure may be manufactured by a growth method.

The light emitting element LD described above may be used as a light emitting source of various display devices. The light emitting element LD may be manufactured through a surface treatment process. For example, when the plurality of light emitting elements LD are mixed with a fluid solution (or a solvent) and supplied to each pixel area (for example, an emission area of each pixel or an emission area of each sub pixel), each light emitting element LD may be surface-treated so that the light emitting elements LD may not be non-uniformly aggregated in the solution and may be uniformly sprayed.

A light emitting unit (or light emitting device) including the above-described light emitting element LD may be used in various types of electronic devices that require a light source in addition to the display device. For example, when a plurality of light emitting elements LD are disposed in a pixel area of each pixel of a display panel, the light emitting elements LD may be used as a light source of each pixel. However, an application field of the light emitting element LD is not limited to the above-described example. For example, the light emitting element LD may be used in other types of electronic devices that require a light source, such as a lighting device.

Figure 3:
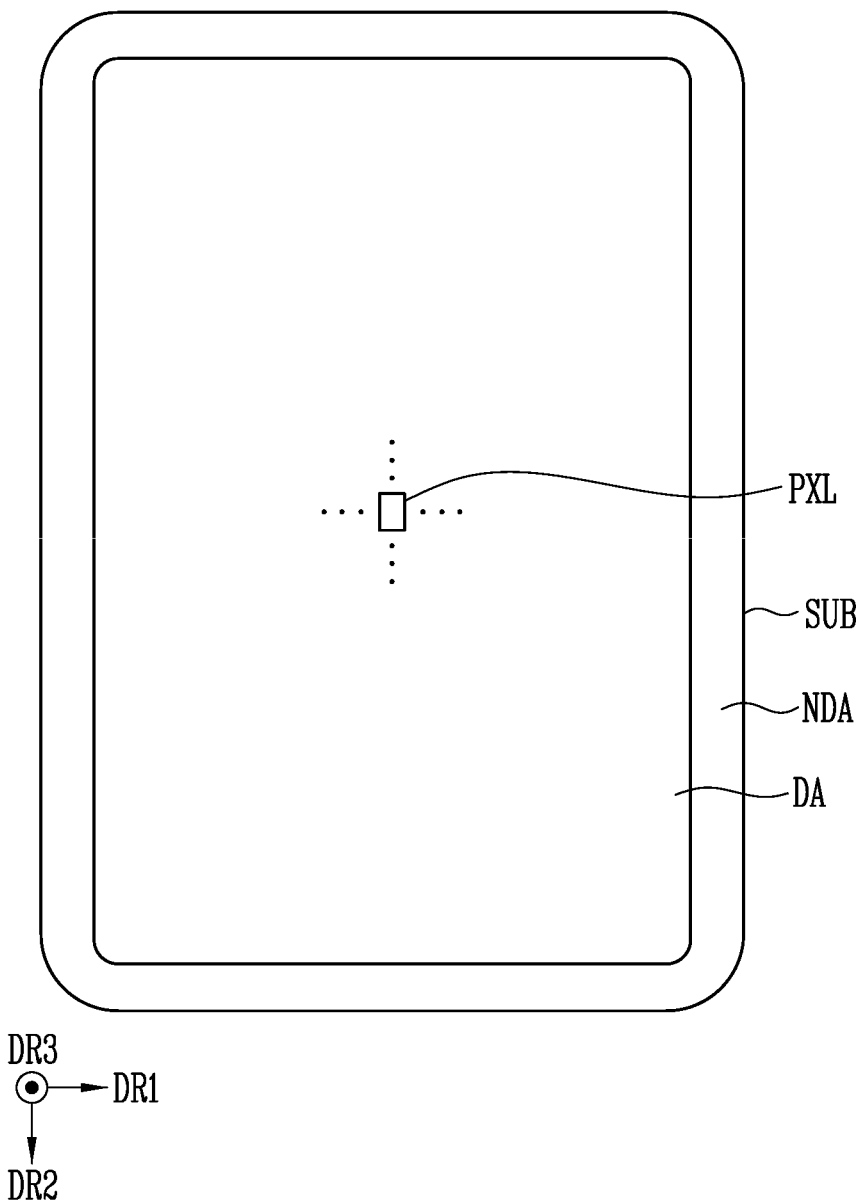
FIG. 3 illustrates a display device according to an embodiment of the present disclosure, for example, a schematic top plan view of a display device using the light emitting elements shown in FIG. 1 and FIG. 2 as a light source.

FIG. 3 illustrates a display device according to an embodiment of the present disclosure, for example, a schematic top plan view of a display device using the light emitting elements LD shown in FIG. 1 and FIG. 2 as a light source.

In FIG. 3, for convenience, a structure of the display device is briefly illustrated based on a display area DA on which an image is displayed.

Referring to FIG. 1-FIG. 3, the display device according to an embodiment of the present disclosure may include a substrate SUB, a plurality of pixels PXL provided on the substrate SUB and respectively including at least one light emitting element LD, a driver provided on the substrate SUB and driving the pixels PXL, and a wire part connecting the pixels PXL and the driver.

When the display device is one in which a display surface is applied to at least one surface thereof such as a smart phone, a television, a tablet PC, a mobile phone, an image phone, an electron book reader, a desktop PC, a laptop PC, a netbook computer, a workstation, a server, a PDA, a portable multimedia player (PMP), an MP3 player, a medical device, a camera, or a wearable device, the present disclosure may be applied thereto.

The display device may be classified into a passive matrix type display device and an active matrix type display device according to a method of driving the light emitting element LD. For example, when the display device is implemented as an active matrix type display device, each of the pixels PXL may include a driving transistor for controlling an amount of current supplied to the light emitting element LD, a switching transistor for transmitting a data signal to the driving transistor, and the like.

The display device may be provided in various shapes, and as an example, may be provided in a rectangular plate shape having two pairs of sides parallel to each other, but the present disclosure is not limited thereto. When the display device is provided in the rectangular plate shape, one of the two pairs of sides may be provided to be longer than the other a pair of sides. For better understanding and ease of description, a case in which the display device has a rectangular shape with a pair of long sides and a pair of short sides is illustrated, and an extending direction of the long side is indicated as the second direction DR2, an extending direction of the short side is indicated as the first direction DR1, and a direction perpendicular to the extending directions of the long and short sides is indicated as the third direction DR3. The display device provided in the rectangular plate shape may have a round shape at a corner where one long side and one short side contact (or meet).

The substrate SUB may include a display area DA and a non-display area NDA surrounding the display area DA along the edge or periphery of the display area DA.

The display area DA may be an area in which the pixels PXL for displaying an image are provided. The non-display area NDA may be an area in which the driver for driving the pixels PXL and a portion of the wire part for connecting the pixels PXL and the driver are provided. For better understanding and ease of description, only one pixel PXL is shown in FIG. 3, but a plurality of pixels PXL may be substantially provided in the display area DA of the substrate SUB.

The non-display area NDA may be provided in at least one side of the display area DA. The non-display area NDA may surround a periphery (or edge) of the display area DA. The non-display area NDA may be provided with a wire part connected to the pixels PXL and a driver for driving the pixels PXL.

The wire part may electrically connect the driver and the pixels PXL. The wire part provides a signal to each pixel PXL, and it may be signal lines connected to each pixel PXL, for example, a fan-out line connected to a scan line, a data line, a light emitting control line, and the like. Further, the wire part is a fan-out line connected to signal lines connected to each pixel PXL, for example, connected to a control line, a sensing line, and the like, in order to compensate for changes in electrical characteristics of each pixel PXL in real time.

The substrate SUB may include a transparent insulating material to transmit light. The substrate SUB may be a rigid substrate or a flexible substrate.

One area on the substrate SUB is provided as the display area DA in which pixels PXL are disposed, and the remaining area on the substrate SUB may be provided as the non-display area NDA. For example, the substrate SUB may include the display area DA including pixel areas in which respective pixels PXL are disposed, and the non-display area NDA disposed around the display area DA (or adjacent to the display area DA).

Each of the pixels PXL may be provided in the display area DA on the substrate SUB. In the embodiment of the present disclosure, the pixels PXL may be arranged in the display area DA in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

Each pixel PXL may include at least one or more light emitting elements LD driven by corresponding scan and data signals. The light emitting element LD has a size as small as nano-scale to micro-scale, and may be mutually connected to adjacent light emitting elements in parallel, but the present disclosure is not limited thereto. In some embodiments, the light emitting element LD may be connected to adjacent light emitting elements in series, or may be connected in a series/parallel combination structure including at least one serial stage connected to adjacent light emitting elements in parallel. The light emitting element LD may form a light source of each pixel PXL.

Each pixel PXL includes at least one light source, for example, the light emitting element LD shown in FIG. 1 driven by signals (e.g., set or predetermined signals) (for example, a scan signal and a data signal) and/or a power source (e.g., a set or predetermined power source) (for example, a first driving power source and a second driving power source). However, in the embodiments of the present disclosure, the type of the light emitting element LD that may be used as the light source of each pixel PXL is not limited thereto.

The driver may provide signals (e.g., set or predetermined signals) and a power source (e.g., a set or predetermined power source) to each pixel PXL through the wire part, thereby controlling driving of the pixel PXL. The driver may include a scan driver, a light emission driver, a data driver, and a timing controller.

Figure 4A:
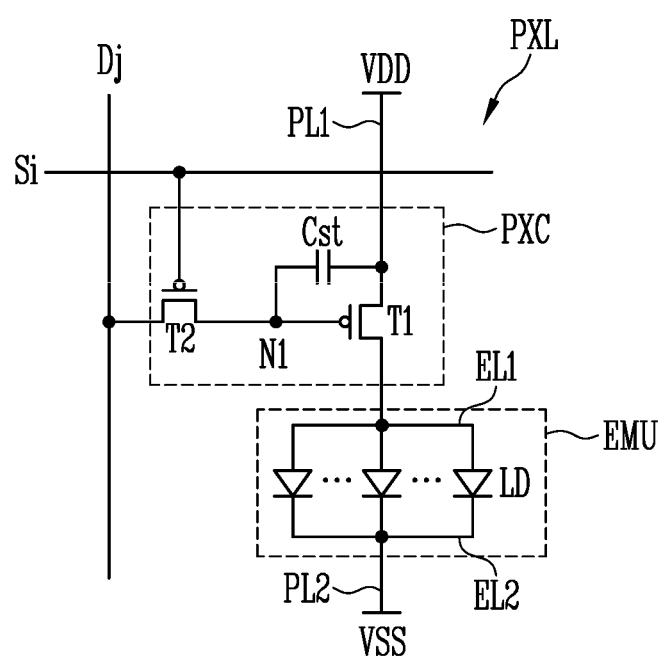
FIG. 4A-FIG. 4C illustrate circuit diagrams of electrical connection relationships of constituent elements included in one pixel illustrated in FIG. 3 according to various embodiments.
Figure 4B:
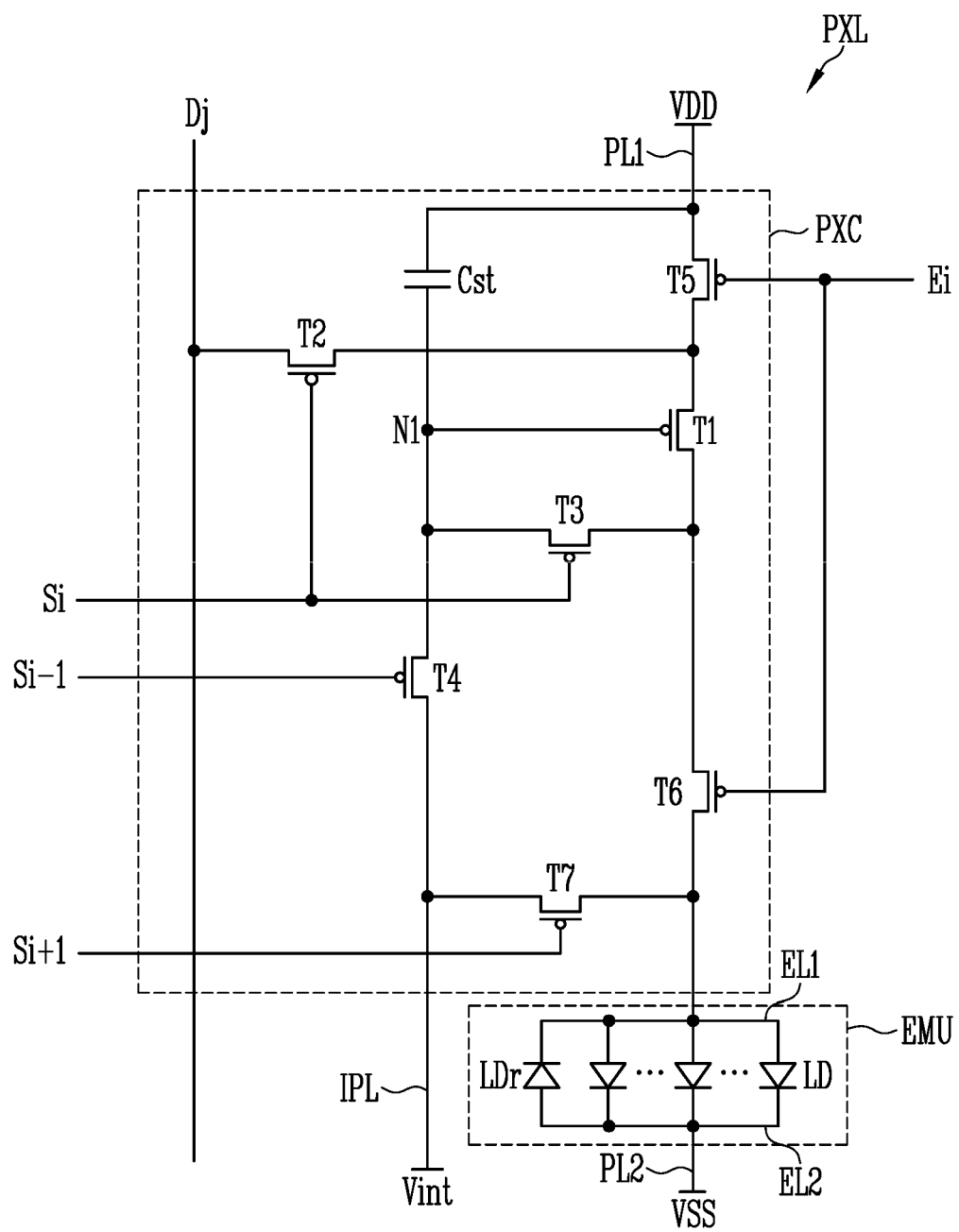
Figure 4C:
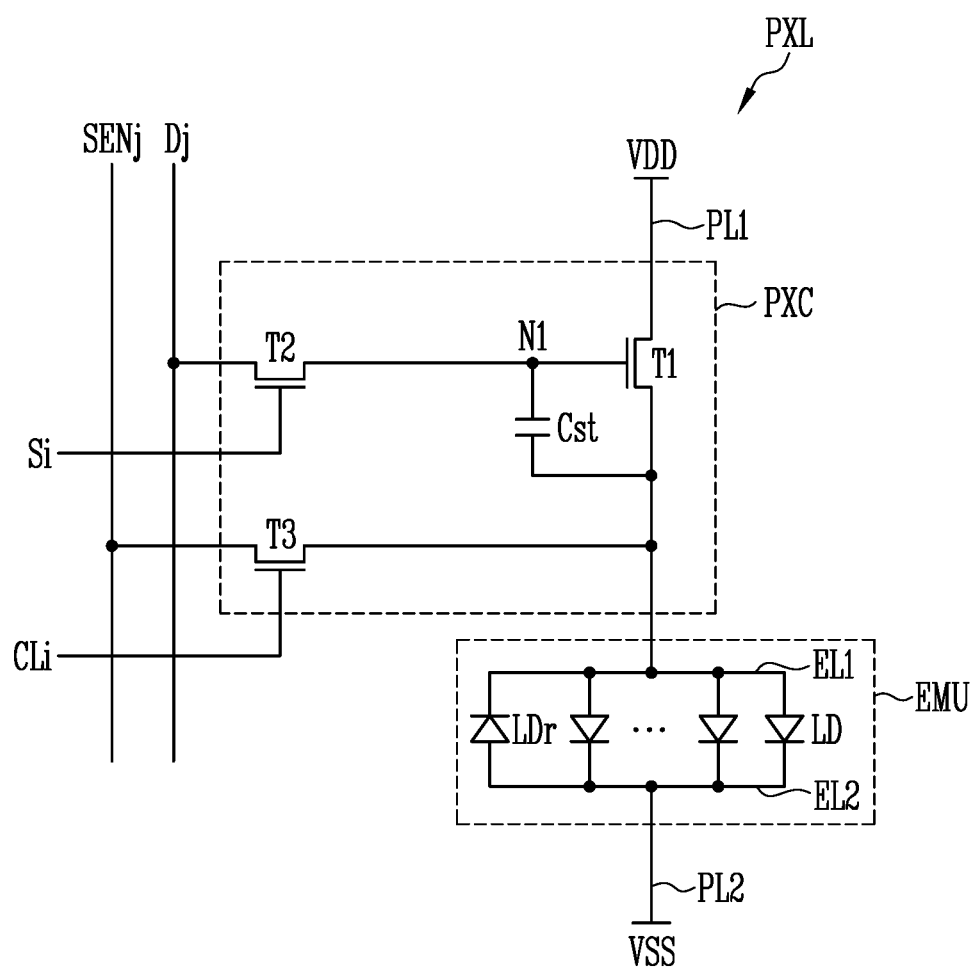

FIG. 4A-FIG. 4C illustrate circuit diagrams of electrical connection relationships of constituent elements included in one pixel PXL illustrated in FIG. 3 according to various embodiments.

For example, FIG. 4A-FIG. 4C illustrate an electrical connection relationship between constituent elements included in a pixel PXL applicable to an active display device according to different embodiments. However, the types of constituent elements included in the pixel PXL to which the embodiment of the present disclosure may be applied are not limited thereto.

In FIG. 4A-FIG. 4C, not only the constituent elements included in each of the pixels PXL illustrated in FIG. 3 but also the area in which the constituent elements are provided are comprehensively referred to as the pixel PXL.

Referring to FIG. 1-FIG. 4C, one pixel PXL (hereinafter referred to as a 'pixel') may include a light emitting unit EMU that generates light with a luminance corresponding to a data signal. Further, the pixel PXL may selectively include a pixel circuit PXC for driving the light emitting unit EMU.

In some embodiments, the light emitting unit EMU may include a plurality of light emitting elements LD connected in parallel between the first power line PL1 to which the voltage of the first driving power source VDD is applied and the second power line PL2 to which the voltage of the second driving power source VSS is applied. For example, the light emitting unit EMU may include a first electrode EL1 (also referred to as a "first alignment electrode") connected to the first power source VDD via the pixel circuit PXC and the first power line PL1, a second electrode EL2 (also referred to as a "second alignment electrode") connected to the second power source VSS through the second power line PL2, and a plurality of light emitting elements LD connected in parallel in the same direction between the first and second electrodes EL1 and EL2. In the described embodiment of the present disclosure, the first electrode EL1 may be an anode electrode, and the second electrode EL2 may be a cathode electrode.

Each of the light emitting elements LD included in the light emitting unit EMU may include one end portion connected to the first driving power source VDD through the first electrode EL1 and the other end portion connected to the second driving power source VSS through the second electrode EL2. The first driving power source VDD and the second driving power source VSS may have different potentials. For example, the first driving power source VDD may be set as a high potential power source, and the second driving power source VSS may be set as a low potential power source. In this case, a potential difference between the first and second driving power sources VDD and VSS may be set to be equal to or higher than a threshold voltage of the light emitting elements LD during a light emitting period of the pixel PXL.

As described above, respective light emitting elements LD connected in parallel in the same direction (for example, a forward direction) between the first electrode EL1 and the second electrode EL2 respectively supplied with voltages of different potentials may form respective effective light source. These effective light sources may be collected to form the light emitting unit EMU of the pixel PXL.

The light emitting elements LD of the light emitting unit EMU may emit light with luminance corresponding to a driving current supplied through the corresponding pixel circuit PXC. For example, during each frame period, the pixel circuit PXC may supply a driving current corresponding to a gray value of corresponding frame data to the light emitting unit EMU. The driving current supplied to the light emitting unit EMU may be divided to flow in each of the light emitting elements LD. Therefore, while each light emitting element LD emits light with a luminance corresponding to the current flowing therein, the light emitting unit EMU may emit light having a luminance corresponding to the driving current.

While the embodiment in which respective end portions of the light emitting elements LD are connected in the same direction between the first and second driving power sources VDD and VSS is illustrated in FIG. 4A-FIG. 4C, the present disclosure is not limited thereto. In some embodiments, as shown in FIG. 4B and FIG. 4C, the light emitting unit EMU may further include at least one ineffective light source, for example, a reverse light emitting element LDr, in addition to the light emitting elements LD forming respective effective light sources. The reverse light emitting element LDr may be connected in parallel between the first and second electrodes EL1 and EL2 (see, for example, FIG. 4B) together with the light emitting devices LD forming the effective light sources, but may be connected between the first and second electrodes EL1 and EL2 in the opposite direction with respect to the light emitting elements LD. The reverse light emitting element LDr maintains an inactive state even when a driving voltage (e.g., a set or predetermined driving voltage) (for example, a driving voltage in the forward direction) is applied between the first and second electrodes EL1 and EL2, thus a current does not substantially flow in the reverse light emitting element.

The pixel circuit PXC may be connected to a scan line Si and a data line Dj of the pixel PXL. For example, when the pixel PXL is disposed in an i-th (i is a natural number) row and a j-th (j is a natural number) column of the display area DA, the pixel circuit PXC of the pixel PXL may be connected to an i-th scan line Si and a j-th data line Dj of the display area DA. In some embodiments, the pixel circuit PXC may include first and second transistors T1 and T2 and a storage capacitor Cst. However, the structure of the pixel circuit PXC is not limited to the embodiments illustrated in FIG. 4A-FIG. 4C.

First, referring to FIG. 4A, the pixel circuit PXC may include the first and second transistors T1 and T2, and the storage capacitor Cst.

A first terminal of the second transistor T2 (e.g., a switching transistor) may be connected to the j-th data line Dj, and a second terminal thereof may be connected to a first node N1. Here, the first terminal and the second terminal of the second transistor T2 are different terminals, and for example, when the first terminal is a source electrode, the second terminal may be a drain electrode. Further, a gate electrode of the second transistor T2 may be connected to the i-th scan line Si.

The second transistor T2 is turned on when a scan signal of a voltage (for example, a low voltage) capable of turning on the second transistor T2 is supplied from the i-th scan line Si to electrically connect the j-th data line Dj and the first node N1. In this case, a data signal of a corresponding frame is supplied to the j-th data line Dj, and accordingly, the data signal is transmitted to the first node N1. The data signal transmitted to the first node N1 is charged in the storage capacitor Cst (e.g., the storage capacitor Cst may hold a charge corresponding to the data signal transmitted to the first node N1).

A first terminal of the first transistor T1 (e.g., a driving transistor) may be connected to the first driving power source VDD, and a second terminal thereof may be electrically connected to the first electrode EL1 of each of the light emitting elements LD. A gate electrode of the first transistor T1 may be connected to the first node N1. The first transistor T1 may control an amount of driving current supplied to the light emitting elements LD in response to a voltage at the first node N1.

One electrode of the storage capacitor Cst may be connected to the first driving power source VDD, and the other electrode may be connected to the first node N1. The storage capacitor Cst charges a voltage (or holds a charge) corresponding to the data signal supplied to the first node N1, and maintains the charged voltage until a data signal of a next frame is supplied.

FIG. 4A illustrates the pixel circuit PXC including the second transistor T2 for transferring a data signal into the pixel PXL, the storage capacitor Cst for storing the data signal, and the first transistor T1 for supplying a driving current corresponding to the data signal to the light emitting elements LD.

However, the present disclosure is not limited thereto, and the structure of the pixel circuit PXC may be variously changed. For example, the pixel circuit PXC may additionally include other circuit elements such as at least one transistor element such as a transistor element for compensating a threshold voltage of the first transistor T1, a transistor element for initializing the first node N1, and/or a transistor element for controlling a light emission time of the light emitting elements LD, or a boosting capacitor for boosting the voltage of the first node N1.

Further, FIG. 4A illustrates the transistors included in the pixel circuit PXC, for example, the first and second transistors T1 and T2, as P2-type transistors, but the present disclosure is not limited thereto. That is, at least one of the first and second transistors T1 and T2 included in the pixel circuit PXC may be changed to an N-type transistor.

The pixel circuit PXC may be further connected to at least one other scan line according to some embodiments. For example, when the pixel PXL is disposed on an i-th row of the display area DA, the pixel circuit PXC of the corresponding pixel PXL may be connected to an (i−1)-th scan line Si−1 (e.g., a previous scan line) and/or an (i+1)-th scan line Si+1 (e.g., a next scan line) as shown in FIG. 4B. In some embodiments, the pixel circuit PXC may be further connected to a third power source in addition to the first and second driving power sources VDD and VSS. For example, the pixel circuit PXC may also be connected to an initialization power source Vint. In this case, the pixel circuit PXC may include first to seventh transistors T1 to T7 and a storage capacitor Cst.

A first terminal of the first transistor T1 (e.g., a driving transistor), for example, a source electrode thereof may be connected to the first driving power VDD via the fifth transistor T5, and a second terminal, for example, a drain electrode thereof may be electrically connected to one end portion of the light emitting elements LD via the sixth transistor T6. Further, a gate electrode of the first transistor T1 may be connected to the first node N1. The first transistor T1 controls a driving current flowing between the first driving power source VDD and the second driving power source VSS through the light emitting elements LD in response to a voltage of the first node N1.

The second transistor T2 (e.g., a switching transistor) may be connected between the j-th data line Dj connected to the pixel PXL and the first terminal of the first transistor T1. Further, a gate electrode of the second transistor T2 may be connected to the i-th scan line Si connected to the pixel PXL. When a scan signal of a gate-on voltage (for example, a low voltage) is supplied from the i-th scan line Si, the second transistor T2 may be turned on to electrically connect the j-th data line Dj to the first terminal of the first transistor T1. Accordingly, when the second transistor T2 is turned on, a data signal supplied from the j-th data line Dj may be transmitted to the first transistor T1.

The third transistor T3 may be connected between the second terminal of the first transistor T1 and the first node N1. Further, a gate electrode of the third transistor T3 may be connected to the i-th scan line Si. When the scan signal of the gate-on voltage (e.g., a low voltage) is supplied from the i-th scan line Si, the third transistor T3 may be turned on to electrically connect the second terminal of the first transistor T1 to the first node N1.

The fourth transistor T4 may be connected between the first node N1 and an initialization power line IPL to which the initialization power Vint is applied. A gate electrode of the fourth transistor T4 may be connected to a previous scan line, for example, the (i−1)-th scan line Si−1. When the scan signal of the gate-on voltage (e.g., a low voltage) is supplied to the (i−1)-th scan line Si−1, the fourth transistor T4 may be turned on to transmit a voltage of the initialization power source Vint to the first node N1. Here, the initialization power source Vint may have a voltage less than or equal to a lowest voltage of the data signal.

The fifth transistor T5 may be connected between the first driving power source VDD and the first terminal of the first transistor T1. Further, a gate electrode of the fifth transistor T5 may be connected to the corresponding emission control line, for example, an i-th emission control line Ei. When an emission control signal of a gate-off voltage (e.g., a high voltage) is supplied to the i-th emission control line Ei, the fifth transistor T5 may be turned off. However, when an emission control signal of a gate-on voltage (e.g., a low voltage) is supplied to the i-th emission control line Ei, the fifth transistor T5 may be turned on.

The sixth transistor T6 may be connected between the second terminal of the first transistor T1 and one end portion of the light emitting elements LD (or the first electrode EL1). Further, a gate electrode of the sixth transistor T6 may be connected to the i-th emission control line Ei. When the emission control signal of the gate-off voltage (e.g., a high voltage) is supplied to the i-th emission control line Ei, the sixth transistor T6 may be turned off. Further, when an emission control signal of a gate-on voltage (e.g., a low voltage) is supplied to the i-th emission control line Ei, the sixth transistor T6 may be turned on.

The seventh transistor T7 may be connected between one end portion of the light emitting elements LD (or the first electrode EL1) and the initialization power line IPL. Further, a gate electrode of the seventh transistor T7 may be connected to one of the scan lines in a next row, for example, to the (i+1)-th scan line Si+1. When the scan signal of the gate-on voltage (e.g., a low voltage) is supplied to the (i+1)-th scan line Si+1, the seventh transistor T7 may be turned on to supply a voltage of the initialization power source Vint to one end portion of the light emitting elements LD (i.e., the first electrode EL1).

The storage capacitor Cst may be connected between the first driving power source VDD and the first node N1. The storage capacitor Cst may store a charge corresponding to the data signal supplied to the first node N1 in each frame period and a voltage corresponding to the threshold voltage of the first transistor T1.

FIG. 4B illustrates the transistors included in the pixel circuit PXC, for example, the first to seventh transistors T1 to T7 as P-type transistors, but the present disclosure is not limited thereto. For example, at least one of the first to seventh transistors T1 to T7 may be changed to an N-type transistor.

In the described embodiment of the present disclosure, the configuration of the pixel circuit PXC is not limited to the embodiments shown in FIG. 4A and FIG. 4B. For example, the pixel circuit PXC may be configured as in the embodiment shown in FIG. 4C.

The pixel circuit PXC may be further connected to a control line CLi and a sensing line SENj, as shown in FIG. 4C. For example, the pixel circuit PXC may be connected to an i-th control line CLi and a j-th sensing line SENj of the display area DA. The above-described pixel circuit PXC may further include a third transistor T3 in addition to the first and second transistors T1 and T2 shown in FIG. 4A.

The third transistor T3 is connected between the first transistor T1 and the j-th sensing line SENj. For example, one electrode of the third transistor T3 may be connected to the first terminal (for example, a source electrode) of the first transistor T1 connected to the first electrode EL1, and the other electrode of the third transistor T3 may be connected to the j-th sensing line SENj.

According to the described embodiment, a gate electrode of the third transistor T3 is connected to the i-th control line CLi. When the i-th control line CLi is omitted, the gate electrode of the third transistor T3 may be connected to the i-th scan line Si. The third transistor T3 is turned on by a control signal of a gate-on voltage (for example, a high level) supplied to the i-th control line CLi during a sensing period (e.g., a set or predetermined sensing period) to electrically connect the j-th sensing line SENj to the first transistor T1.

In some embodiments, the sensing period may be a period for extracting characteristic information (for example, a threshold of signal of the first transistor T1) of each of the pixels PXL disposed in the display area DA. During the above-mentioned sensing period, the first transistor T1 may be turned on by supplying a reference voltage (e.g., a set or predetermined reference voltage), at which the first transistor T1 may be turned on, to the first node N1 through the j-th data line Dj and the second transistor T2 and by connecting each pixel PXL to a current source or the like. In addition, by supplying the control signal of a gate-on voltage (e.g., a high voltage) to the third transistor T3 to turn on the third transistor T3, the first transistor T1 may be connected to the j-th sensing line SENj. Accordingly, the characteristic information of each pixel PXL including the threshold voltage of the first transistor T1 can be extracted through the above-described j-th sensing line SENj. The detected characteristic information may be used to convert image data so that a characteristic deviation between the pixels PXL may be compensated.

While FIG. 4C discloses an embodiment in which all of the first to third transistors T1 to T3 are N-type transistors, the present disclosure is not limited thereto. For example, at least one of the first to third transistors T1 and T3 described above may be changed to a P-type transistor. Further, although FIG. 4C discloses an embodiment in which the light emitting unit EMU is connected between the pixel circuit PXC and the second driving power source VSS, the light emitting unit EMU may also be connected between the first driving power source VDD and the pixel circuit PXC.

Further, FIG. 4A-FIG. 4C illustrate the embodiments in which the light emitting elements LD forming each light emitting unit EMU are all connected in parallel, but the present disclosure is not limited thereto. In some embodiments, the light emitting unit EMU may be configured to include at least one series stage including a plurality of light emitting elements LD connected in parallel to each other. That is, the light emitting unit EMU may be configured to have a series/parallel mixed structure.

The structure of the pixel PXL that may be applied to the present disclosure is not limited to the embodiment illustrated in FIG. 4A-FIG. 4C, and the corresponding pixel PXL may have various structures. For example, each pixel PXL may be configured inside a passive light emitting display device or the like. In this case, the pixel circuit PXC may be omitted, and respective end portions of the light emitting elements LD included in the light emitting unit EMU may be directly connected to the i-th scan line Si, the j-th data line Dj, the first power line PL1 to which the first driving power source VDD is applied, the second power line PL2 to which the second driving power source VSS is applied, and/or a control line CLi (e.g., a set or predetermined control line).

Figure 5A:
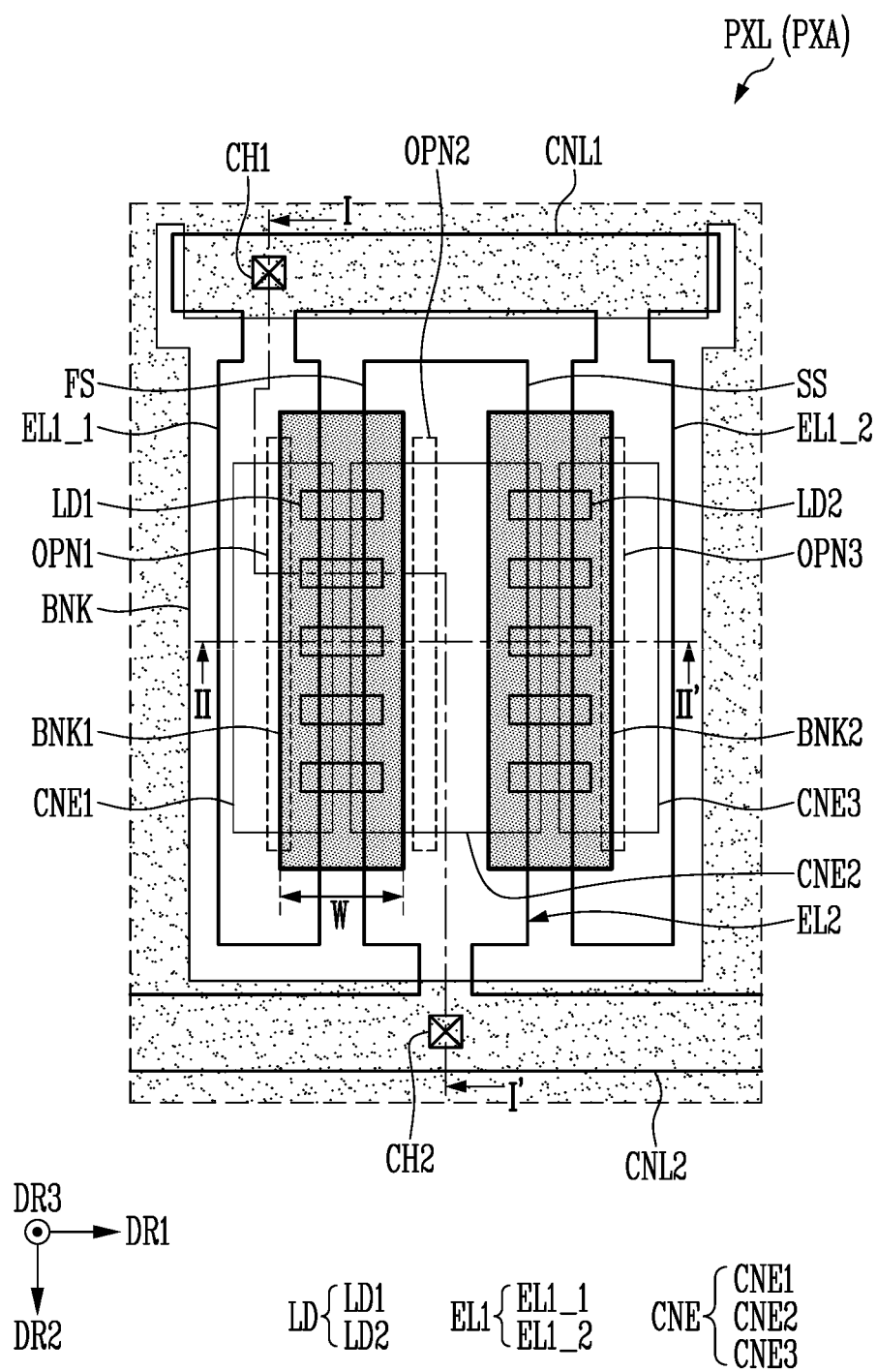
FIG. 5A illustrates a schematic top plan view of one of the pixels shown in FIG. 3.
Figure 5B:
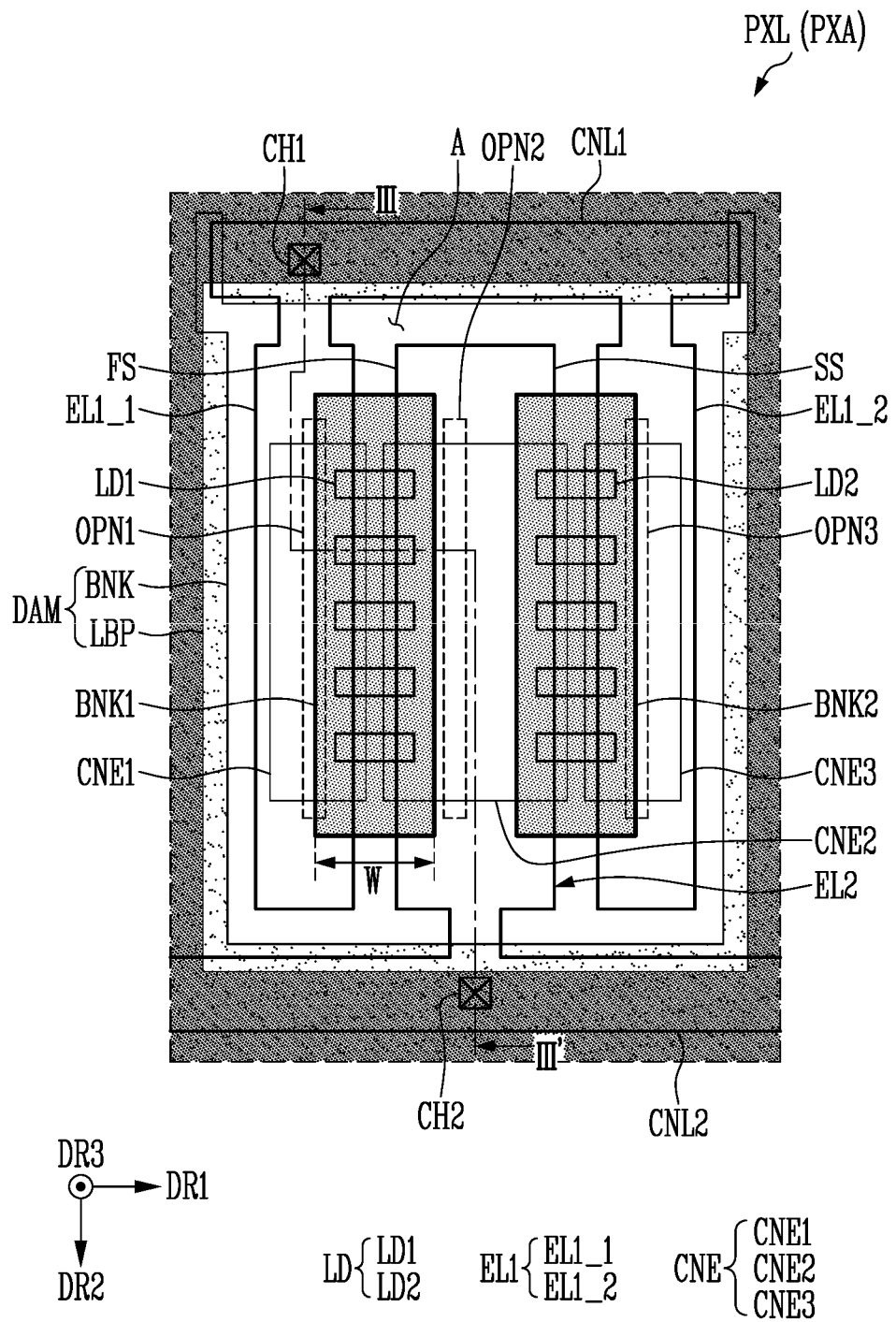
FIG. 5B illustrates a schematic top plan view of an example of applying a light blocking pattern to the pixel of FIG. 5A.
Figure 6:
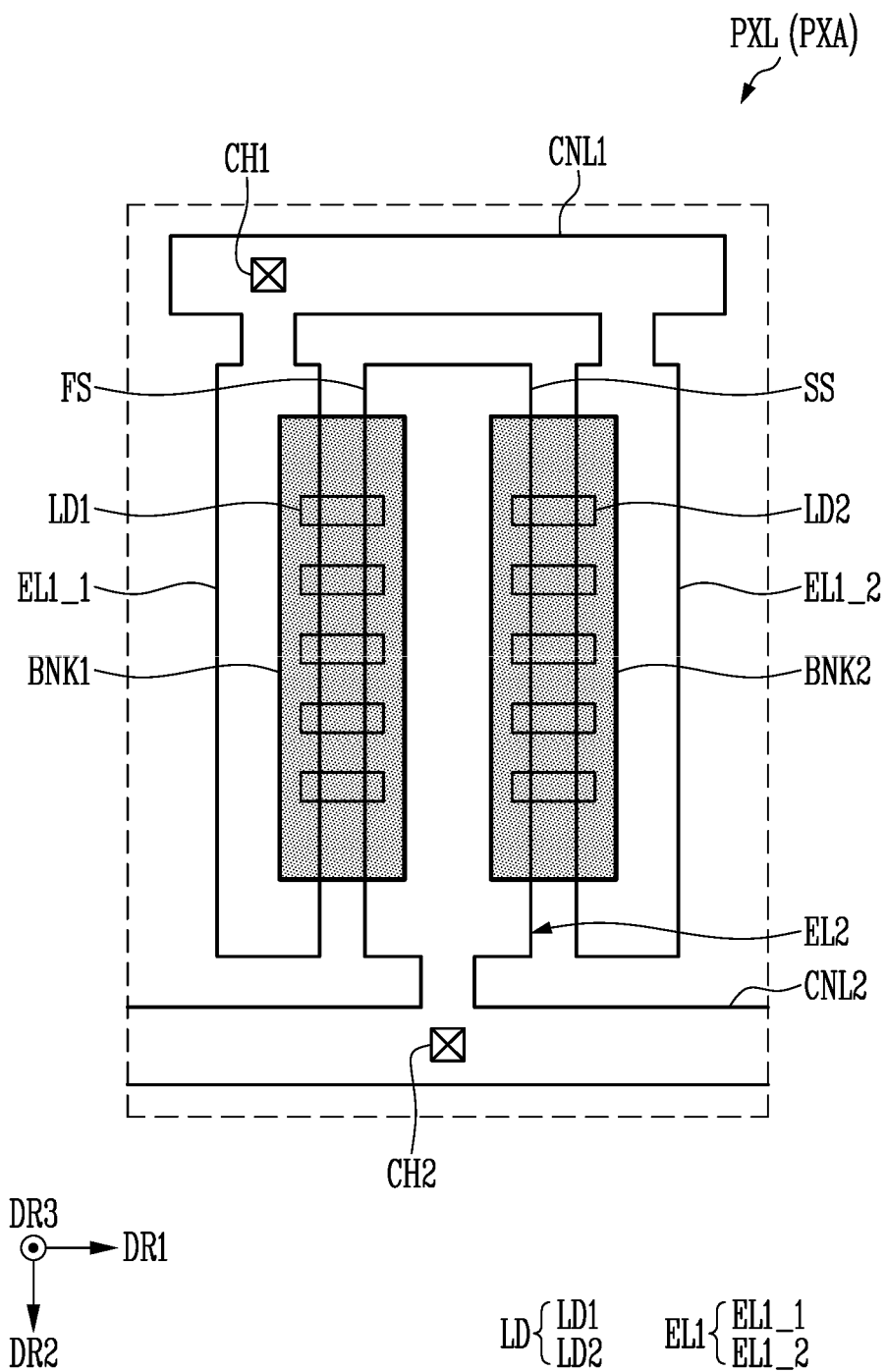
FIG. 6 illustrates a top plan view of only first and second bank patterns, first and second electrodes, and light emitting elements in the pixel of FIG. 5A.
Figure 7:
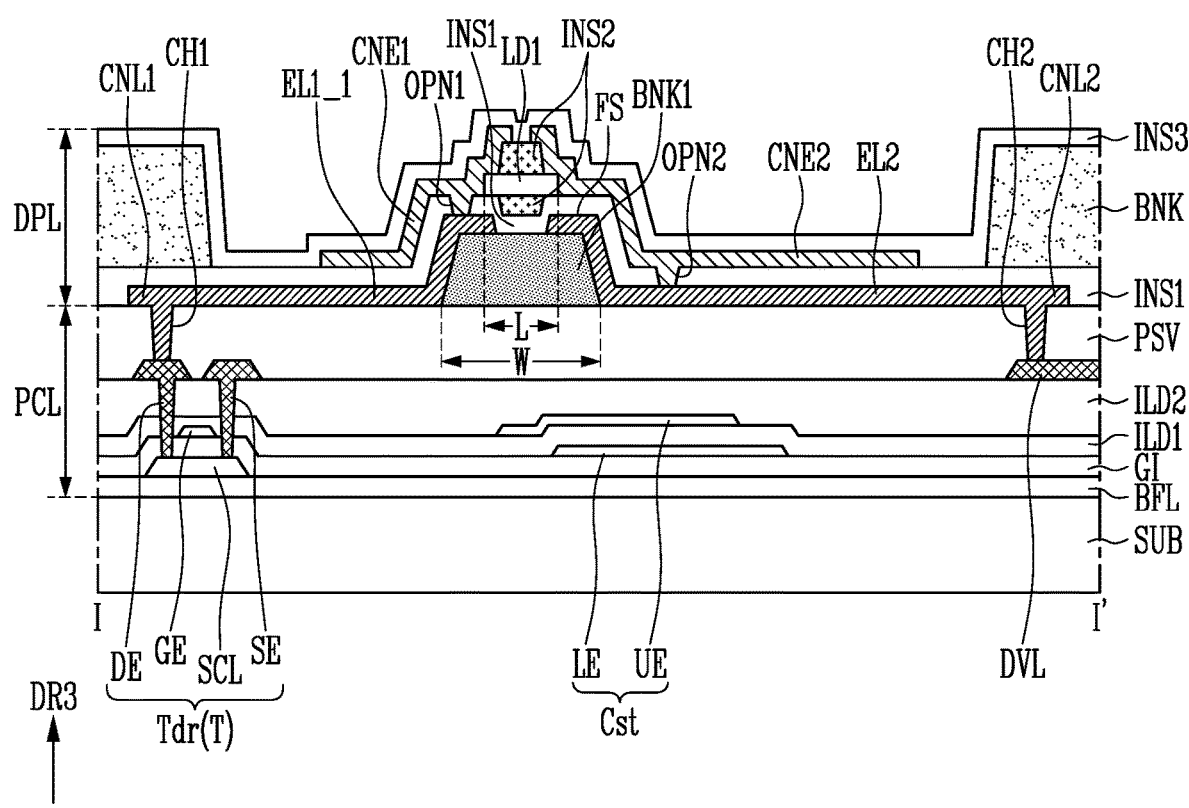
FIG. 7 illustrates a cross-sectional view taken along the line I-I' of FIG. 5A.
Figure 8:
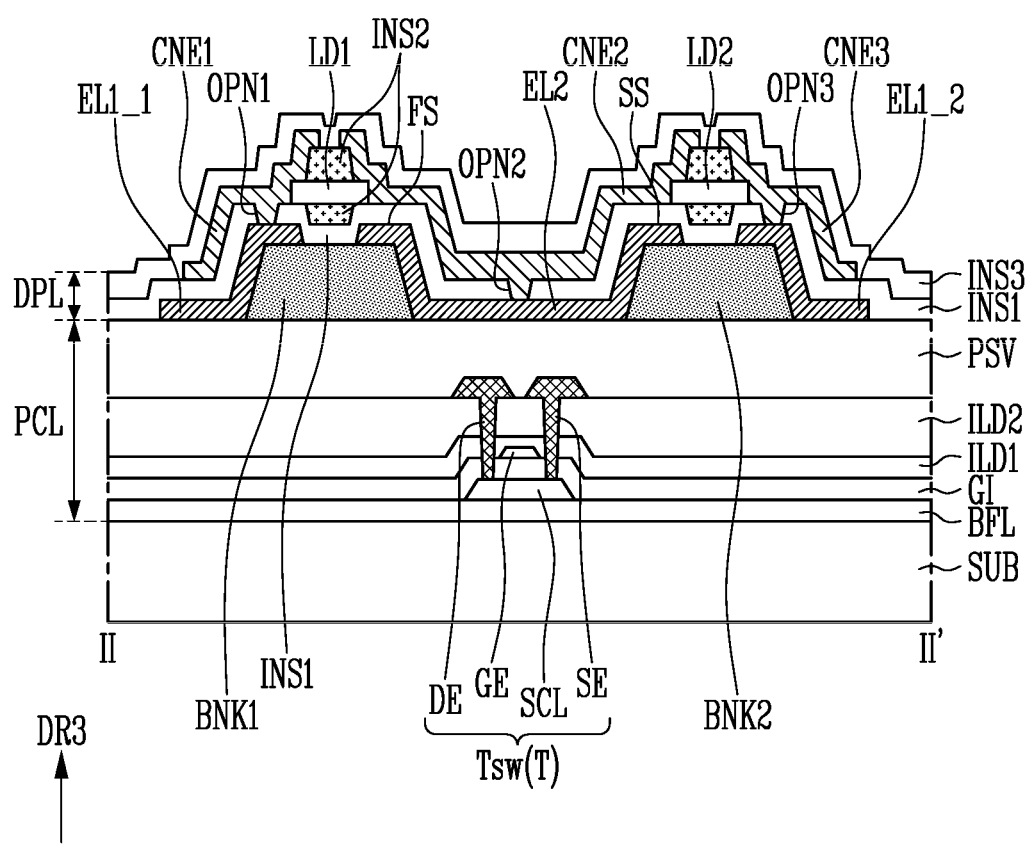
FIG. 8 illustrates a cross-sectional view taken along the line II-II' of FIG. 5A.
Figure 9:
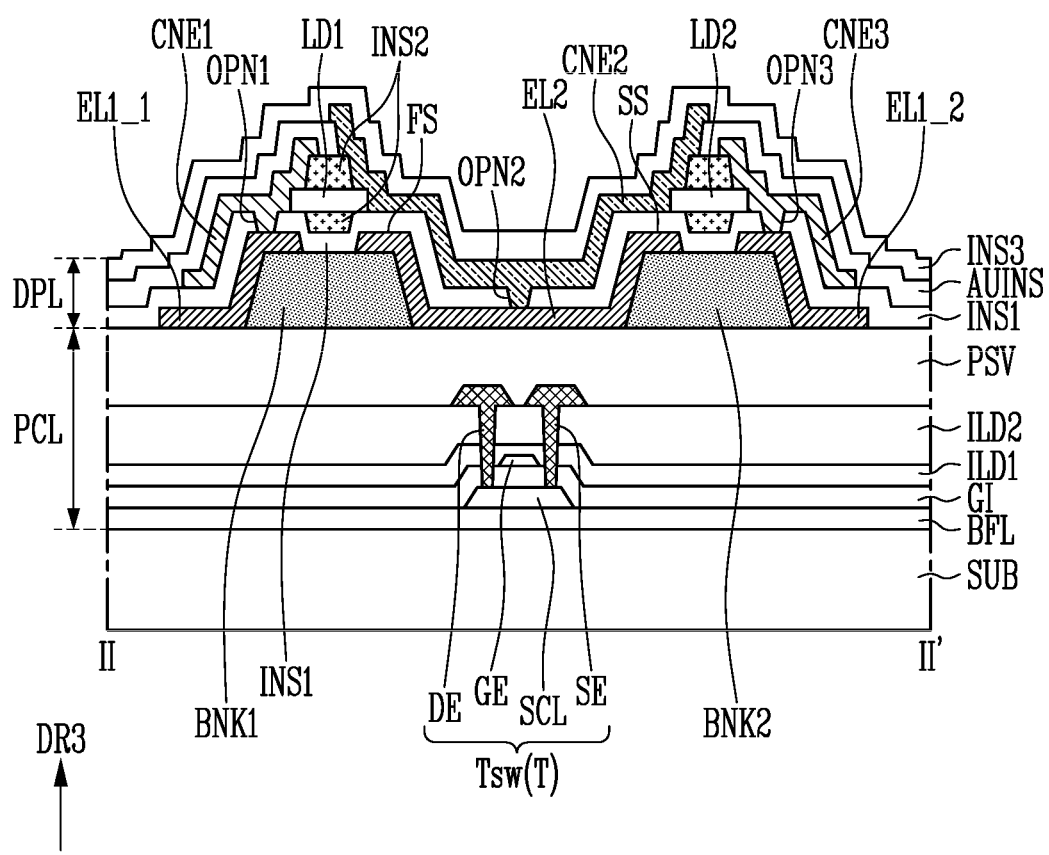
FIG. 9 illustrates a cross-sectional view of another embodiment for implementing the first to third contact electrodes of FIG. 8, and illustrates a cross-sectional view corresponding to the line II-II' of FIG. 5A.
Figure 10:
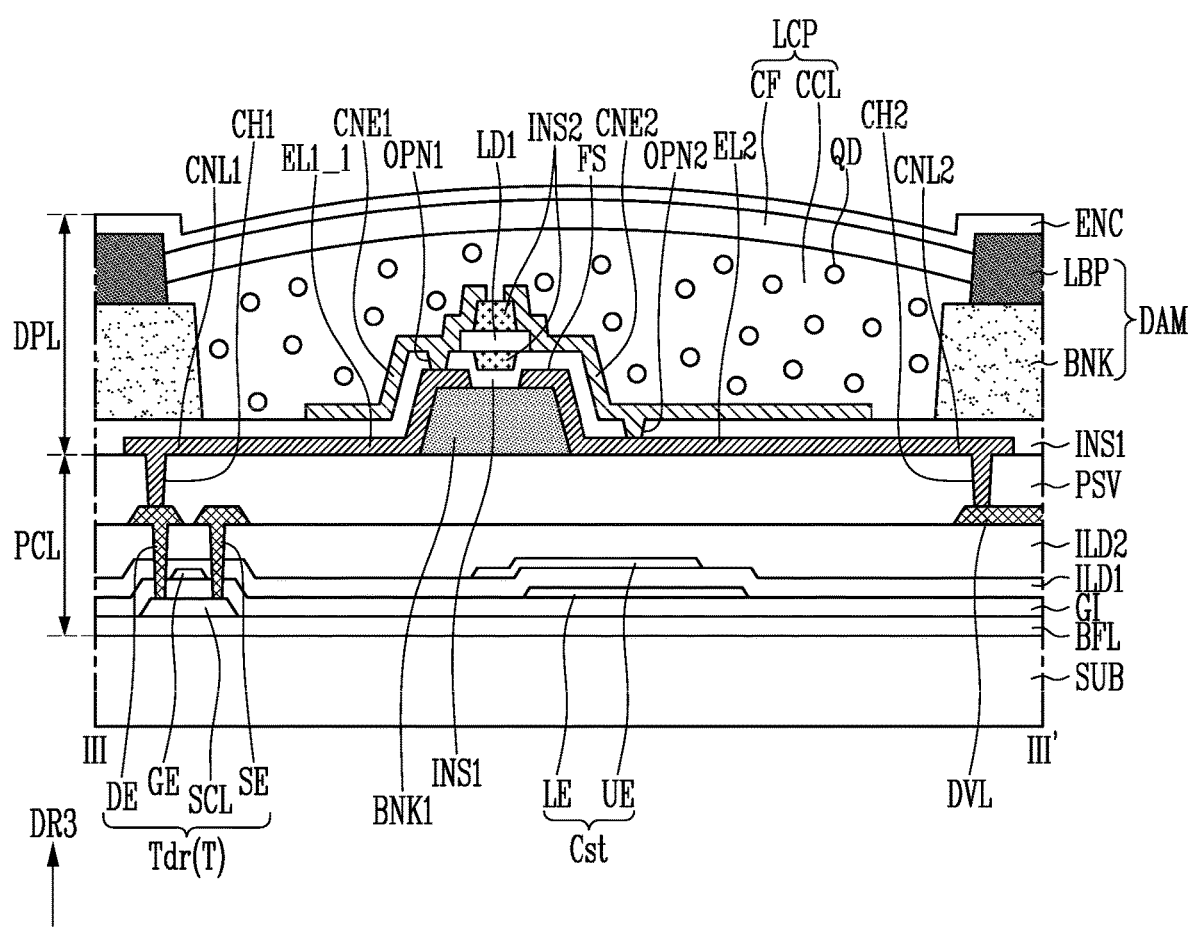
FIG. 10 illustrates a cross-sectional view taken along the line III-III' of FIG. 5B.
Figure 11A:
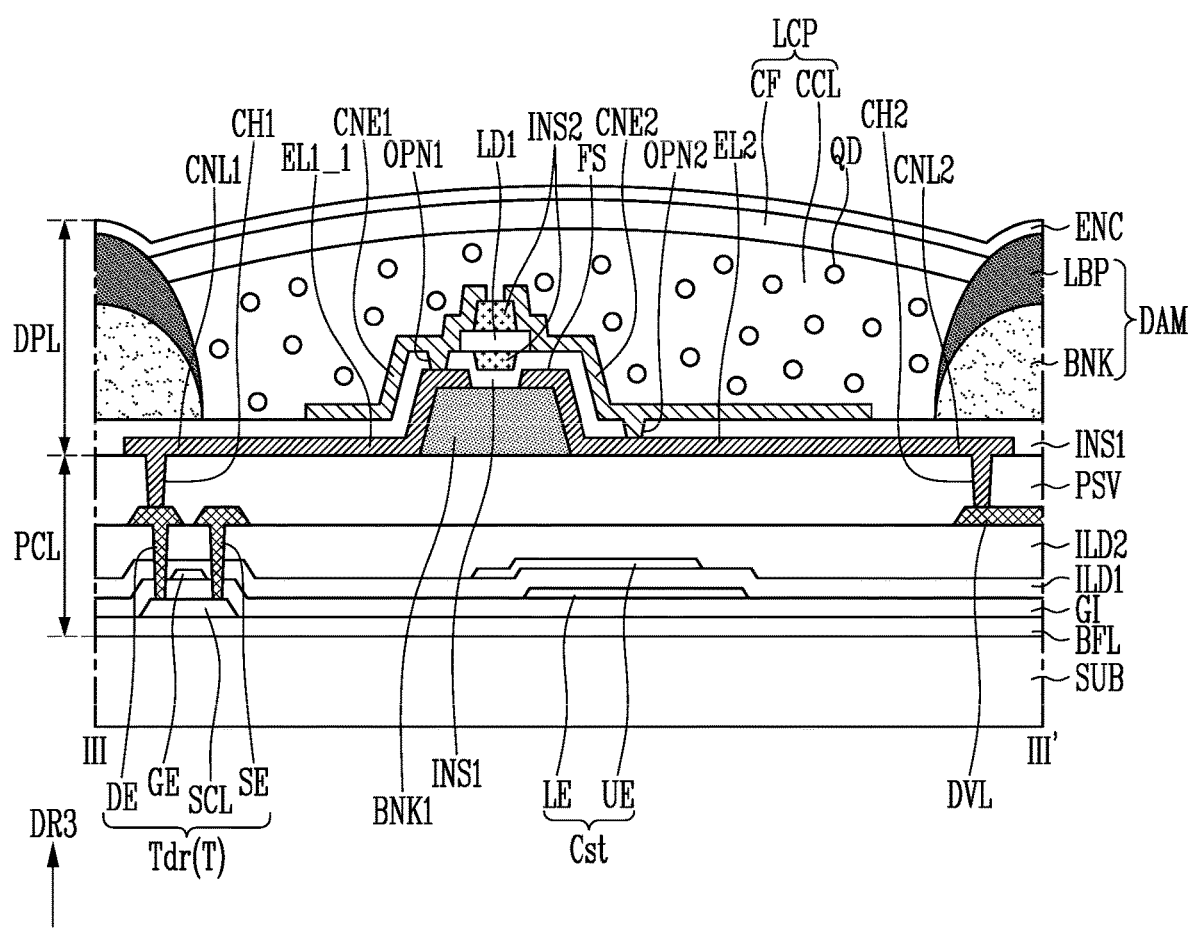
FIG. 11A and FIG. 11B illustrate cross-sectional views of another embodiment for implementing the bank and the light blocking pattern of FIG. 10, and illustrate cross-sectional views corresponding to the line III-III' of FIG. 5B.
Figure 11B:
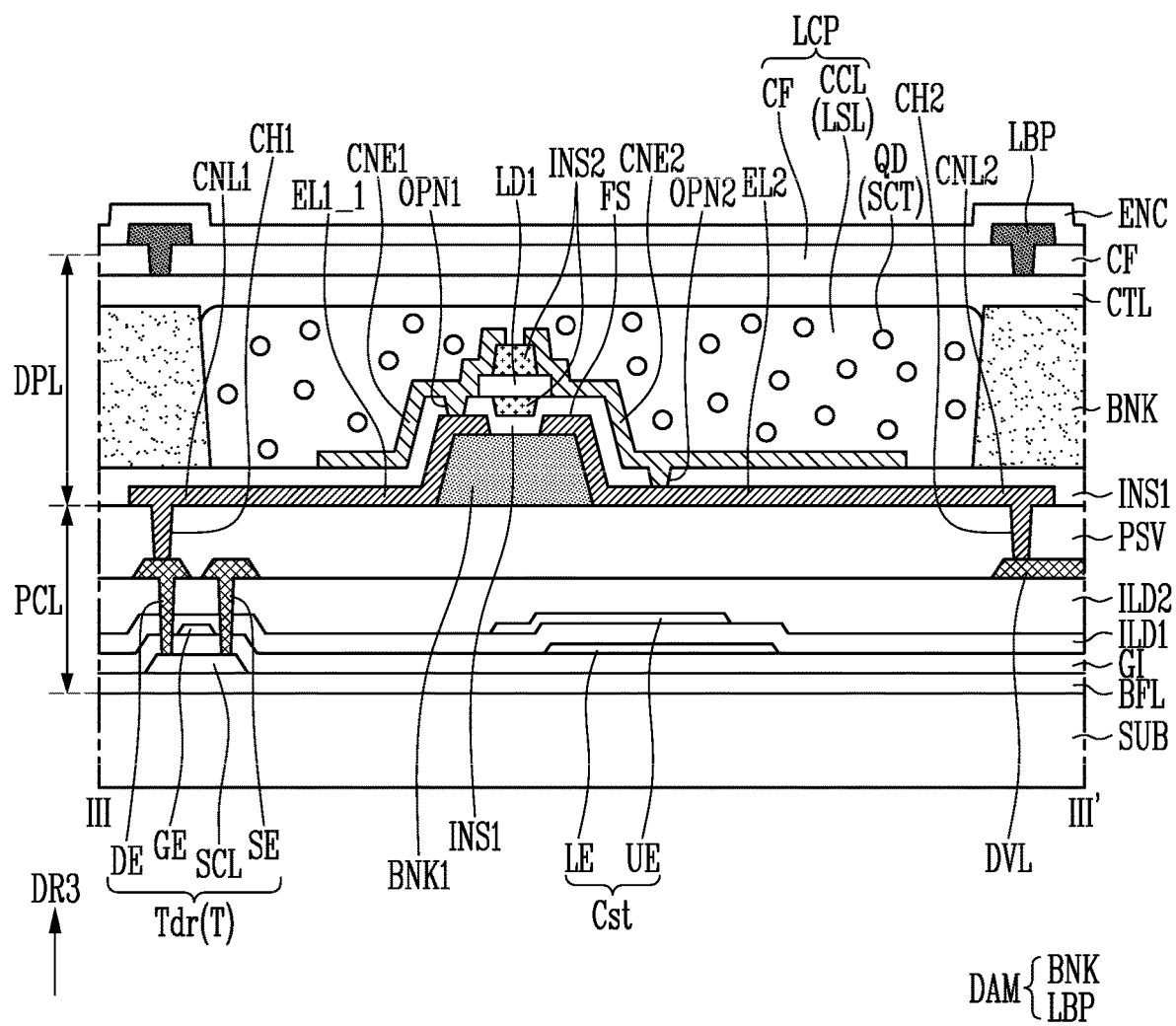
Figure 12A:
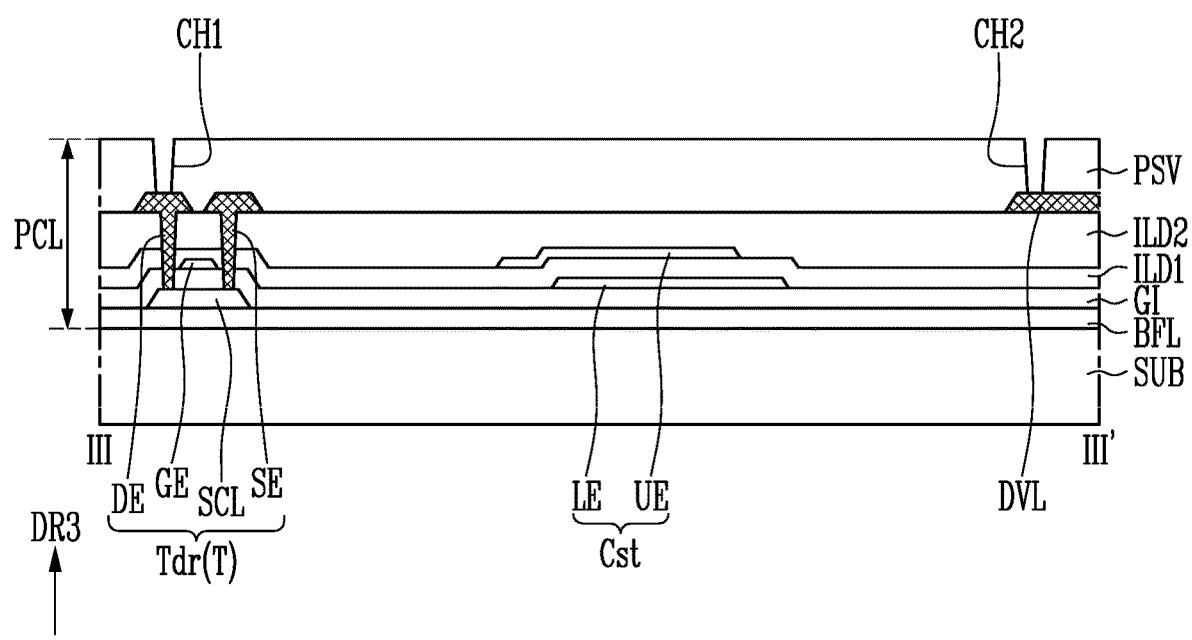
FIG. 12A-FIG. 12K illustrate sequential schematic cross-sectional views of a manufacturing method of the pixel of FIG. 10.
Figure 12B:
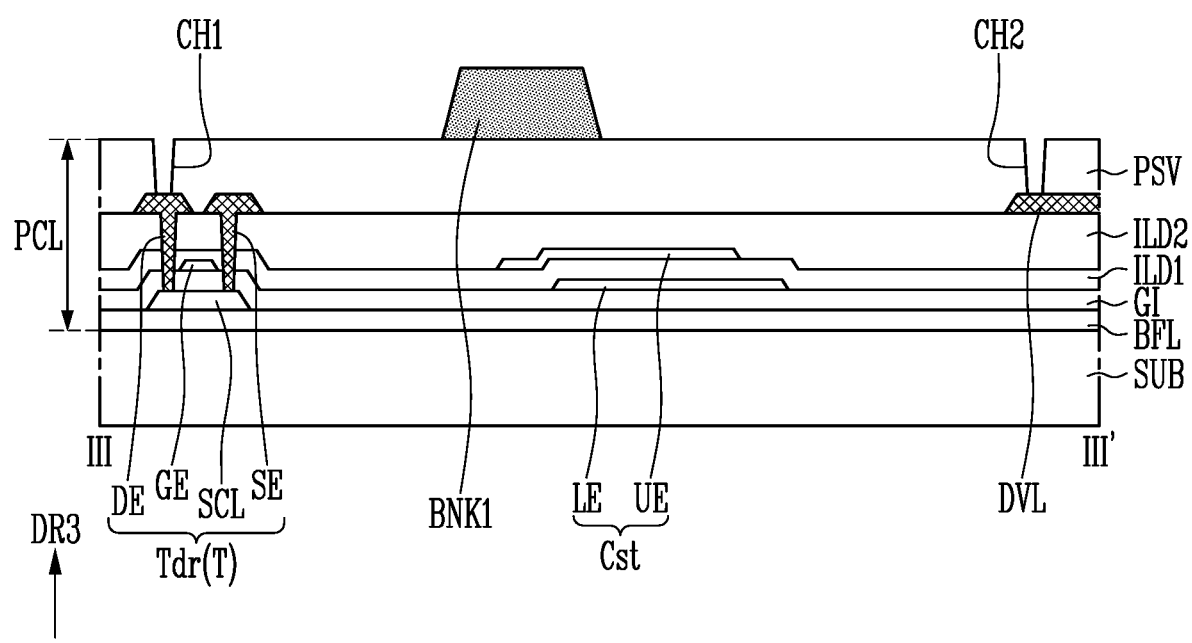
Figure 12C:
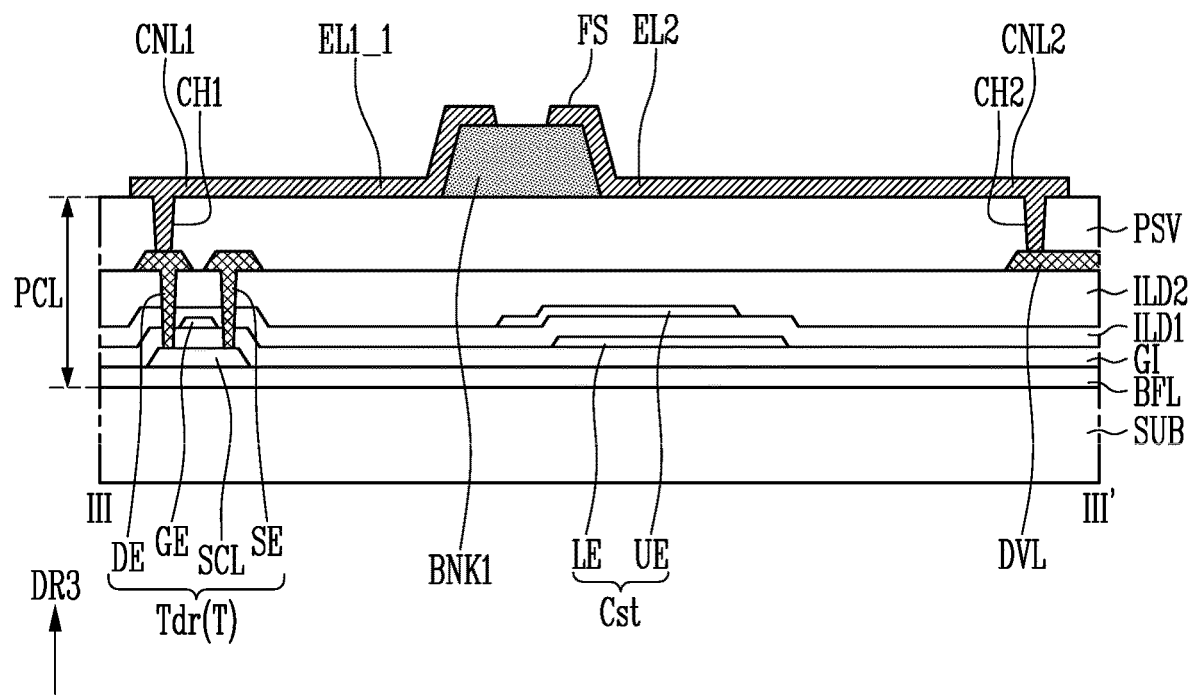
Figure 12D:
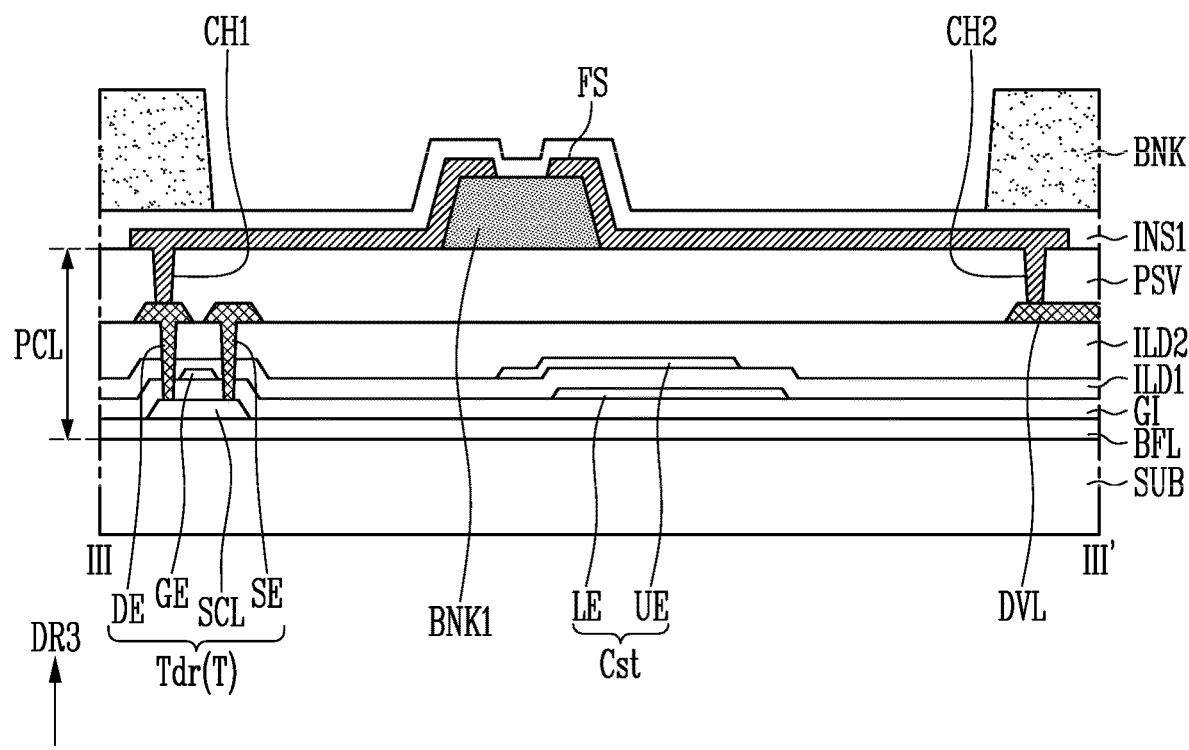
Figure 12E:
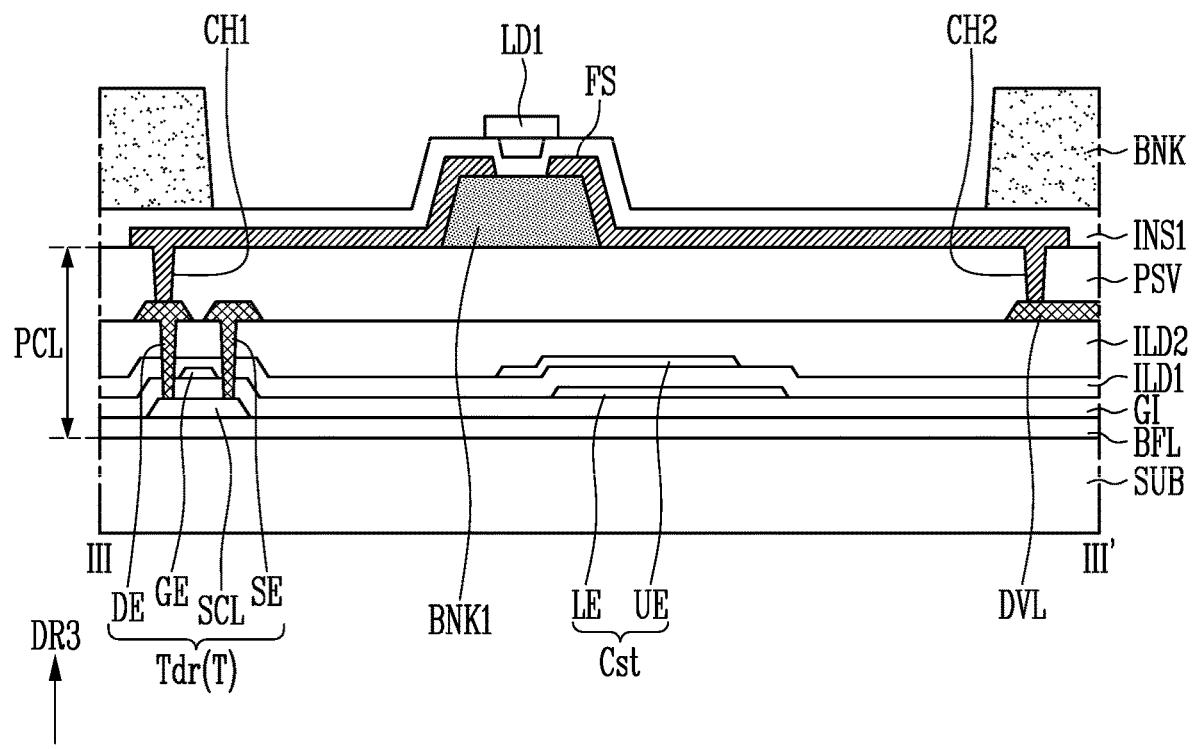
Figure 12F:
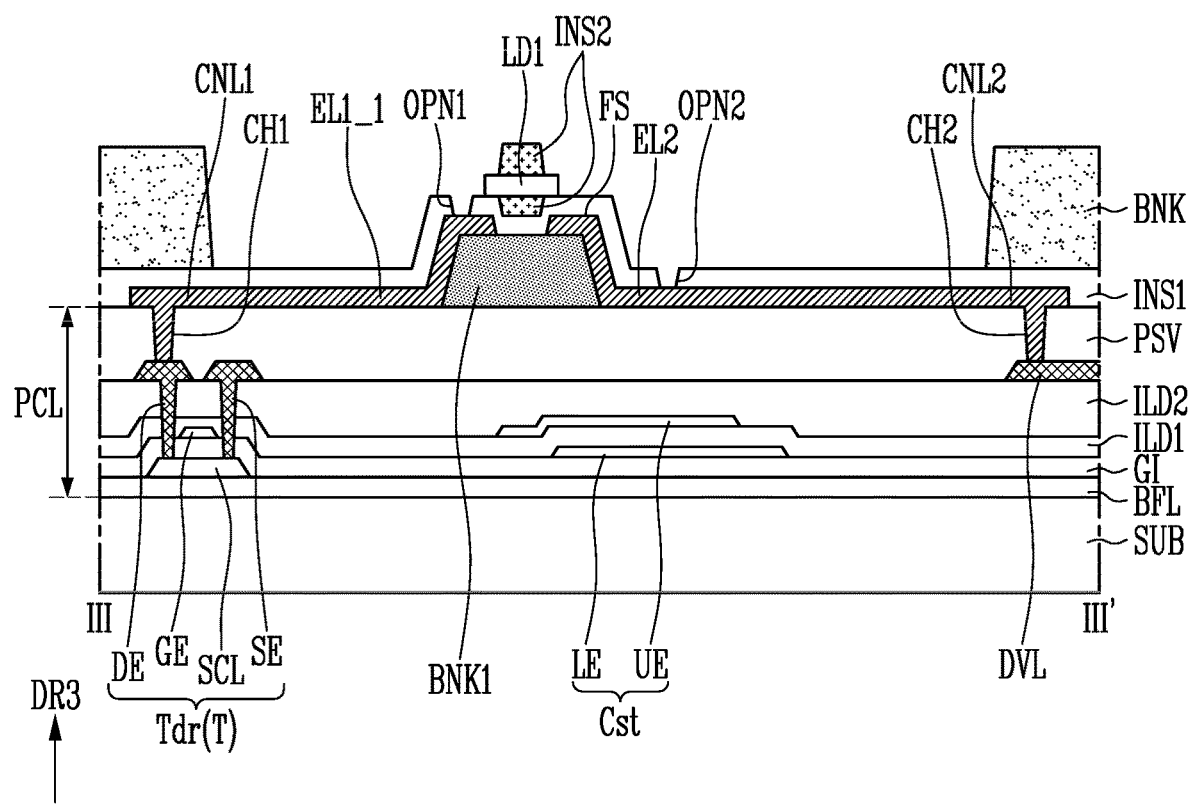
Figure 12G:
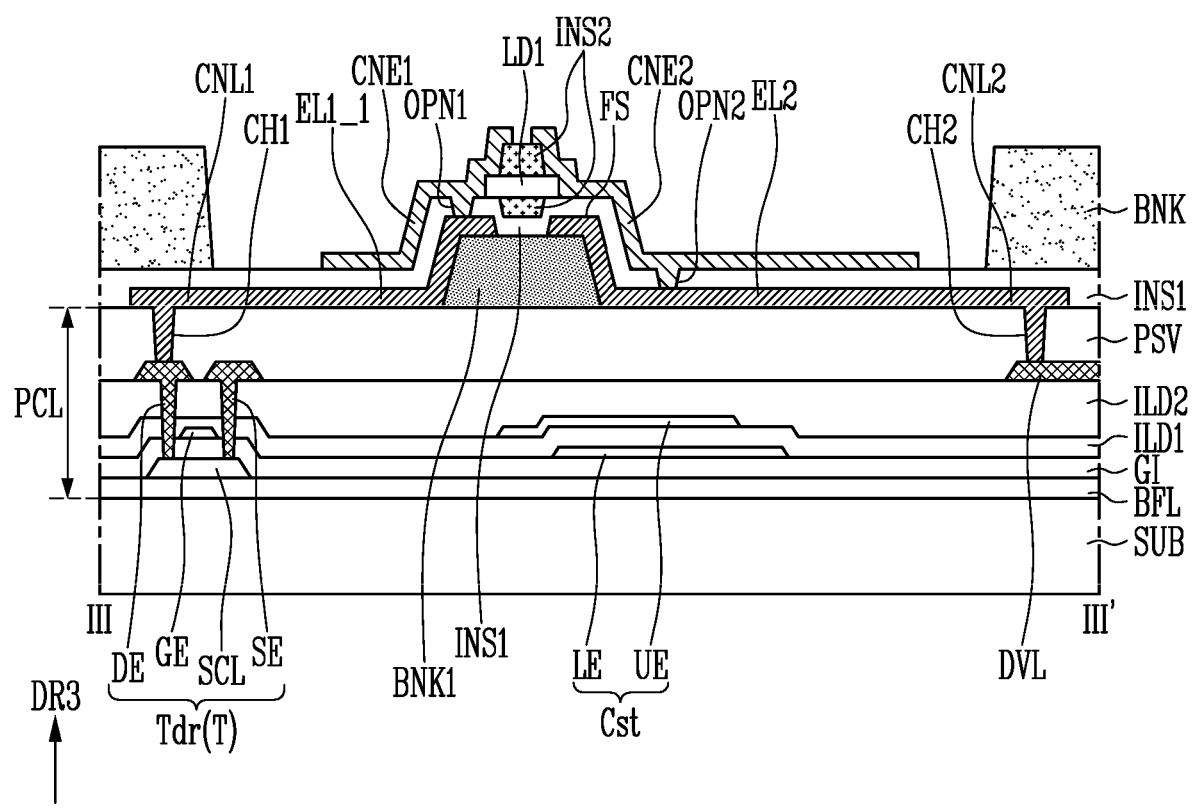
Figure 12H:
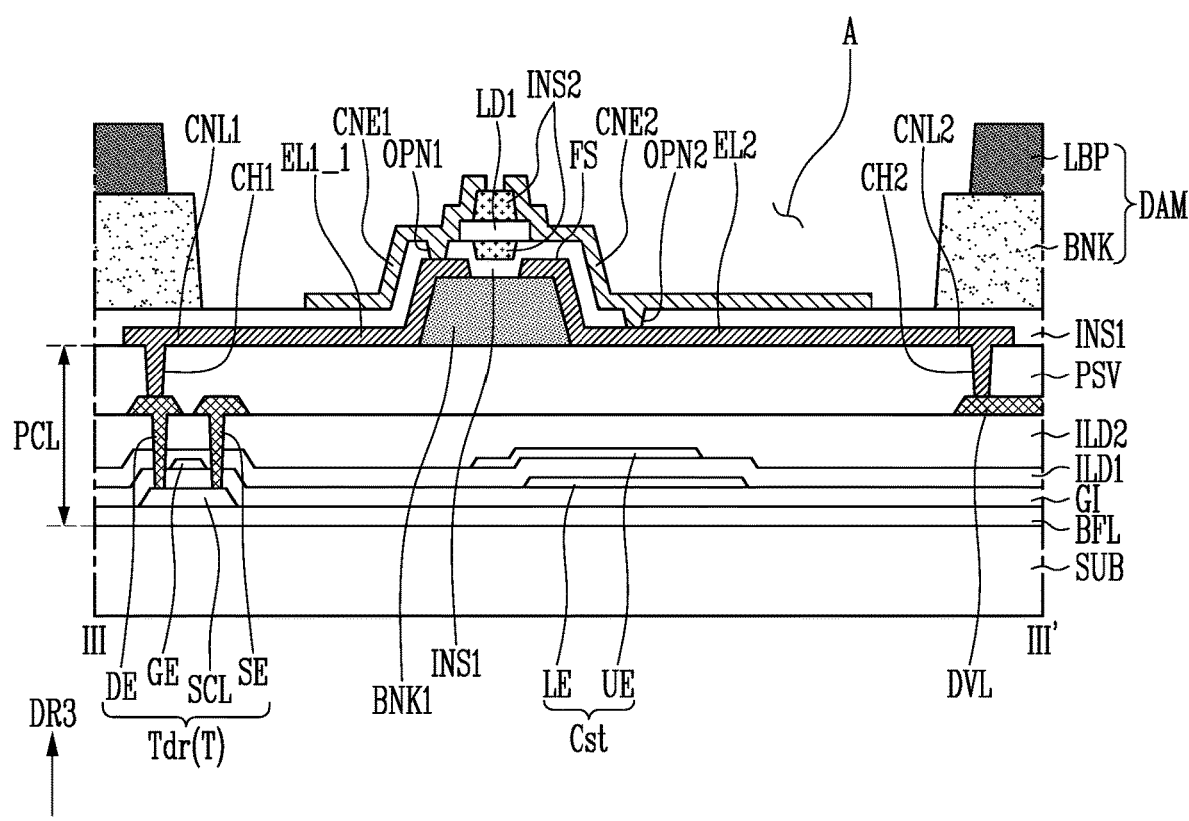
Figure 12I:
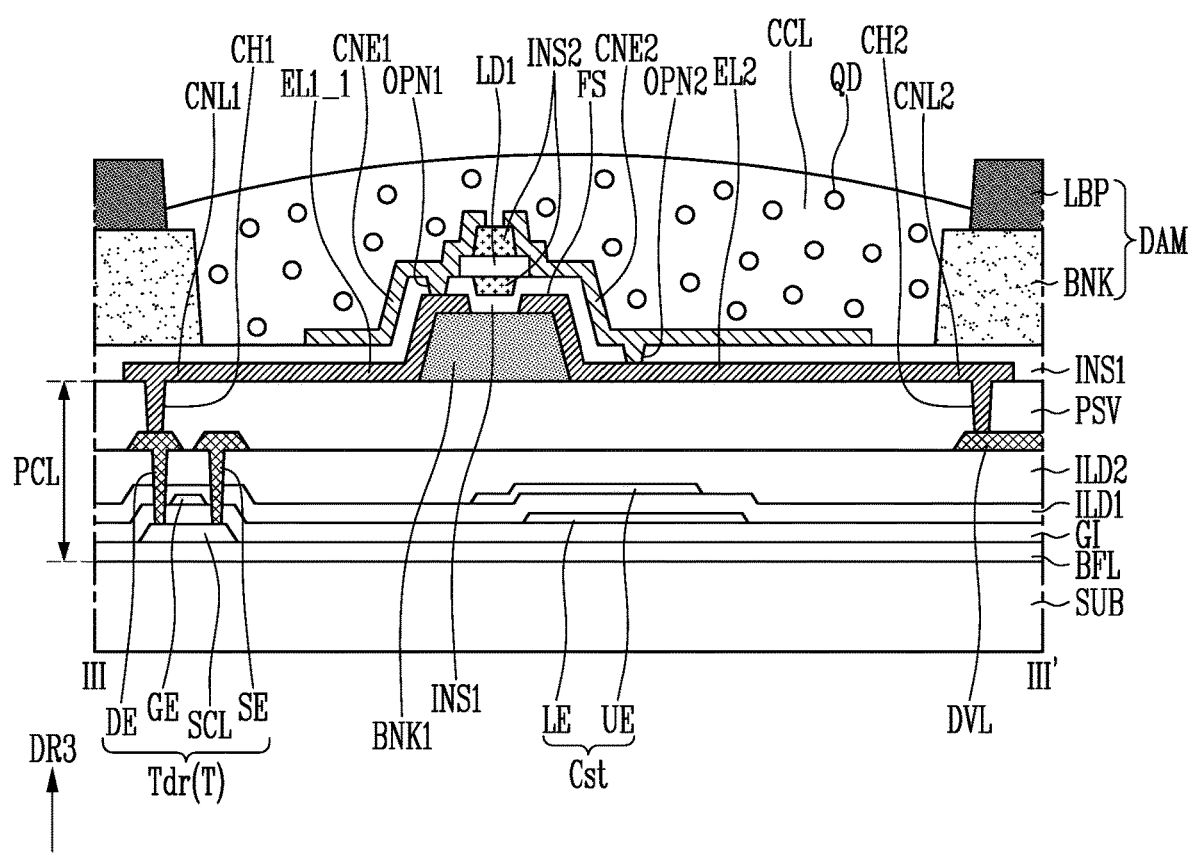
Figure 12J:
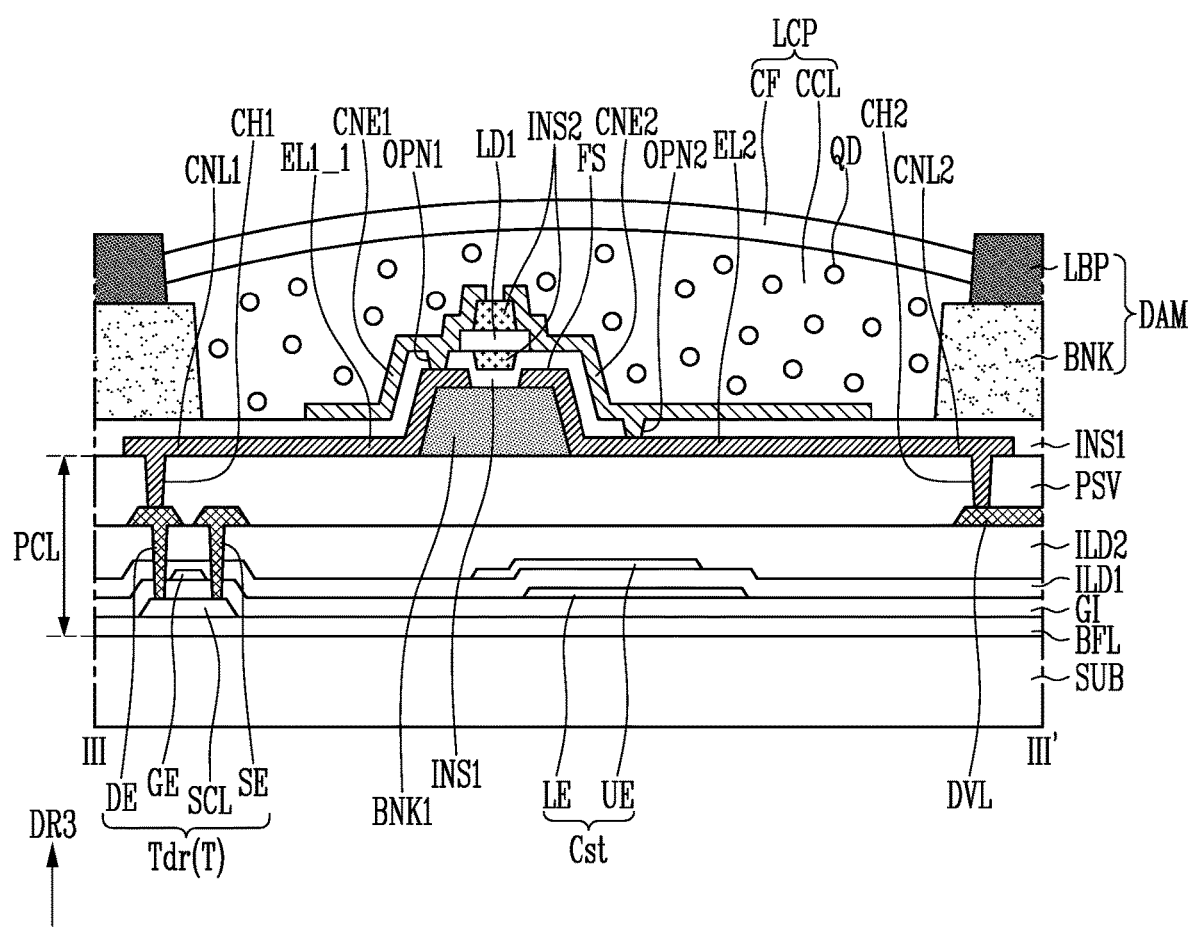
Figure 12K:
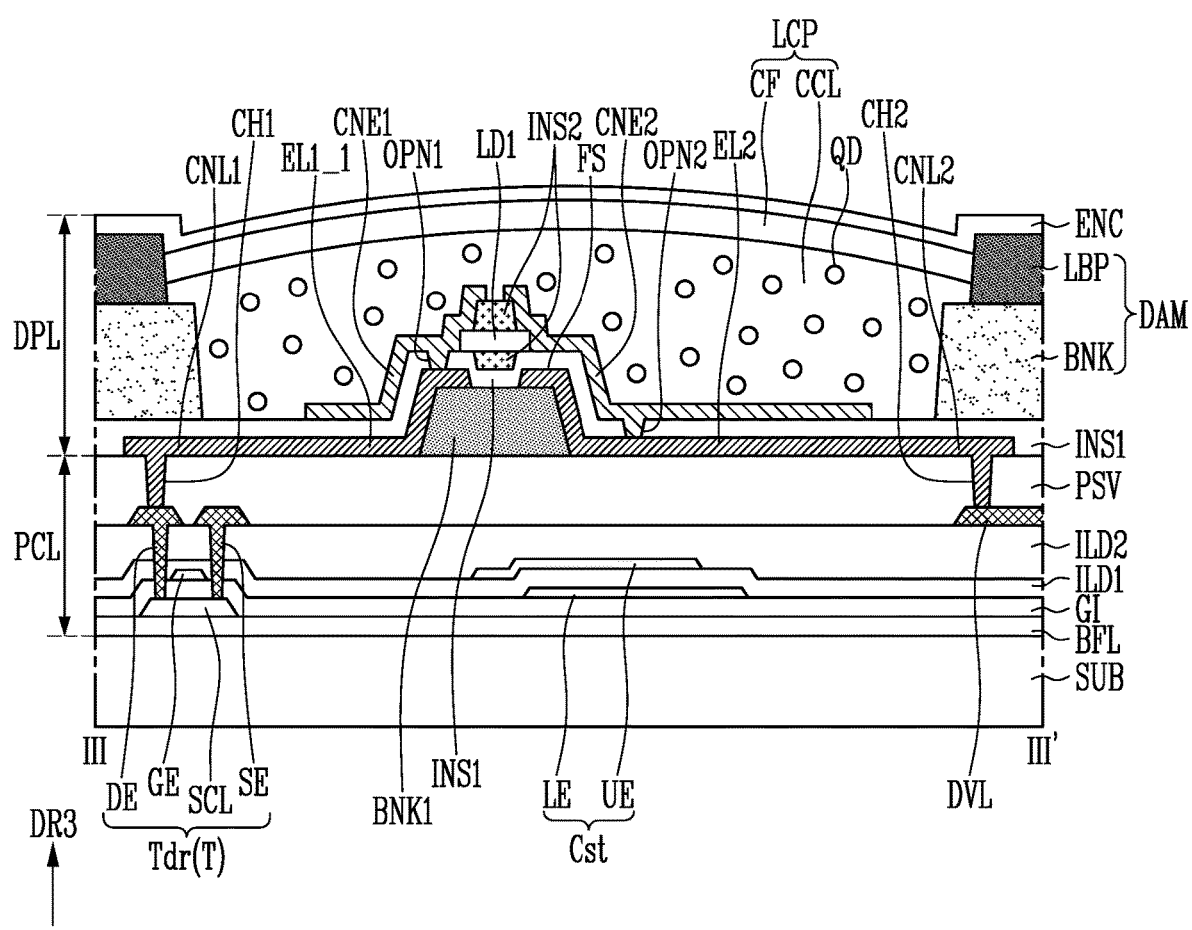

FIG. 5A illustrates a schematic top plan view of one of the pixels PXL shown in FIG. 3, FIG. 5B illustrates a schematic top plan view of an example of applying a light blocking pattern LBP to the pixel of FIG. 5A, FIG. 6 illustrates a top plan view of only first and second bank patterns BNK1 and BNK2, first and second electrodes EL1 and EL2, and light emitting elements LD in the pixel of FIG. 5A, FIG. 7 illustrates a cross-sectional view taken along the line I-I' of FIG. 5A, FIG. 8 illustrates a cross-sectional view taken along the line II-II' of FIG. 5A, FIG. 9 illustrates a cross-sectional view of another embodiment for implementing the first to third contact electrodes CNE1 to CNE3 of FIG. 8, and illustrates a cross-sectional view corresponding to the line II-II' of FIG. 5A, FIG. 10 illustrates a cross-sectional view taken along the line III-III' of FIG. 5B, and FIG. 11A and FIG. 11B illustrate cross-sectional views of another embodiment for implementing the bank BNK and the light blocking pattern LBP of FIG. 10, and illustrate cross-sectional views corresponding to the line III-III' of FIG. 5B.

The pixel PXL shown in FIG. 5A and FIG. 5B may be substantially the same as the pixel PXL shown in FIG. 4A.

In FIG. 5A and FIG. 5B, for convenience, transistors T connected to the light emitting elements LD and signal lines connected to the transistors T are omitted.

In FIG. 5A-FIG. 11B, one pixel PXL is simplified by showing each electrode only as an electrode of a single film, and each insulating layer only as an insulating layer of a single film, but the present disclosure is not limited thereto.

Additionally, in the described embodiments of the present disclosure, "formed and/or provided on (or at) the same layer" means formed in the same process, and "formed and/or provided on (or at) another layer" means formed in a different process.

Further, in the described embodiments of the present disclosure, "connection" between two elements may comprehensively mean both electrical and physical connections.

Further, in the described embodiments of the present disclosure, for better understanding and ease of description, a horizontal direction in a plan view is indicated by the first direction DR1, a vertical direction in a plan view is indicated by the second direction DR2, and a thickness direction of the substrate SUB in a plan view is indicated by the third direction DR3. The first to third directions DR1, DR2, and DR3 may mean directions indicated by the first to third directions DR1, DR2, and DR3, respectively.

Referring to FIG. 1-FIG. 11B, a display device according to an embodiment of the present disclosure may include a plurality of pixels PXL provided on a substrate SUB.

The substrate SUB may include a transparent insulating material to transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate that include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

A material applied to the substrate SUB may have resistance (or heat resistance) to a high processing temperature in a manufacturing process of the display device.

For example, the substrate SUB may include the display area DA including pixel areas PXA in which respective pixels PXL are disposed, and the non-display area NDA disposed around the display area DA (or adjacent to the display area DA).

The pixels PXL may be arranged in a matrix form and/or a stripe form according to a plurality of pixel rows extending in the first direction DR1 in the display area DA on the substrate SUB and a plurality of pixel columns extending in the second direction DR2 different from the first direction DR1, for example, crossing the first direction DR1, but the present disclosure is not limited thereto. In some embodiments, the pixels PXL may be provided in the display area DA of the substrate SUB in various arrangements.

The pixel area PXA in which each pixel PXL is provided may include an emission area in which light is emitted and a peripheral area adjacent to the emission area (or surrounding a periphery of the emission area). In the described embodiment of the present disclosure, the peripheral area may include a non-emission area in which light is not emitted.

A wire part electrically connected to the pixels PXL may be disposed on the substrate SUB. The wire part may include a plurality of signal lines for transmitting a signal (e.g., a set or predetermined signal) (or a set or predetermined voltage) to each pixel PXL. The signal lines may include an i-th scan line Si for transmitting a scan signal to each pixel PXL, a j-th data line Dj for transmitting a data signal to each pixel PXL, and power lines PL1 and DVL for transmitting a driving power source to each pixel PXL. In some embodiments, the wire part may further include an emission control line for transmitting an emission control signal to each pixel PXL. In another embodiment, the wire part may further include a sensing line and a control line connected to each pixel PXL.

Each pixel PXL may be provided on the substrate SUB, and may include a pixel circuit layer PCL including the pixel circuit PXC and a display element layer DPL including the plurality of light emitting elements LD. The light emitting elements LD may be disposed in the pixel area PXA of each pixel PXL.

For convenience, the pixel circuit layer PCL is first described, and then the display element layer DPL is described.

The pixel circuit layer PCL may include a buffer layer BFL, a pixel circuit provided on the buffer layer BFL, and a passivation layer PSV provided on the pixel circuit PXC.

The buffer layer BFL may prevent impurities from being diffused into the transistors T included in the pixel circuit PXC. The buffer layer BFL may be an inorganic insulating film including an inorganic material. The buffer layer BFL may include at least one of metal oxides such as a silicon nitride ($SiN_x$), a silicon oxide ($SiO_x$), a silicon oxynitride ($SiO_xN_y$), and an aluminum oxide ($AlO_x$). The buffer layer BFL may be provided as a single film, but may be provided as a multifilm of at least double or more films. When the buffer layer BFL is provided as the multi-film, respective layers thereof may be made of the same material or different materials. The buffer layer BFL may be omitted depending on the material, a process condition, and the like of the substrate SUB.

The pixel circuit PXC may include at least one transistor T and a storage capacitor Cst. The transistor T may include a driving transistor Tdr for controlling a driving current of the light emitting elements LD and a switching transistor Tsw connected to the driving transistor Tdr. However, the present disclosure is not limited thereto, and the pixel circuit PXC may further include circuit elements that perform other functions in addition to the driving transistor Tdr and the switching transistor Tsw. In the following embodiment, the driving transistor Tdr and the switching transistor Tsw are comprehensively referred to as a transistor T or transistors T. The driving transistor Tdr may have the same configuration as the first transistor T1 described with reference to FIG. 4A, and the switching transistor Tsw may have the same configuration as the second transistor T2 described with reference to FIG. 4A.

Each of the driving transistor Tdr and the switching transistor Tsw may include a semiconductor pattern SCL, a gate electrode GE, a first terminal SE, and a second terminal DE. The first terminal SE may be one of a source electrode and a drain electrode, and the second terminal DE may be the remaining electrode of the transistor T. For example, when the first terminal SE is the source electrode, the second terminal DE may be the drain electrode.

The semiconductor pattern SCL may be provided and/or formed on the buffer layer BFL. The semiconductor pattern SCL may include a first contact area in contact with the first terminal SE and a second contact area in contact with the second terminal DE. A region between the first contact region and the second contact region may be a channel region. The channel region may overlap the gate electrode GE of the corresponding transistor T in the third direction DR3. The semiconductor pattern SCL may be a semiconductor pattern made of a poly silicon, an amorphous silicon, an oxide semiconductor, or the like. For example, the channel region, which is a semiconductor pattern that is not doped with impurities, may be an intrinsic semiconductor. The first contact region and the second contact region may be semiconductor patterns doped with impurities.

The gate electrode GE may be provided and/or formed on a gate insulating layer GI to correspond to the channel region of the semiconductor pattern SCL. The gate insulating layer GI may be disposed on the buffer layer BFL and the semiconductor pattern SCL. The gate electrode GE may be provided on the gate insulating layer GI to overlap the channel region of the semiconductor pattern SCL in the third direction DR3. The gate electrode GE may be formed to have a single film structure of a single or a mixture thereof selected from a group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a double film or multi-film structure of molybdenum (Mo), titanium (Ti), copper (Cu), aluminum (Al) or silver (Ag), each of which is a low-resistance material.

The gate insulating layer GI may be an inorganic insulating film including an inorganic material. For example, the gate insulating layer GI may include at least one of metal oxides or metal nitrides such as a silicon nitride (SiNx), a silicon oxide (SiOx), a silicon oxynitride (SiOxNy), and an aluminum oxide (AlOx). However, the material of the gate insulating layer GI is not limited to the above-described embodiments. In some embodiments, the gate insulating layer GI may be formed as an organic insulating film including an organic material. The gate insulating layer GI may be provided as a single film, or may be provided as a multi-film of at least two or more films.

Each of the first terminal SE and the second terminal DE may be provided and/or formed on a second interlayer insulating layer ILD2, and may contact the first contact region and the second contact region of the semiconductor pattern SCL through corresponding contact holes sequentially passing through the gate insulating layer GI and the first and second interlayer insulating layers ILD1 and ILD2. For example, the first terminal SE may contact the first contact region of the semiconductor pattern SCL, and the second terminal DE may contact the second contact region of the semiconductor pattern SCL. Each of the first and second terminals SE and DE may include the same material as that of the gate electrode GE, or may include one or more materials selected from the materials illustrated as constituent materials of the gate electrode GE.

The first interlayer insulating layer ILD1 may include the same material as that of the gate insulating layer GI, or may include one or more materials selected from the materials illustrated as constituent materials of the gate insulating layer GI.

The second interlayer insulating layer ILD2 may be provided and/or formed on the first interlayer insulating layer ILD1. The second interlayer insulating layer ILD2 may be an inorganic insulating film including an inorganic material or an organic insulating film including an organic material. In some embodiments, the second interlayer insulating layer ILD2 may include the same material as the first interlayer insulating layer ILD1, but the present disclosure is not limited thereto. The second interlayer insulating layer ILD2 may be provided as a single film, or may be provided as a multi-film of at least double or more films.

In the above-described embodiment, it is described that the first and second terminals SE and DE of each of the driving transistor Tdr and the switching transistor Tsw are separate electrodes that are electrically connected to the semiconductor pattern SCL through corresponding contact holes sequentially penetrating the gate insulating layer GI and the first and second interlayer insulating layer ILD1 and ILD2, but the present disclosure is not limited thereto. In some embodiments, the first terminal SE of each of the driving transistor Tdr and the switching transistor Tsw may be a first contact region adjacent to the channel region of the corresponding semiconductor pattern SCL, and the second terminal DE of each of the driving transistor Tdr and the switching transistor Tsw may be a second contact region adjacent to the channel region of the corresponding semiconductor pattern SCL. In this case, the second terminal DE of the driving transistor Tdr may be electrically connected to the light emitting elements LD of the corresponding pixel PXL through a separate connection member such as a bridge electrode.

In the described embodiments of the present disclosure, the transistors T included in the pixel circuit PXC may be configured as a low temperature polysilicon thin film transistor, but the present disclosure is not limited thereto. In some embodiments, the transistors T included in the pixel circuit PXC may be configured as oxide semiconductor thin film transistors. Further, in the above-described embodiment, the case in which the transistors T are thin film transistors having a top gate structure is described as an example, but the present disclosure is not limited thereto, and the structure of the transistors T may be variously changed.

The storage capacitor Cst may include a lower electrode LE provided on the gate insulating layer GI and an upper electrode UE provided on the first interlayer insulating layer ILD1 and overlapping the lower electrode LE.

The lower electrode LE may be provided at the same layer as the gate electrode GE of each of the driving transistor Tdr and the switching transistor Tsw and as the i-th scan line, and may include the same material. The lower electrode LE may be integrally provided with the gate electrode GE of the driving transistor Tdr. In this case, the lower electrode LE may be regarded as a region of the gate electrode GE of the driving transistor Tdr. In some embodiments, the lower electrode LE may be provided in a separate configuration (or non-integral configuration) from the gate electrode GE of the driving transistor Tdr. In this case, the lower electrode LE and the gate electrode GE of the driving transistor Tdr may be electrically connected through a separate connection element. The first interlayer insulating layer ILD1 may be disposed on the gate electrode GE and the lower electrode LE.

The upper electrode UE may be disposed on the first interlayer insulating layer ILD1. The upper electrode UE may overlap the lower electrode LE in the third direction DR3, and may cover the lower electrode LE. Capacitance of the storage capacitor Cst may be increased by increasing an overlapping area of the upper electrode UE and the lower electrode LE. The upper electrode UE may be electrically connected to the first power line PL1. The storage capacitor Cst may be covered by the second interlayer insulating layer ILD2.

The pixel circuit layer PCL may include a driving voltage wire DVL provided and/or formed on the second interlayer insulating layer ILD2. The driving voltage wire DVL may have the same configuration as the second power line PL2 described with reference to FIG. 4A. The driving voltage wire DVL is connected to the second driving power source VSS, so that the voltage of the second driving power source VSS may be applied to the driving voltage wire DVL. The pixel circuit layer PCL may further include the first power line PL1 connected to the first driving power source VDD. The first power line PL1 may be provided at the same layer as the driving voltage wire DVL, or may be provided on a different layer from the driving voltage wire DVL. It has been described that the driving voltage wire DVL is provided at the same layer as the first and second terminals SE and DE of the driving transistor Tdr (e.g., the first and second terminals SE and DE of the transistor T and the driving voltage wire DVL may be provided and/or formed on the second interlayer insulating layer ILD2), but the present disclosure is limited thereto. In some embodiments, the driving voltage wire DVL may be provided at the same layer as one of conductive layers provided in the pixel circuit layer PCL. That is, the position of the driving voltage wire DVL in the pixel circuit layer PCL may be variously changed.

The first power line PL1 may be electrically connected to one configuration of the display element layer DPL, for example, to the first electrode EL1, and the driving voltage wire DVL may be electrically connected to the other configuration of the display element layer DPL, for example, to the second electrode EL2. The first power line PL1 and the driving voltage wire DVL may each transmit an alignment signal (or alignment voltage) to the first and second electrodes EL1 and EL2 to align the light emitting elements LD in the pixel area PXA between the first and second electrodes EL1 and EL2 of each of the pixels PXL. Further, after the alignment of the light emitting elements LD, each of the first power line PL1 and the driving voltage wire DVL transmits a voltage of a corresponding driving power source to each pixel PXL to drive the light emitting elements LD.

Each of the first power line PL1 and the driving voltage wire DVL may include a conductive material. For example, each of the first power line PL1 and the driving voltage wire DVL may be formed to have a single film structure of a single or a mixture thereof selected from a group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a double film or multi-film structure of molybdenum (Mo), titanium (Ti), copper (Cu), aluminum (Al) or silver (Ag), each of which is a low-resistance material. For example, each of the first power line PL1 and the driving voltage wire DVL may be configured of a double film stacked in the order of titanium (Ti)/copper (Cu).

The passivation layer PSV may be provided and/or formed on the transistors T and the driving voltage wire DVL.

The passivation layer PSV may include an organic insulating film, an inorganic insulation film, or the organic insulating layer disposed on the inorganic insulating film. The inorganic insulating film may include, for example, at least one of metal oxides or metal nitrides such as a silicon nitride (SiNx), a silicon oxide (SiOx), a silicon oxynitride (SiOxNy), and an aluminum oxide (AlOx). The organic insulating film may be, for example, at least one of a polyacrylates resin, an epoxy resin, a phenolic resin, a polyamides resin, a polyimides rein, an unsaturated polyesters resin, a poly-phenylen ethers resin, a poly-phenylene sulfides resin, and a benzocyclobutene resin.

The passivation layer PSV may include a first contact hole CH1 exposing one area of the second terminal DE of the driving transistor Tdr and a second contact hole CH2 exposing one area of the driving voltage wire DVL.

The display element layer DPL may be provided on the passivation layer PSV.

The display element layer DPL may include a bank BNK, first and second bank patterns (or first and second patterns) BNK1 and BNK2, first and second connection wires CNL1 and CNL2, first and second electrodes EL1 and EL2, light emitting elements LD, a contact electrode CNE. Further, the display element layer DPL may include first to third insulating layers INS1 to INS3.

The bank BNK may be disposed in a peripheral area surrounding at least one side of an emission area of a corresponding pixel PXL.

The bank BNK may be a structure that defines (or partitions) the pixel area PXA or emission area of each of a corresponding pixel PXL and pixels adjacent thereto, and for example, may be a pixel defining film. The bank BNK may be configured to include at least one light blocking material and/or a reflective material to prevent or reduce light leakage from occurring between each pixel PXL and pixels PXL adjacent thereto. In some embodiments, the bank BNK may include a transparent material (or substance). The transparent material may include, for example, a polyamides resin, a polyimide resin, and the like, but the present disclosure is not limited thereto. According to another embodiment, a reflective material layer may be provided and/or formed on the bank BNK to further improve an efficiency of light emitted from each of the pixels PXL.

The bank BNK may be provided and/or formed on the first insulating layer INS1, but the present disclosure is not limited thereto. In some embodiment, the bank BNK may be provided and/or formed on the passivation layer PSV.

The first and second bank patterns BNK1 and BNK2 may be disposed in an emission area from which light is emitted from the pixel area PXA of each of the pixels PXL. The first and second bank patterns BNK1 may be a support member partially or entirely supporting each of the first and second electrodes EU and EL2 so as to change a surface profile (or shape) of each of the first and second electrodes EL1 and EL2 to direct light emitted from the light emitting elements LD in the image display direction of the display device.

The first bank pattern BNK1 may be provided between the passivation layer PSV and the first electrode EL1 in the emission area of the corresponding pixel PXL. The second bank pattern BNK2 may be provided between the passivation layer PSV and the second electrode EL2 in the emission area of the corresponding pixel PXL.

The first and second bank patterns BNK1 and BNK2 may include a light blocking material that may have a suitable level of dielectric constant (e.g., a set or predetermined level of dielectric constant), and may absorb (or block) light incident on the corresponding pixel PXL from the outside or may absorb (or block) light emitted from the light emitting elements LD disposed thereon and proceeding in the direction of the pixel circuit layer PCL. For example, the first and second bank patterns BNK1 and BNK2 may be a black matrix. In this case, the first and second bank patterns BNK1 and BNK2 may prevent or reduce erroneous operations of the transistors T by reducing or minimizing light that may be introduced to the transistors (T) included in the pixel circuit layer PCL.

In the above-described embodiment, the first and second bank patterns BNK1 and BNK2 have been described as including a light blocking material, but the present disclosure is not limited thereto. In some embodiments, the first and second bank patterns BNK1 and BNK2 may include an inorganic insulating film including an inorganic material or an organic insulating film including an organic material. For example, the first and second bank patterns BNK1 and BNK2 may include a single-filmed organic insulating film and/or a single-filmed inorganic insulating film. According to another embodiment, the first and second bank patterns BNK1 and BNK2 may be provided in a multi-filmed structure in which at least one or more of organic insulating film and at least one or more of inorganic insulating film are stacked. However, the material of the first and second bank patterns BNK1 and BNK2 is not limited to the above-described embodiment, and in some embodiments, the first and second bank patterns BNK1 and BNK2 may include a conductive material.

The first and second bank patterns BNK1 and BNK2 may have cross-sections of a trapezoidal shape of which width is narrowed from one surface (for example, an upper surface) of the passivation layer PSV toward an upper portion thereof along the third direction DR3, but the present disclosure is not limited thereto. In some embodiments, the first and second bank patterns BNK1 and BNK2 may include a curved surface having a cross section of a semi-elliptic shape or a semi-circular shape (or semi-spherical shape) of which width is narrowed from one surface of the passivation layer PSV toward an upper portion thereof along the third direction DR3. When viewed in a cross-sectional view, the shape of each of the first and second bank patterns BNK1 and BNK2 is not limited to the above-described embodiments, and the shape thereof may be variously changed within a range in which the first to fourth bank patterns may improve efficiency of light emitted from each of the light emitting elements LD. When viewed in a cross-sectional view, the shapes of the first and second bank patterns BNK1 and BNK2 are not limited to the above-described embodiments, and the shapes thereof may be variously changed within a range in which the first to fourth bank patterns may improve efficiency of light emitted from each of the light emitting elements LD. The first bank pattern BNK1 and the second bank pattern BNK2 adjacent in the first direction DR1 may be disposed on the same surface as the upper surface of the passivation layer PSV, and may have the same height (or substantially the same height) (or thickness) in the third direction DR3.

In the described embodiments of the present disclosure, each of the first and second bank patterns BNK1 and BNK2 may have a width W in the first direction DR1 that is larger than a length L of each of the light emitting elements LD so that the light emitting elements LD may be stably aligned thereon. For example, when the length L of each of the light emitting elements LD is about 1 μm to 10 μm, the width W of each of the first and second bank patterns BNK1 and BNK2 in the first direction DR1 may be larger than 1 μm to 10 μm.

The first connection wire CNL1 may extend in the first direction DR1 in the pixel area PXA of the corresponding pixel PXL when viewed in a plan view. The first connection wire CNL1 may be provided and/or formed only within the corresponding pixel PXL to independently or individually drive the corresponding pixel PXL from adjacent pixels PXL, and may be electrically and/or physically separated from the first connection wire CNL1 provided and/or formed in each of the adjacent pixels PXL. The first connection wire CNL1 of each pixel PXL may be electrically connected to some elements of the pixel circuit layer PCL of the pixel PXL through the first contact hole CH1 penetrating through the passivation layer PSV, for example, to the driving transistor Tdr.

The second connection wire CNL2 may extend in a direction parallel to an extending direction of the first connection wire CNL1 in the pixel area PXA of the corresponding pixel PXL when viewed in a plan view. For example, the second connection wire CNL2 may extend in the first direction DR1. The second connection wire CNL2 may be commonly provided to the corresponding pixel PXL and adjacent pixels PXL. Accordingly, a plurality of pixels PXL disposed in the same pixel row in the first direction DR1 may be commonly connected to the second connection wire CNL2. The second connection wire CNL2 provided to each pixel PXL may be electrically connected to some elements of the pixel circuit layer PCL of the pixel PXL through the second contact hole CH2 penetrating through the passivation layer PSV, for example, to the driving voltage wire DVL.

Each of the first and second electrodes EL1 and EL2 may be provided in the pixel area PXA of each of the pixels PXL, and may be extended in the second direction DR2 different from the first direction DR1. The first electrode EL1 and the second electrode EL2 may be provided on the same surface, for example, on one surface (or upper surface) of the passivation layer PSV, and may be disposed to be spaced from each other in the first direction DR1.

The first electrode EL1 may be branched from the first connection wire CNL1 to the second direction DR2. The first electrode EL1 and the first connection wire CNL1 may be integrally provided to be electrically and/or physically connected to each other. In this case, the first connection wire CNL1 may be an area of the first electrode EL1, or the first electrode EL1 may be an area of the first connection wire CNL1. However, the present disclosure is not limited thereto, and in some embodiments, the first electrode EL1 and the first connection wire CNL1 may be separately formed from each other to be electrically connected to each other through a contact hole and a connection member, which are not shown. The first electrode EU may include a (1-1)-th electrode EL1_1 and a (1-2)-th electrode EL1_2 branched from the first connection wire CNL1 to the second direction DR2.

The second electrode EL2 may be branched from the second connection wire CNL2 to the second direction DR2. The second electrode EL2 may be integrally provided with the second connection wire CNL2, so that they may be electrically and/or physically connected to each other. In this case, the second connection wire CNL2 may be an area of the second electrode EL2, or the second electrode EL2 may be an area of the second connection wire CNL2. However, the present disclosure is not limited thereto, and in some embodiments, the second electrode EL2 and the second connection wire CNL2 may be separately formed from each other to be electrically connected to each other through a contact hole and a connection member, which are not shown.

The second electrode EL2 may be disposed between the (1-1)-th electrode EL1_1 and the (1-2)-th electrode EL1_2 when viewed in a plan view. A first side surface FS of the second electrode EL2 may be an area of the second electrode EL2 facing (or opposite or disposed adjacent to) the (1-1)-th electrode EL1_1, and a second side surface SS of the second electrode EL2 may be an area of the second electrode EL2 facing (or opposite or disposed adjacent to) the (1-2)-th electrode EL1_2. In this case, a distance between the (1-1)-th electrode EL1_1 and the first side surface FS of the second electrode EL2, and a disjoint between the second side surface SS of the second electrode EL2 and the (1-2)-th electrode EL1_2 may have the same distance or may be the same. However, the present disclosure is not limited thereto, and in some embodiment, the distance between the (1-1)-th electrode EL1_1 and the first side surface FS of the second electrode EL2, and the disjoint between the second side surface SS of the second electrode EL2 and the (1-2)-th electrode EL1_2 may have the same distance or may be different.

The first electrode EL1 may be electrically connected to some components included in the pixel circuit layer PCL of the corresponding pixel PXL, for example, the driving transistor Tdr, through the first contact hole CH1 and the first connection wire CNL1. The second electrode EL2 may be electrically connected to some components included in the pixel circuit layer PCL of the corresponding pixel PXL, for example, the driving voltage wire DVL, through the second contact hole CH2 and the second connection wire CNL2.

Each of the first and second electrodes EU and EL2 may be made of a material having a constant reflectance in order to allow light emitted from each of the light emitting elements LD to progress in an image display direction of the display device. Each of the first and second electrodes EL1 and EL2 may be made of a conductive material (or substance) having a constant reflectance. The conductive material (or substance) may include an opaque metal that is suitable for reflecting light emitted by the light emitting elements LD in the image display direction of the display device. The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and/or an alloy thereof. In some embodiments, each of the first and second electrodes EL1 and EL2 may include a transparent conductive material (or substance). The transparent conductive material (or substance) may include a conductive oxide such as an indium tin oxide (ITO), an indium zinc oxide (IZO), a zinc oxide (ZnO), an indium gallium zinc oxide (IGZO), and an indium tin zinc oxide (ITZO), and a conductive polymer such as poly(3,4-ethylenedioxythiophene) (PEDOT). When each of the first and second electrodes EL1 and EL2 includes the transparent conductive material, a separate conductive layer, which is made of an opaque metal for reflecting light emitted from the light emitting elements LD in the image display direction of the display device, may be additionally included. However, the material of each of the first and second electrodes EL1 and EL2 is not limited to the materials described above.

Further, each of the first and second electrodes EL1 and EL2 may be provided and/or formed as a single film, but the present disclosure is not limited thereto. In some embodiments, each of the first and second electrodes EL1 and EL2 may be provided and/or formed as a multi-layered film in which at least two or more of metals, alloys, conductive oxides, and conductive polymers are stacked. Each of the first and second electrodes EL1 and EL2 may be formed of a multi-layered film of at least a double-layered film or more to reduce or minimize distortion caused by signal delay when transmitting a signal (or voltage) to respective end portions of each of the light emitting elements LD. For example, each of the first and second electrodes EL1 and EL2 may be formed of a multi-layered film sequentially stacked in an order of indium tin oxide (ITO)/silver (Ag)/indium tin oxide (ITO).

When the first connection wire CNL1 is integrally provided with the first electrode EL1, the first connection wire CNL1 may include the same material as the first electrode EL1. Further, when the second connection wire CNL2 is integrally provided with the second electrode EL2, the second connection wire CNL2 may include the same material as the second electrode EL2.

The first electrode EL1 and the second electrode EL2 may each receive an alignment signal (or alignment voltage) to function as an alignment electrode (or alignment wire) for alignment of the light emitting elements LD. For example, the first electrode EL1 may receive the first alignment signal (or first alignment voltage) from the first connection wire CNL1 to function as the first alignment electrode (or first alignment wire), and the second electrode EL2 may receive the second alignment signal (or second alignment voltage) from the second connection wire CNL2 to function as the second alignment electrode (or second alignment wire). Here, the first and second alignment signals (or alignment voltages) may be signals having a voltage difference and/or a phase difference in which the light emitting elements LD may be aligned between the first and second electrodes EL1 and EL2. At least one of the first and second alignment signals (or alignment voltages) may be an AC signal (or voltage), but the present disclosure is not limited thereto.

After the light emitting elements LD are arranged in the pixel area PXA of each pixel PXL, a portion of the first connection wire CNL1 disposed between adjacent pixels PXL in the first direction DR1 may be removed to individually (or independently) drive each pixel PXL. Further, after the light emitting elements LD are arranged in the pixel area PXA, the first electrode EL1 and the second electrode EL2 may function as driving electrodes for driving the light emitting elements LD. In the described embodiments of the present disclosure, the first electrode EL1 may be an anode electrode, and the second electrode EL2 may be a cathode electrode.

In the described embodiments of the present disclosure, the first bank pattern BNK1 may be provided on some elements of the pixel circuit layer PCL between the (1-1)-th electrode EL1_1 and the first side surface FS of the second electrode EL2, for example, on the passivation layer PSV. The (1-1)-th electrode EL1_1 and the first side surface FS of the second electrode EL2 may be provided and/or formed on the first bank pattern BNK1. When viewed in a plan view, the (1-1)-th electrode EL1_1 and the first side surface FS of the second electrode EL2 may partially overlap the first bank pattern BNK1. The (1-1)-th electrode EL1_1 and the first side surface FS of the second electrode EL2 may be disposed to be spaced from each other in the first direction DR1 on the first bank pattern BNK1.

The second bank pattern BNK2 may be provided on the passivation layer PSV between the second side surface SS of the second electrode EL2 and the (1-2)-th electrode EL1_2. The second side surface SS of the second electrode EL2 and the (1-2)-th electrode EL1_2 may be provided and/or formed on the second bank pattern BNK2. When viewed in a plan view, the second side surface SS of the second electrode EL2 and the (1-2)-th electrode EL1_2 may partially overlap the second bank pattern BNK2. The second side surface SS of the second electrode EL2 and the (1-2)-th electrode EL1_2 may be disposed to be spaced from each other in the first direction DR1 on the second bank pattern BNK2.

The first side surface FS of the second electrode EL2 may be provided and/or formed on the other side surface of the first bank pattern BNK1, the second side surface SS of the second electrode EL2 may be provided and/or formed on one side surface of the second bank pattern BNK2, and the remaining portion of the second electrode EL2 (for example, an area of the second electrode EL2 excluding the first and second side surfaces FS and SS) may be provided and/or formed on the passivation layer PSV. Accordingly, the second electrode EL2 may overlap the first bank pattern BNK1, the second bank pattern BNK2, and the passivation layer PSV.

The (1-1) electrode EL1_1 may be provided and/or formed on one side surface of the first bank pattern BNK1 and on the passivation layer PSV to have a surface profile corresponding to one side surface of the first bank pattern BNK1 and the passivation layer PSV. For example, when one side surface of the first bank pattern BNK1 has a slope (e.g., a set or predetermined slope), the (1-1)-th electrode EL1_1 may also have a surface profile corresponding to the slope. Further, the (1-1)-th electrode EL1_1 may have a surface profile corresponding to the passivation layer PSV having a flat surface.

The first side surface FS of the second electrode EL2 may be provided and/or formed on the other side surface of the first bank pattern BNK1 to have a surface profile corresponding to a shape of the other side surface of the first bank pattern BNK1. For example, when the other side surface of the first bank pattern BNK1 has a slope (e.g., a set or predetermined slope), the first side surface FS of the second electrode EL2 may also have a surface profile corresponding to the slope. In this case, one side surface and the other side surface of the first bank pattern BNK1 may have the same slope, but the present disclosure is not limited thereto.

The second side surface SS of the second electrode EL2 may be provided and/or formed on one side surface of the second bank pattern BNK2 to have a surface profile corresponding to a shape of one side surface of the second bank pattern BNK2. For example, when one side surface of the second bank pattern BNK2 has a slope (e.g., a set or predetermined slope), the second side surface SS of the second electrode EL2 may also have a surface profile corresponding to the slope.

Further, the remaining portion of the second electrode EL2 may have a surface profile corresponding to the passivation layer PSV having a flat surface.

The (1-2) electrode EL1_2 may be provided and/or formed on the other side surface of the second bank pattern BNK2 and on the passivation layer PSV to have a surface profile corresponding to the other side surface of the second bank pattern BNK2 and the passivation layer PSV. For example, when the other side surface of the second bank pattern BNK2 has a slope (e.g., a set or predetermined slope), the (1-2)-th electrode EL1_2 may also have a surface profile corresponding to the slope. In this case, one side surface and the other side surface of the second bank pattern BNK2 may have the same slope, but the present disclosure is not limited thereto. Further, the (1-2)-th electrode EL1_2 may have a surface profile corresponding to the passivation layer PSV having a flat surface.

As described above, because each of the first and second electrodes EL1 and EL2 has the surface profile corresponding to the shape of the first bank pattern BNK1 or the second bank pattern BNK2 disposed under the first and second electrodes EL1 and EL2, light emitted from each of the light emitting elements LD may be reflected by each of the first and second electrodes EL1 and EL2 to further proceed in the image display direction of the display device. As a result, the efficiency of light emitted from each of the light emitting elements LD may be further improved. Each of the first and second bank patterns BNK1 and BNK2 and the first and second electrodes EL1 and EL2 may serve as a reflective member that guides the light emitted from the light emitting elements LD in a desired direction to improve the light efficiency of the display device.

Each of the light emitting elements LD may be an ultra-small light emitting diode using a material having an inorganic crystal structure, for example, having a size as small as nano-scale or micro-scale. Each of the light emitting elements LD may be a ultra-small light emitting diode manufactured by an etching method or a ultra-small light emitting diode manufactured by a growth method.

At least two to several tens of light emitting elements LD may be aligned and/or provided in the pixel area PXA of each pixel PXL, but the number of light emitting elements LD is not limited thereto. In some embodiments, the number of light emitting elements LD aligned and/or provided in the pixel area PXA may be variously changed.

Each of the light emitting elements LD may emit one of color light and/or white light. Each of the light emitting elements LD may be arranged on the first insulating layer INS1 between the first electrode EL1 and the second electrode EL2 such that the extending direction (or the length L direction) thereof is parallel to the first direction DR1. The light emitting elements LD may be prepared in a form sprayed in a solution and then be placed in the pixel area PXA of each pixel PXL.

The light emitting elements LD may be disposed in the pixel area PXA of each pixel PXL through an inkjet printing method, a slit coating method, or other methods. For example, the light emitting elements LD may be mixed with a volatile solvent to be supplied in the pixel area PXA through an inkjet printing method or a slit coating method. In this case, when a corresponding alignment signal is applied to each of the first and second electrodes EL1 and EL2 provided in the pixel area PXA, an electric field may be formed between the first and second electrodes EL1 and EL2. Accordingly, the light emitting elements LD may be aligned between the first electrode EL1 and the second electrode EL2.

After the light emitting elements LD are arranged, the light emitting elements LD are finally arranged and/or provided in the pixel area PXA of each pixel PXL by volatilizing the solvent or eliminating the solvent in another manner.

The light emitting elements LD may be disposed between two adjacent electrodes in the first direction DR1. The light emitting elements LD may include first light emitting elements LD1 disposed between the (1-1)-th electrode EL1_1 and the first side surface FS of the second electrode EL2, and second light emitting elements LD2 disposed between the second side surface SS of the second electrode EL2 and the (1-2)-th electrode EL1_2.

The first light emitting elements LD1 may be provided on the first insulating layer INS1 between the (1-1)-th electrode EL1_1 and the first side surface FS of the second electrode EL2 spaced from each other on the first bank pattern BNK1. The second light emitting elements LD2 may be provided on the first insulating layer INS1 between the second side surface SS of the second electrode EL2 and the (1-2)-th electrode EL1_2 spaced from each other on the second bank pattern BNK2.

The first insulating layer INS1 may include an inorganic insulating film made of an inorganic material or an organic insulating film made of an organic material. In the described embodiments of the present disclosure, the first insulating layer INS1 may be formed as an inorganic insulating film that is suitable for protecting the first and second light emitting elements LD1 and LD2 from the pixel circuit layer PCL of each pixel PXL. For example, the first insulating layer INS1 may include at least one of metal oxides such as a silicon nitride (SiNx), a silicon oxide (SiOx), a silicon oxynitride (SiOxNy), and an aluminum oxide (AlOx), but the present disclosure is not limited thereto. In some embodiments, the first insulating layer INS1 may be formed as an organic insulating film that is suitable for flattening a support surface of the first and second light emitting elements LD1 and LD2.

The first insulating layer INS1 may be provided as a single film or multi-film. When the first insulating layer INS1 is provided as a multi-film, the first insulating layer INS1 may be provided in a distributed bragg reflector (DBR) structure in which a first layer and a second layer having different refractive indexes and configured of inorganic insulating films are alternately stacked. For example, the first insulating layer INS1 may be provided in a structure in which a first layer having a small refractive index and a second layer having a larger refractive index than that of the first layer are alternately stacked. As described above, when the first insulating layer INS1 is provided as a multi-film, the first insulating layer INS1 may be used as a reflective member that reflects light emitted from the light emitting elements LD in a target direction by using reinforcing interference due to a difference in refractive index between the first layer and the second layer. In this case, each of the first and second layers may include at least one of a silicon oxide (SiOx), a silicon nitride (SiNx), a silicon oxynitride (SiOxNy), a silicon oxycarbide (SiOxCy), a silicon carbonitride (SiCxNy), a silicon oxycarbide (SiOxCy), an aluminum oxide (AlOx), an aluminum nitride (AlNx), a hafnium oxide (HfOx), a zirconium oxide (ZrOx), a titanium oxide (TiOx), and a tantalum oxide (TaOx).

The first insulating layer INS1 may be provided on the first and second electrodes EL1 and EL2, and may include a first opening OPN1 exposing one area of the (1-1)-th electrode EL1_1, a second opening OPN2 exposing one area of the second electrode EL2, and a third opening OPN3 exposing one area of the (1-2)-th electrode EL1_2. The (1-1)-th electrode EL1_1 may directly contact and be connected to a first contact electrode CNE1 through the first opening OPN1 of the first insulating layer INS1, the second electrode EL2 may directly contact and be connected to a second contact electrode CNE2 through the second opening OPN2 of the first insulating layer INS1, and the (1-2)-th electrode EL1_2 may directly contact and be connected to a third contact electrode CNE3 through the third opening OPN3 of the first insulating layer INS1. The first insulating layer INS1 may cover the remaining areas excluding one area of the (1-1)-th electrode EL1_1, one area of the second electrode EL2, and one area of the (1-2)-th electrode EL1_2.

The first light emitting elements LD1 may overlap the first bank pattern BNK1 when viewed in a plan view, and the second light emitting elements LD2 may overlap the second bank pattern BNK2 when viewed in a plan view. Further, the first light emitting elements LD1 may be disposed at an upper portion of the first bank pattern BNK1 when viewed in a cross-sectional view, and the second light emitting elements LD2 may be disposed at an upper portion of the second bank pattern BNK2 when viewed in a cross-sectional view.

The second insulating layer INS2 may be provided and/or formed on the first and second light emitting elements LD1 and LD2, respectively. The second insulating layer INS2 may be provided and/or formed on the first and second light emitting elements LD1 and LD2 to partially cover an outer peripheral surface (e.g., a circumferential surface or a surface) of each of the first and second light emitting elements LD1 and LD2, and to expose respective end portions of each of the first and second light emitting elements LD1 and LD2 to the outside. The second insulating layer INS2 may be formed as an independent insulating pattern in the pixel area PXA of each pixel PXL, but the present disclosure is not limited thereto.

The second insulating layer INS2 may be formed as a single film or multi-film, and may include an inorganic insulating film including at least one inorganic material or an organic insulating film including at least one organic material. The second insulating layer INS2 may include an inorganic insulating film that is suitable for protecting the active layers 12 of each of the first and second light emitting elements LD1 and LD2 from external oxygen and moisture. However, the present disclosure is not limited thereto. Depending on design conditions of the display device to which the first and second light emitting elements LD1 and LD2 are applied, the second insulating layer INS2 may be configured as an organic insulating film including an organic material.

In the described embodiments of the present disclosure, after the alignment of the first and second light emitting elements LD1 and LD2 in the pixel area PXA of each of the pixels PXL is completed, the first and second light emitting elements LD1 and LD2 may be prevented from being deviated from the aligned positions by forming the second insulating layer INS2 on the first and second light emitting elements LD1 and LD2. When there is a gap (or space) between the first insulating layer INS1 and the first and second light emitting elements LD1 and LD2 before the second insulating layer INS2 is formed, the gap may be filled with the second insulating layer INS2 in the process of forming the second insulating layer INS2. Accordingly, the second insulating layer INS2 may be configured as an organic insulation film that is suitable for filling the gap between the first insulating layer INS1 and the first and second light emitting elements LD1 and LD2.

The second insulating layer INS2 is formed on each of the first and second light emitting elements LD1 and LD2, so that the active layers 12 of each of the first and second light emitting elements LD1 and LD2 may not contact an external conductive material. The second insulating layer INS2 may cover only a portion of an outer peripheral surface (e.g., a circumferential surface or a surface) of each of the first and second light emitting elements LD1 and LD2 to expose respective end portions of the first and second light emitting elements LD1 and LD2 to the outside.

The first contact electrode CNE1 may be provided and/or formed on the (1-1)-th electrode EL1_1. The first contact electrode CNE1 may directly contact the (1-1)-th electrode EL1_1 exposed by the first opening OPN1 of the first insulating layer INS1 to be connected to the (1-1)-th electrode EL1_1. In some embodiments, when a capping layer is disposed on the (1-1)-th electrode EL1_1, the first contact electrode CNE1 may be disposed on the capping layer to be connected to the (1-1)-th electrode EL1_1 through the capping layer. Here, the capping layer may protect the (1-1)-th electrode EL1_1 from defects or the like generated during a manufacturing process of the display device, and may further enhance adhesion between the (1-1)-th electrode EL1_1 and the pixel circuit layer PCL disposed therebelow. The capping layer may include a transparent conductive material (or substance) such as indium zinc oxide (IZO) to reduce or minimize loss of light emitted from each of the first light emitting elements LD1 and reflected in the image display direction of the display device by the (1-1)-th electrode EL1_1.

Further, the first contact electrode CNE1 may be provided and/or formed on one end portion of each of the first light emitting elements LD1 to be connected to one end portion of each of the first light emitting elements LD1. Accordingly, the (1-1)-th electrode EL1_1 and one end portion of each of the first light emitting elements LD1 may be electrically connected to each other through the first contact electrode CNE1.

The second contact electrode CNE2 may be provided and/or formed on the second electrode EL2. The second contact electrode CNE2 may be connected to the second electrode EL2 by directly contacting the second electrode EL2 exposed by the second opening OPN2 of the first insulating layer INS1. In some embodiments, when the capping layer is disposed on the second electrode EL2, the second contact electrode CNE2 may be disposed on the capping layer to be connected to the second electrode EL2 through the capping layer.

Further, the second contact electrode CNE2 may be provided and/or formed on the other end portion of each of the first light emitting elements LD1 to be connected to the other end portion of each of the first light emitting elements LD1. Accordingly, the first side surface FS of the second electrode EL2 and the other end portion of each of the first light emitting elements LD1 may be connected to each other through the second contact electrode CNE2.

Further, the second contact electrode CNE2 may be provided and/or formed on one end portion of each of the second light emitting elements LD2 to be connected to one end portion of each of the second light emitting elements LD2. Accordingly, the second side surface SS of the second electrode EL2 and one end portion of each of the second light emitting elements LD2 may be connected to each other through the second contact electrode CNE2.

The third contact electrode CNE3 may be provided and/or formed on the (1-2)-th electrode EL1_2. The third contact electrode CNE3 may directly contact the (1-2)-th electrode EL1_2 exposed by the third opening OPN3 of the first insulating layer INS1 to be connected to the (1-2)-th electrode EL1_2. In some embodiments, when the capping layer is disposed on the (1-2)-th electrode EL1_2, the third contact electrode CNE3 may be disposed on the capping layer to be connected to the (1-2)-th electrode EL1_2 through the capping layer.

Further, the third contact electrode CNE3 may be provided and/or formed on the other end portion of each of the second light emitting elements LD2 to be connected to the other end portion of each of the second light emitting elements LD2. Accordingly, the (1-2)-th electrode EL1_2 and the other end portion of each of the second light emitting elements LD2 may be connected to each other through the third contact electrode CNE3.

The first to third contact electrodes CNE1 to CNE3 may be made of various transparent conductive materials (or substances) so that the light emitted from each of the first and second light emitting elements LD1 and LD2 and reflected by the first and second electrodes EL1 and EL2 proceeds in the image display direction of the display device without loss. For example, the first to third contact electrodes CNE1 to CNE3 may include at least one of various transparent conductive materials (or substances) such as an indium tin oxide (ITO), an indium zinc oxide (IZO), a zinc oxide (ZnO), an indium gallium zinc oxide (IGZO), and an indium tin zinc oxide (ITZO), and may be formed to be substantially transparent or translucent to satisfy a suitable light transmittance (e.g., a set or predetermined light transmittance) (or transmittance). However, the materials of the first to third contact electrodes CNE1 to CNE3 are not limited to the above-described embodiment. In some embodiments, the first to third contact electrodes CNE1 to CNE3 may be made of various opaque conductive materials (or substances). In some embodiments, the first to third contact electrodes CNE1 to CNE3 may be made of various opaque conductive materials (or substances). The first to third contact electrodes CNE1 to CNE3 may be formed as a single film or multi-film.

When viewed in a plan view, each of the first to third contact electrodes CNE1 to CNE3 may have a bar shape extending along the second direction DR2, but the present disclosure is not limited thereto. In some embodiments, the shapes of the first to third contact electrodes CNE1 to CNE3 may be variously changed within a range in which they are electrically stably connected to each of the first and second light emitting elements LD1 and LD2. Further, the shapes of the first to third contact electrodes CNE1 to CNE3 may be variously changed in consideration of the connection relationship with electrodes disposed thereunder.

The first to third contact electrodes CNE1 to CNE3 may be disposed to be spaced from each other in the first direction DR1. For example, the first contact electrode CNE1 and the second contact electrode CNE2 may be disposed to be spaced from each other with an interval (e.g., a set or predetermined interval) on the second insulating layer INS2 on the first light emitting elements LD1. Further, the second contact electrode CNE2 and the third contact electrode CNE3 may be disposed to be spaced from each other with an interval (e.g., a set or predetermined interval) on the second insulating layer INS2 on the second light emitting elements LD2.

The first to third contact electrodes CNE1 to CNE3 may be provided at the same layer, and may be formed through the same process. However, the present disclosure is not limited thereto, and in some embodiments, at least one contact electrode CNE and the remaining contact electrodes CNE from among the first to third contact electrodes CNE1 to CNE3 may be provided on different layers, and may be formed through different processes. For example, the first and third contact electrodes CNE1 and CNE3 and the second contact electrode CNE2 may be provided on different layers, and may be formed through different processes. In this case, as shown in FIG. 9, an auxiliary insulating layer AUINS may be provided and/or formed between the first and second contact electrodes CNE1 and CNE2, and between the second and third contact electrodes CNE2 and CNE3. The auxiliary insulating layer AUINS may include the same material as the first insulating layer INS1, or may include one or more materials selected from the materials illustrated as constituent materials of the first insulating layer INS1.

For example, the auxiliary insulating layer AUINS may be an inorganic insulating film including an inorganic material. The inorganic insulating film may include at least one of metal oxides such as a silicon nitride (SiNx), a silicon oxide (SiOx), a silicon oxynitride (SiOxNy), and an aluminum oxide (AlOx).

The third insulating layer INS3 may be provided and/or formed on the first to third contact electrodes CNE1 to CNE3. The third insulating layer INS3 may be an inorganic insulating film including an inorganic material or an organic insulating film including an organic material. For example, the third insulating layer INS3 may have a structure in which at least one inorganic insulating film and at least one organic insulating film are alternately stacked. The third insulating layer INS3 may entirely cover the display element layer DPL to block moisture or moisture from the outside from being introduced into the display element layer DPL including the light emitting elements LD.

The third insulating layer INS3 may be omitted to reduce or minimize constituent elements disposed above the first and second light emitting elements LD1 and LD2. For example, the third insulating layer INS3 may be omitted to reduce or minimize a problem in which light emitted from the first and second light emitting elements LD1 and LD2 is scattered and lost by constituent elements disposed above the first and second light emitting elements LD1 and LD2. When the third insulating layer INS3 is omitted, the first to third contact electrodes CNE1 to CNE3 may be exposed to the outside. As shown in FIG. 10, a light conversion pattern layer LCP may be disposed on the first to third contact electrodes CNE1 to CNE3 exposed to the outside. In this case, the light conversion pattern layer LCP may be one constituent element included in the display element layer DPL.

The light conversion pattern layer LCP may be disposed on the first to third contact electrodes CNE1 to CNE3, and may include a color conversion layer CCL and a color filter CF corresponding to a respective color (e.g., a set or predetermined color).

The color conversion layer CCL may include color conversion particles QD corresponding to a specific color. One color conversion layer CCL may include color conversion particles QD that convert light emitted from the light emitting elements LD disposed in the pixel area PXA of one pixel PXL into light of a specific color. For example, when the one pixel PXL is a red pixel (or red sub-pixel), the color conversion layer CCL may include the color conversion particles QD of a red quantum dot that converts light emitted from the light emitting elements LD into red light. As another example, when the one pixel PXL is a green pixel (or green sub-pixel), the color conversion layer CCL may include the color conversion particles QD of a green quantum dot that converts light emitted from the light emitting elements LD into green light. As another example, when the one pixel PXL is a blue pixel (or blue sub-pixel), the color conversion layer CCL may include the color conversion particles QD of a blue quantum dot that converts light emitted from the light emitting elements LD into blue light. In some embodiments, when the one pixel PXL is a blue pixel (or blue sub-pixel), as shown in FIG. 11B, a light scattering layer LSL including light scattering particles SCT may be provided instead of the color conversion layer CCL including the color conversion particles QD. For example, when the light emitting elements LD emits blue-based light, the one pixel PXL may include the light scattering layer LSL including the light scattering particles SCT configured of a light scattering material. The light scattering material may include, for example, a titanium oxide (TiOx) including a titanium dioxide (TiO$_2$) or silica. Each of the light scattering particles SCT may have various shapes and/or sizes depending on a refractive index of the light scattering layer LSL, a thickness of the light scattering layer LSL, and a distance between adjacent light scattering particles SCT. The light scattering particles SCT are dispersed in the light scattering layer LSL to scatter light proceeding to the light scattering layer LSL to prevent the light from being concentrated to a specific area of the light scattering layer LSL. A density of the above-described light scattering particles SCT may be differently adjusted for each area within the light scattering layer LSL. For example, when the light proceeding to the light scattering layer LSL is concentrated in a central area of the light scattering layer LSL, the light scattering particles SCT may be dispersed so as to be concentrated in the central area of the light scattering layer LSL, but the present disclosure is not limited thereto. In the above-described embodiment, it has been described that the light scattering particles SCT are provided only in the light scattering layer LSL, but the present disclosure is not limited thereto. In some embodiments, the light scattering particles SCT may be provided in the color conversion layer CCL. In this case, the color conversion layer CCL may include the light scattering particles SCT together with the color conversion particles QD. The above-described light scattering layer LSL may be omitted according to some embodiments.

According to another embodiment, when the one pixel PXL is the blue pixel (or blue sub-pixel), a base resin layer made of a transparent polymer may be provided instead of the color conversion layer CCL. The above-mentioned base resin layer may be used as a transmissive layer (or light transmitting layer), and in this case, the blue-based light emitted from the light emitting elements LD transmits through the transmissive layer as it is to proceed to the color filter CF while reducing or minimizing loss.

According to another embodiment, the light emitting elements LD may emit light of different colors for each corresponding pixel PXL. For example, when three pixels PXL arranged consecutively in the first direction DR1 form one unit pixel PXL, a first pixel PXL from among the three pixels PXL may include the light emitting elements LD that emit red-based light, a second pixel PXL from among the three pixels PXL may include the light emitting elements LD that emit green-based light, and a third pixel PXL from among the three pixels PXL may include the light emitting elements LD that emit blue-based light. In this case, the display element layer DPL of each of the three pixels PXL described above may include a transmissive layer configured as a base resin layer including the light scattering particles SCT, instead of the color conversion layer CCL including the color conversion particles QD. In some embodiments, the display element layer DPL of each of the three pixels PXL described above may include the color conversion layer CCL that converts light emitted from the light emitting elements LD included in each pixel PXL into light having a wavelength band substantially similar to the light. For example, the display element layer DPL of the first pixel PXL from among the three pixels PXL may include the color conversion layer CCL including the color conversion particles QD that convert red-based light emitted from the light emitting elements LD included in the corresponding pixel PXL into light of a similar wavelength band. The display element layer DPL of the second pixel PXL from among the three pixels PXL may include the color conversion layer CCL including the color conversion particles QD that convert green-based light emitted from the light emitting elements LD included in the corresponding pixel PXL into light of a similar wavelength band. The display element layer DPL of the third pixel PXL from among the three pixels PXL may include the color conversion layer CCL including the color conversion particles QD that convert blue-based light emitted from the light emitting elements LD included in the corresponding pixel PXL into light of a similar wavelength band.

The color filter CF may selectively transmit light of a specific color. The color filter CF may form the light conversion pattern layer LCP together with the color conversion layer CCL, and may include a color filter material that selectively transmits light of a specific color converted by the color conversion layer CCL. The color filter CF may include a red color filter, a green color filter, and a blue color filter. The above-described color filter CF may be provided in the pixel area PXA so as to correspond to the color conversion layer CCL.

In the above-described embodiment, when the consecutive three pixels PXL in the first direction DR1 form one unit pixel PXL, the embodiment in which the display element layer DPL of each of the above-described three pixels PXL includes the color conversion layer CCL for converting the light emitted from the light emitting elements LD included in the corresponding pixel PXL into light of a similar wavelength band has been described. In this case, in some embodiments, each of the three pixels PXL described above may include the color filter CF disposed on the color conversion layer CCL included in the corresponding pixel PXL. For example, the display element layer DPL of the first pixel PXL from among the three pixels PXL may include a red color filter disposed on the color conversion layer CCL, the display element layer DPL of the second pixel PXL from among the three pixels PXL may include a green color filter disposed on the color conversion layer CCL, and the display element layer DPL of the third pixel PXL from among the three pixels PXL may include a blue color filter disposed on the color conversion layer CCL.

The light conversion pattern layer LCP including the color conversion layer CCL and the color filter CF may be disposed in the emission area of the pixel area PXA. For example, the light conversion pattern layer LCP may be provided in a form that fills a space (A) surrounded by a dam portion DAM disposed in a peripheral area of the pixel area PXA. The space (A) is one portion of the pixel area PXA surrounded by the dam portion DAM, and may correspond to an emission area in which light is emitted from the pixel area PXA.

The dam portion DAM may be implemented by the bank BNK and a light blocking pattern LBP.

The light blocking pattern LBP is provided on the bank BNK, and may include a light blocking material preventing light leakage defects in which light leaks between each pixel PXL and adjacent pixels PXL. Further, the light blocking pattern LBP may prevent or reduce a mixture of light respectively emitted from the adjacent pixels PXL.

The light blocking pattern LBP may be a black matrix. In this case, the light blocking pattern LBP may include the same material as the first and second bank patterns BNK1 and BNK2. In some embodiments, the light blocking pattern LBP is configured to include at least one light blocking material and/or reflective material, so that it allows the light emitted from the light emitting elements LD disposed in the pixel area PXA of each pixel PXL to further proceed in the image display direction to the display device, thereby improving the light emission efficiency of the light emitting devices LD. In some embodiments, the light blocking pattern LBP may be provided in a multi-filmed structure in which at least two or more color filters selectively transmitting light of different colors from among a red color filter, a green color filter, and a blue color filter overlap each other. For example, the light blocking pattern LBP may be provided to include a red color filter, a green color filter disposed on the red color filter and overlapping the red color filter, and a blue color filter disposed on the green color filter and overlapping the green color filter. That is, the light blocking pattern LBP may be provided to have a structure in which a red color filter, a green color filter, and a blue color filter are sequentially stacked. In this case, the red color filter, the green color filter, and the blue color filter may be used as the light blocking pattern LBP for blocking light transmission, in the peripheral area of the pixel area PXA.

The light blocking pattern LBP may surround the first and second electrodes EL1 and EL2 and the light emitting elements LD in the peripheral area of the pixel area PXA, and may be provided to correspond to the bank BNK. The light blocking pattern LBP and the bank BNK may overlap each other in the third direction DR3, and may have the same or similar planar and cross-sectional shape.

The bank BNK may have a cross-section of a polygonal shape whose width decreases from one surface (for example, an upper surface) of the first insulating layer INS1 to an upper side along the third direction DR3, and the light blocking pattern LBP may have a cross-section of a polygonal shape whose width decreases from one surface (for example, an upper surface) of the bank BNK to an upper side along the third direction DR3. However, the present disclosure is not limited thereto, and in some embodiments, as shown in FIG. 11A, the bank BNK may have a cross section of a semi-elliptic shape or a semi-circular shape (or semi-spherical shape) of which width decreases from one surface of the first insulating layer INS1 to an upper side along the third direction DR3, and the light blocking pattern LBP may have a shape corresponding to the cross-sectional shape of the bank BNK.

In some embodiments, an intermediate layer CTL may be provided and/or formed between the color conversion layer CCL and the color filter CF as shown in FIG. 11B. The intermediate layer CTL may be a planarization layer that is disposed on the bank BNK and the color conversion layer CCL to flatten a step due to constituent elements disposed therebelow. Further, the intermediate layer CTL may be a refractive index conversion layer for improving emission luminance of each pixel PXL by converting a refractive index of light proceeding from the color conversion layer CCL to the color filter CF. As described above, when the intermediate layer CTL is provided and/or formed between the color conversion layer CCL and the color filter CF, the color filter CF may be disposed to be spaced from the adjacent color filter CF with the light blocking pattern LBP disposed therebetween. The adjacent color filters CF may partially overlap the light blocking pattern LBP disposed between them.

An encapsulation layer ENC may be provided and/or formed on the dam portion DAM and the light conversion pattern layer LCP. The encapsulation layer ENC may completely cover the display element layer DPL including the light conversion pattern layer LCP to prevent water or moisture from being introduced from the outside to the display element layer DPL. The encapsulation layer ENC may be an inorganic insulating film including an inorganic material or an organic insulating film including an organic material.

In the above-described embodiment, the (1-1)-th electrode EL1_1 and the first side surface FS of the second electrode EL2 may be disposed to be spaced from each other in the first direction DR1 on the first bank pattern BNK1, and the first light emitting elements LD1 may be disposed on the first insulating layer INS1 on the first bank pattern BNK1 between the (1-1)-th electrode EL1_1 and the first side surface FS of the second electrode EL2. The second side surface SS of the second electrode EL2 and (1-2)-th electrode EL1_2 may be disposed to be spaced from each other in the first direction DR1 on the second bank pattern BNK2, and the second light emitting elements LD2 may be disposed on the first insulating layer INS1 on the second bank pattern BNK2 between the second side surface SS of the second electrode EL2 and the (1-2)-th electrode EL1_2.

As the first light emitting elements LD1 are disposed above the first bank pattern BNK1 and the second light emitting elements LD2 are disposed above the second bank pattern BNK2, a distance between the light conversion pattern layer LCP and the first and second light emitting elements LD1 and LD2 may be reduced. For example, a distance between the color conversion layer CCL including the color conversion particles QD and the first and second light emitting elements LD1 and LD2 may be reduced. Accordingly, the light emitted from the light emitting elements LD may be concentrated (or proceed) to the color conversion layer CCL of the light conversion pattern layer LCP without loss (or without a significant loss). In this case, a larger amount of light is introduced to the color conversion layer CCL, so that an amount (or intensity) of light finally emitted from the color conversion layer CCL may increase, and thus the light emission efficiency of each pixel PXL may be improved.

Further, according to the above-described embodiment, as other elements excluding the contact electrode CNE made of a transparent conductive material (or substance) between the light emitting elements LD and the color conversion layer CCL, for example, the insulating layer and the like are not provided, the light emitted from the light emitting elements LD may not be dispersed by the insulating layer and the like, and may directly reach the color conversion layer CCL. Accordingly, the amount (or intensity) of the light finally emitted from the color conversion layer CCL may be further increased by further securing an amount of light that proceeds (or is introduced) to the color conversion layer CCL. In this case, the emission efficiency of each pixel PXL may be further improved.

Additionally, according to the above-described embodiment, the first and second bank patterns BNK1 and BNK2 are implemented as a black matrix to block (or absorb) light emitted from the light emitting elements LD and proceeding to the pixel circuit layer PCL, so that changes in element characteristics of the transistors T included in the pixel circuit layer PCL may be prevented or reduced.

FIG. 12A-FIG. 12K illustrate sequential schematic cross-sectional views of a manufacturing method of the pixel PXL of FIG. 10.

In FIG. 12A-FIG. 12K, differences from the above-described embodiment will be mainly described in order to avoid duplicate descriptions.

Referring to FIG. 1-FIG. 10 and FIG. 12A, the pixel circuit layer PCL is formed on the substrate SUB.

The pixel circuit layer PCL may include the buffer layer BFL, the transistors T, the storage capacitor Cst, the driving voltage wire DVL, and the passivation layer PSV. The passivation layer PSV may include the first contact hole CH1 exposing one area of the driving transistor Tdr and the second contact hole CH2 exposing one area of the driving voltage wire DVL.

Referring to FIG. 1-FIG. 10, FIG. 12A, and FIG. 12B, the first and second bank patterns BNK1 and BNK2 are formed on the passivation layer PSV. The first bank pattern BNK1 and the second bank pattern BNK2 may be spaced from each other by an interval (e.g., a set or predetermined interval) on the passivation layer PSV. The first and second bank patterns BNK1 and BNK2 may contain a light blocking material. For example, the first and second bank patterns BNK1 and BNK2 may be a black matrix.

Referring to FIG. 1-FIG. 10 and FIG. 12A-FIG. 12C, the first and second electrodes EL1 and EL2 and the first and second connection wires CNL1 and CNL2 that include a conductive material (or substance) having high reflectivity are formed on the first and second bank patterns BNK1 and BNK2.

The first electrode EL1 may include the (1-1)-th electrode EL1_1 and the (1-2)-th electrode E1_2 branched from the first connection wire CNL1. The second electrode EL2 may be provided between the (1-1)-th electrode EL1_1 and the (1-2)-th electrode EL1_2.

The (1-1)-th electrode EL1_1 and the first side surface FS of the second electrode EL2 may be disposed to be spaced from each other at an interval (e.g., a set or predetermined interval) in the first direction DR1 on the first bank pattern BNK1. The second side surface SS of the second electrode EL2 and the (1-2)-th electrode EL1_2 may be disposed to be spaced from each other at an interval (e.g., a set or predetermined interval) in the first direction DR1 on the second bank pattern BNK2.

The first electrode EL1 may be electrically and/or physically connected to the driving transistor Tdr through the first connection wire CNL1 and the first contact hole CH1. The second electrode EL2 may be electrically and/or physically connected to the driving voltage wire DVL through the second connection wire CNL2 and the second contact hole CH2.

Each of the first and second electrodes EU and EL2 may extend along the second direction DR2 when viewed in a plan view.

Referring to FIG. 1-FIG. 10 and FIG. 12A-FIG. 12D, the insulating material layer INS1 is formed on the passivation layer PSV including the first and second electrodes EL1 and EL2. The insulating material layer INS1 may be an inorganic insulating film including an inorganic material or an organic insulating film including an organic material. The insulating material layer INS1 may be patterned by a subsequent process to be provided as the first insulating layer INS1 including the first to third openings OPN1 to OPN3. Thus, the same reference numeral as the first insulating layer INS1 is denoted to the insulating material layer INS1.

Subsequently, the bank BNK is formed in the pixel area PXA of each pixel PXL. The bank BNK may be formed on the insulating material layer INS1. The bank BNK may be a pixel definition film that defines (or partitions) the pixel area PXA or emission area between each pixel PXL and adjacent pixels PXL thereto. The bank BNK may be disposed in the peripheral area of the pixel area PXA.

Referring to FIG. 1-FIG. 10 and FIG. 12A-FIG. 12E, an electric field is formed between the first and second electrodes EU and EL2 adjacent in the first direction DR1 by applying a corresponding alignment signal (or alignment voltage) to each of the first and second electrodes EL1 and EL2. In this case, the electric field may be formed between the (1-1)-th electrode EL1_1 and the first side surface FS of the second electrode EL2, and between the second side surface SS of the second electrode EL2 and the (1-2)-th electrode EL1_2.

Then, while the electric field is formed between the two adjacent electrodes, a mixed solution (or a solution) including the light emitting elements LD is injected into the pixel area PXA of each of the pixels PXL by using an inkjet printing method. For example, an inkjet nozzle is disposed on the insulating material layer INS1, and a solvent mixed with the plurality of light emitting elements LD may be injected into each pixel area PXA through the inkjet nozzle. The method of injecting the light emitting elements LD into the pixel area PXA is not limited to the above-described embodiment, and the method of injecting the light emitting elements LD may be variously changed.

When the light emitting elements LD are injected into the pixel area PXA, self-alignment of the light emitting elements LD may be induced due to an electric field formed between the first electrode EL1 and the second electrode EL2. Accordingly, the light emitting elements LD may be aligned between the first electrode EL1 and the second electrode EL2.

Because the (1-1)-th electrode EL1_1 and the first side surface FS of the second electrode EL2 are spaced from each other at a certain distance on the first bank pattern BNK1, when the alignment signal (or alignment voltage) is applied to each of the (1-1)-th and second electrodes EL1_1 and EL2, an electric field may be formed between the (1-1)-th electrode EL1_1 and the first side surface FS of the second electrode EL2 on the first bank pattern BNK1. Accordingly, some of the light emitting elements LD injected into the pixel area PXA may be aligned on an upper portion of the first bank pattern BNK1 while sinking by gravity. The light emitting elements LD aligned on the upper portion of the first bank pattern BNK1 may be the first light emitting elements LD1.

Because the second side surface SS of the second electrode EL2 and the (1-2) electrode EL1_2 are spaced from each other at a certain distance on the second bank pattern BNK2, when the alignment signal (or alignment voltage) is applied to each of the (1-2)-th and second electrodes EL1_2 and EL2, an electric field may be formed between the second side surface SS of the second electrode EL2 and the (1-2) electrode EL1_2 on the second bank pattern BNK2. Accordingly, some of the light emitting elements LD injected into the pixel area PXA may be aligned on an upper portion of the second bank pattern BNK2 while sinking by gravity. The light emitting elements LD aligned on the upper portion of the second bank pattern BNK2 may be the second light emitting elements LD2.

The first light emitting elements LD1 may be aligned on the insulating material layer INS1 on the first bank pattern BNK1 between the (1-1)-th electrode EL1_1 and the first side surface FS of the second electrode EL2 within the pixel area PXA. The second light emitting elements LD2 may be aligned on the insulating material layer INS1 on the second bank pattern BNK2 between the second side surface SS of the second electrode EL2 and the (1-2)-th electrode EL1_2 within the pixel area PXA.

Referring to FIG. 1-FIG. 10 and FIG. 12A-FIG. 12F, after the light emitting elements LD are aligned in the pixel area PXA, the second insulating layer INS2 is formed on each light emitting element LD. The second insulating layer INS2 may cover at least a portion of the upper surface of each of the light emitting elements LD to expose respective end portions of each of the light emitting elements LD excluding the active layer 12 thereof to the outside.

Through the process of forming the second insulating layer INS2 or an etching process performed before and after thereof, a portion of the insulating material layer INS1 is removed to form the first insulating layer INS1 that includes the first opening OPN1 exposing a portion of the (1-1)-th electrode EL1_1, the second opening OPN2 exposing a portion of the second electrode EL2, and the third opening OPN3 exposing a portion of the (1-2)-th electrode EL1_2.

When the process of forming the first and second insulating layers INS1 and INS2 is performed so that each pixel PXL may be independently or separately driven from pixels PXL adjacent thereto, a portion of the first connection wire CNL1 provided integrally with the first electrode EU may be removed. Accordingly, the first electrode EL1 provided to each pixel PXL may be electrically and/or physically separated from the first electrode EL1 provided to adjacent pixels PXL disposed in the same pixel row and/or the same pixel column.

Referring to FIG. 1-FIG. 10 and FIG. 12A-FIG. 12G, the first to third contact electrodes CNE1 to CNE3 are formed on the second insulating layer INS2.

The first contact electrode CNE1 is formed on the (1-1)-th electrode EL1_1, and may electrically connect the (1-1)-th electrode EL1_1 and one end portion of each of the first light emitting elements LD1.

The second contact electrode CNE2 is formed on the second electrode EL2, and may electrically connect the first side surface FS of the second electrode EL2 and the other end portion of each of the first light emitting elements LD1. Further, the second contact electrode CNE2 may electrically connect the second side surface SS of the second electrode EL2 and one end portion of each of the second light emitting elements LD2.

The third contact electrode CNE3 is formed on the (1-2)-th electrode EL1_2, and may electrically connect the (1-2)-th electrode EL1_2 and the other end portion of each of the second light emitting elements LD2.

Referring to FIG. 1-FIG. 10 and FIG. 12A-FIG. 12H, the light blocking pattern LBP is formed in the peripheral area of the pixel area PXA.

The light blocking pattern LBP may be formed on the bank BNK to form the dam portion DAM together with the bank BNK. The light blocking pattern LBP may be a black matrix, and may prevent light leakage defects in which light leaks between each pixel PXL and adjacent pixels PXL thereto. In the embodiment of the present disclosure, the light blocking pattern LBP may include the same material as the first and second bank patterns BNK1 and BNK2.

The dam portion DAM may be disposed in the peripheral area of the pixel area PXA to surround (or enclose) the first and second electrodes EL1 and EL2 and the light emitting elements LD to define the emission area of each pixel PXL. In this case, the emission area of each pixel PXL may correspond to the space (A) surrounded by the dam portion DAM.

Referring to FIG. 1-FIG. 10 and FIG. 12A-FIG. 12I, the color conversion layer CCL is formed in space (A) surrounded by the dam portion DAM. The color conversion layer CCL may be provided in the pixel area PXA so as to fill the space (A). The color conversion layer CCL may include the color conversion particles QD that convert light emitted from the light emitting elements LD into light of a specific color.

Referring to FIG. 1-FIG. 10 and FIG. 12A-FIG. 12J, the color filter CF is formed on the color conversion layer CCL. The color filter CF and the color conversion layer CCL may form the light conversion pattern layer LCP that converts light emitted from the light emitting elements LD into light of a specific color and selectively transmits the light.

Referring to FIG. 1-FIG. 10 and FIG. 12A-FIG. 12K, the encapsulation layer ENC is formed on the light conversion pattern layer LCP. The encapsulation layer ENC may completely cover the display element layer DPL including the light conversion pattern layer LCP to prevent the display element layer DPL from water or moisture from the outside.

Figure 13:
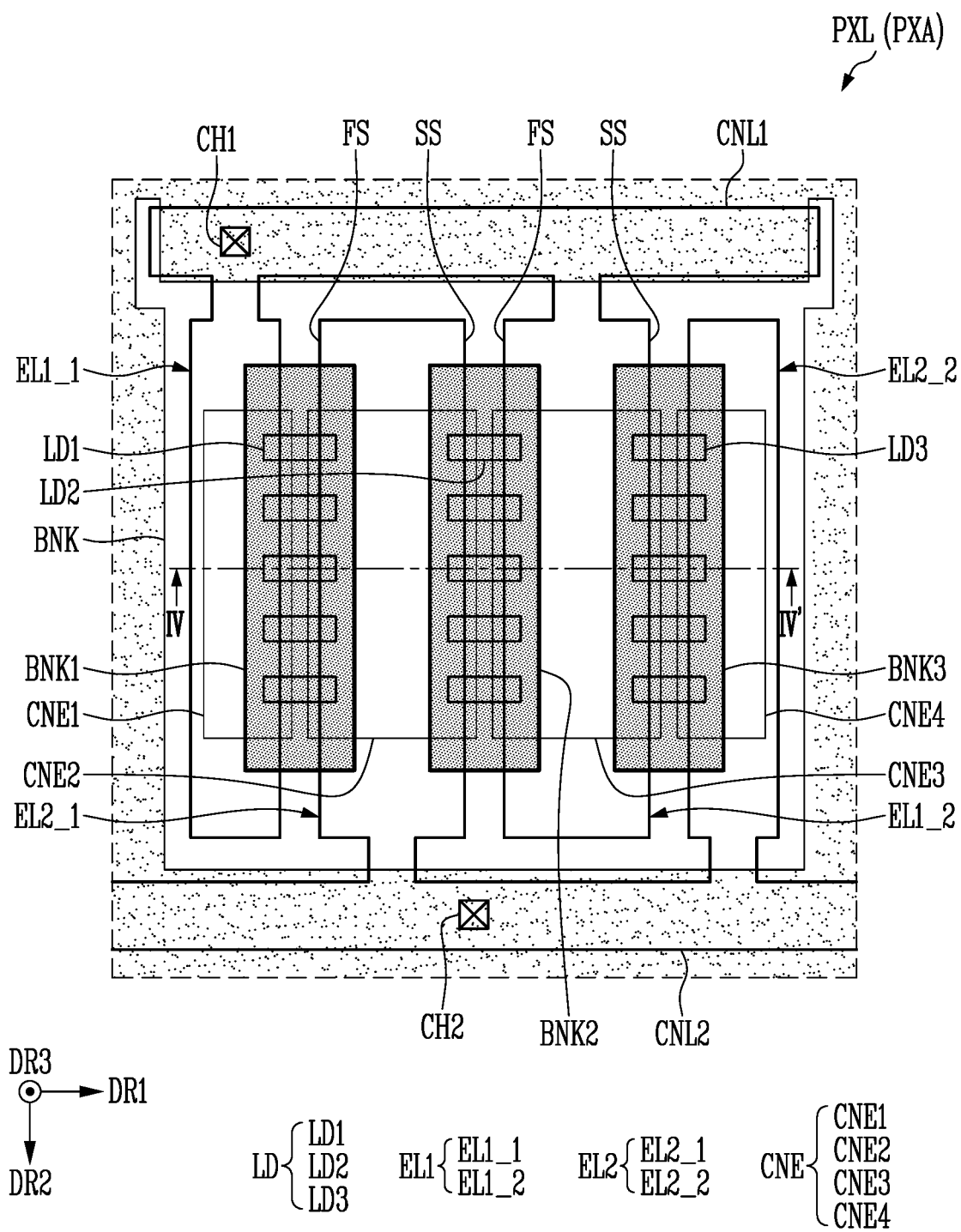
FIG. 13 illustrates a schematic top plan view of a pixel according to another embodiment of the present disclosure.
Figure 14:
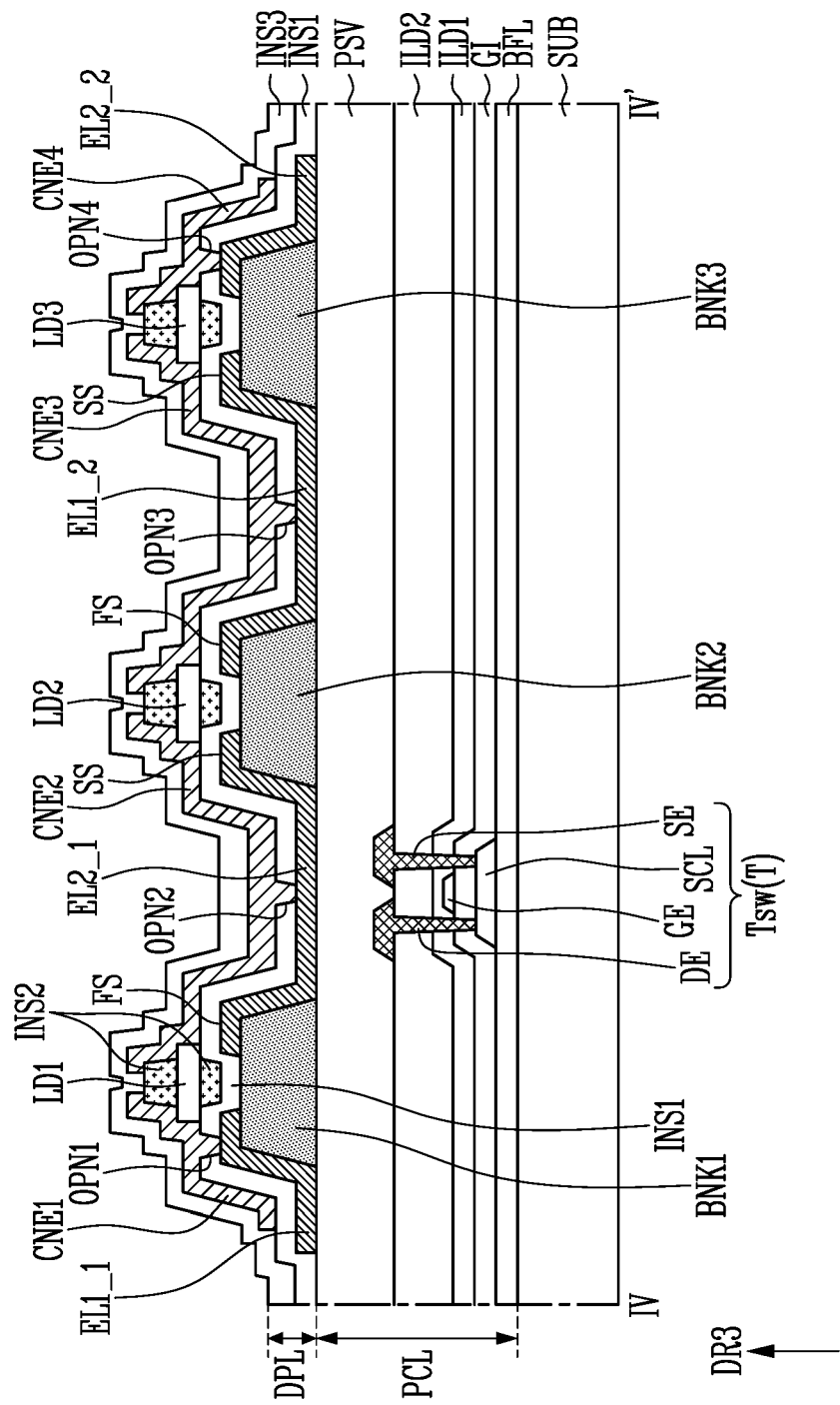
FIG. 14 illustrates a cross-sectional view taken along the line IV-IV' of FIG. 13.
Figure 15:
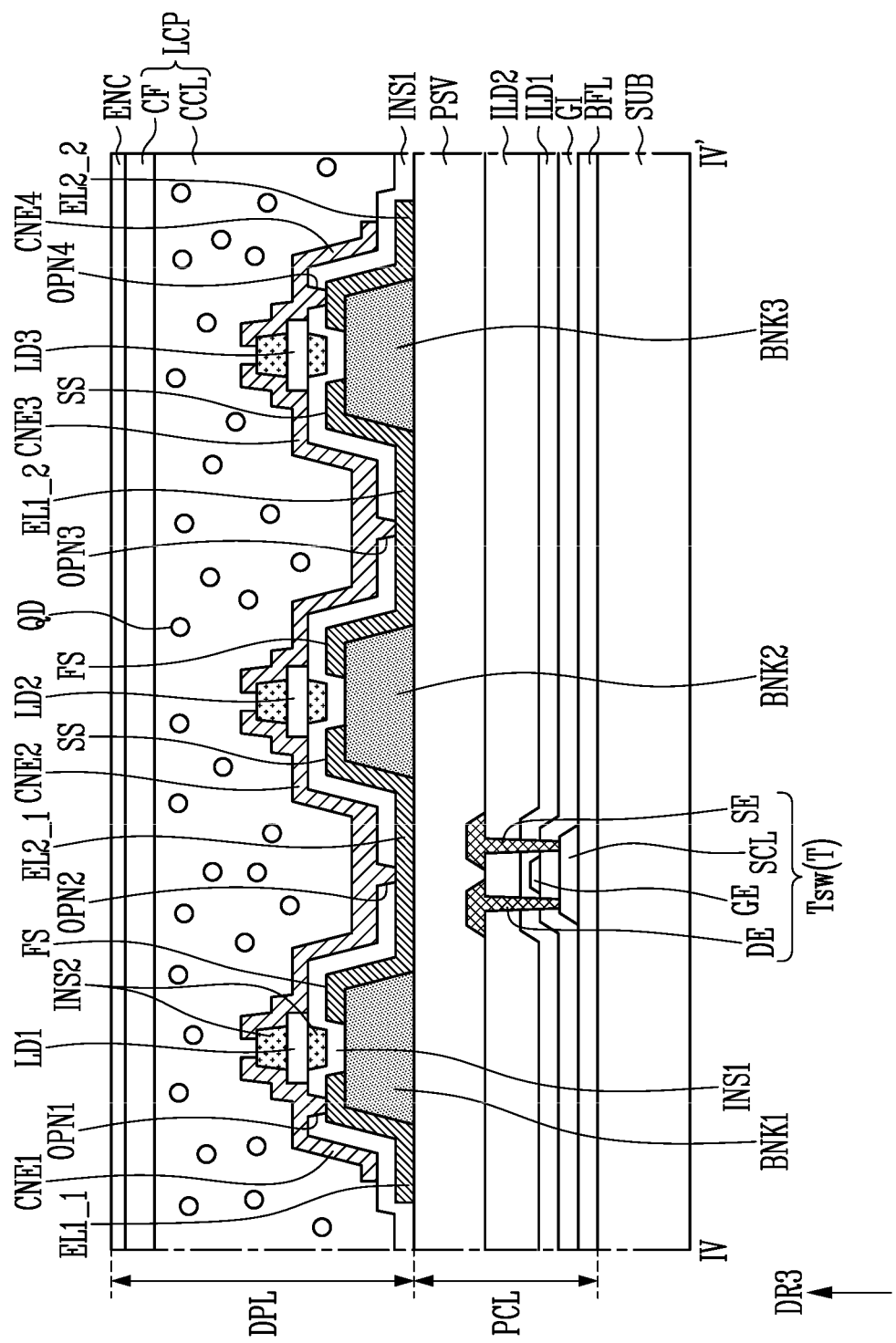
FIG. 15 schematically illustrates a state in which a display element layer includes a light conversion pattern layer in the pixel of FIG. 13, and illustrates a cross-sectional view corresponding to the line IV-IV' of FIG. 13.

FIG. 13 illustrates a schematic top plan view of a pixel PXL according to another embodiment of the present disclosure, FIG. 14 illustrates a cross-sectional view taken along the line IV-IV' of FIG. 13, and FIG. 15 schematically illustrates a state in which a display element layer DPL includes a light conversion pattern layer LCP in the pixel PXL of FIG. 13, and illustrates a cross-sectional view corresponding to the line IV-IV' of FIG. 13.

The pixel PXL shown in FIG. 13-FIG. 15 is substantially the same as or similar to the pixel PXL shown in FIG. 5A-FIG. 11B, except that a third bank pattern BNK3 is added and the second electrode EL2 includes (2-1)-th and (2-2)-th electrodes EL2_1 and EL2_2.

Therefore, in relation to the pixels of FIG. 13-FIG. 15, differences from the above-described embodiment will be mainly described in order to avoid duplicate descriptions.

Referring to FIG. 1-FIG. 4A and FIG. 13-FIG. 15, the substrate SUB, the pixel circuit layer PCL, and the display element layer DPL may be disposed in the pixel area PXA of each of the pixels PXL.

In the embodiment of the present disclosure, the display element layer DPL includes the first to third bank patterns BNK1 to BNK3, the first and second electrodes EL1 and EL2, the bank BNK, the light emitting elements LD, the contact electrode CNE, the light conversion pattern layer LCP, and the encapsulation layer ENC.

The first electrode EL1 may include the (1-1)-th electrode EL1_1 and the (1-2)-th electrode EL1_2 branched from the first connection wire CNL1 to the second direction DR2. The second electrode EL2 may include the (2-1)-th electrode EL2_1 and the (2-2)-th electrode EL2_2 branched from the second connection wire CNL2 to the second direction DR2.

The (2-1)-th electrode EL2_1 may be disposed between the (1-1)-th electrode EL1_1 and the (1-2)-th electrode (EL1_2), and the (1-2)-th electrode EL1_2 may be disposed between the (2-1)-th electrode EL2_1 and the (2-2)-th electrode EL2_2.

A first side surface FS of the (2-1)-th electrode EL2_1 may be an area of the (2-1)-th electrode EL2_1 facing (or opposite or disposed adjacent to) the (1-1)-th electrode EL1_1, and a second side surface SS of the (2-1)-th electrode EL2_1 may be an area of the (2-1)-th electrode EL2_1 facing (or opposite or disposed adjacent to) the (1-2)-th electrode EL1_2. A distance between the (1-1)-th electrode EL1_1 and the first side surface FS of the (2-1)-th electrode EL2_1 and a distance between the second side surface SS of the (2-1)-th electrode EL2_1 and a first side surface FS of the (1-2)-th electrode EL1_2 may be the same, but the present disclosure is not limited thereto.

The first side surface FS of the (1-2)-th electrode EL1_2 may be an area of the (1-2)-th electrode EL1_2 facing (or opposite or disposed adjacent to) the second side surface SS of the (2-1)-th electrode EL2_1, and the second side surface SS of the (1-2)-th electrode EL1_2 may be an area of the (1-2)-th electrode EL1_2 facing (or opposite or disposed adjacent to) the (2-2)-th electrode EL2_2. A distance between the first side surface FS of the (1-2)-th electrode EL1_2 and the second side surface SS of the (2-1)-th electrode EL2_1 and a distance between the second side surface SS of the (1-2)-th electrode EL1_2 and the (2-2)-th electrode EL2_2 may be the same, but the present disclosure is not limited thereto.

The first bank pattern BNK1 may be provided on the passivation layer PSV between the (1-1)-th electrode EL1_1 and the first side surface FS of the (2-1)-th electrode EL2_1. The (1-1)-th electrode EL1_1 and the first side surface FS of the (2-1)-th electrode EL2_1 may be provided and/or formed on the first bank pattern BNK1. When viewed in a plan view, the (1-1)-th electrode EL1_1 and the first side surface FS of the (2-1)-th electrode EL2_1 may partially overlap the first bank pattern BNK1. The (1-1)-th electrode EL1_1 and the first side surface FS of the (2-1)-th electrode EL2_1 may be disposed to be spaced from each other in the first direction DR1 on the first bank pattern BNK1.

The second bank pattern BNK2 may be provided on the passivation layer PSV between the second side surface SS of the (2-1)-th electrode EL2_1 and the first side surface FS of the (1-2)-th electrode EL1_2. The second side surface SS of the (2-1)-th electrode EL2_1 and the first side surface FS of the (1-2)-th electrode EL1_2 may be provided and/or formed on the second bank pattern BNK2. When viewed in a plan view, the second side surface SS of the (2-1)-th electrode EL2_1 and the first side surface FS of the (1-2)-th electrode EL1_2 may partially overlap the second bank pattern BNK2. The second side surface SS of the (2-1)-th electrode EL2_1 and the first side surface FS of the (1-2)-th electrode EL1_2 may be disposed to be spaced from each other in the first direction DR1 on the second bank pattern BNK2.

The third bank pattern BNK3 may be provided on the passivation layer PSV between the second side surface SS of the (1-2)-th electrode EL1_2 and the (2-2)-th electrode EL2_2. The second side surface SS of the (1-2)-th electrode EL1_2 and the (2-2)-th electrode EL2_2 may be provided and/or formed on the third bank pattern BNK3. When viewed in a plan view, the second side surface SS of the (1-2)-th electrode EL1_2 and the (2-2)-th electrode EL2_2 may partially overlap the third bank pattern BNK3. The second side surface SS of the (1-2)-th electrode EL1_2 and the (2-2)-th electrode EL2_2 may be disposed to be spaced from each other in the first direction DR1 on the third bank pattern BNK3.

The first to third bank patterns BNK1 to BNK3 may be configured in a black matrix containing a light blocking material. In this case, the first to third bank patterns BNK1 to BNK3 absorb (or block) the light emitted from the light emitting elements LD and proceeding in the direction of the pixel circuit layer PCL, so that it is possible to reduce light that may be introduced into the transistors T included in the pixel circuit layer PCL to prevent or reduce malfunction of the transistors T.

The first insulating layer INS1 may be provided on the first and second electrodes EL1 and EL2.

The first insulating layer INS1 may include a first opening OPN1 exposing a portion of the (1-1)-th electrode EL1_1, a second opening OPN2 exposing a portion of the (2-1)-th electrode EL2_1, a third opening OPN3 exposing a portion of the (1-2)-th electrode EL1_2, and a fourth opening OPN4 exposing a portion of the (2-2)-th electrode EL2_2.

The light emitting elements LD may be disposed on the first insulating layer INS1 between the first electrode EL1 and the second electrode EL2.

The light emitting elements LD may include first to third light emitting elements LD1 to LD3. The first light emitting elements LD1 may be disposed between the (1-1)-th electrode EL1_1 and the first side surface FS of the (2-1)-th electrode EL2_1 when viewed in a plan view. The second light emitting elements LD2 may be disposed between the second side surface SS of the (2-1)-th electrode EL2_1 and the first side surface FS of the (1-2)-th electrode EL1_2 when viewed in a plan view. The third light emitting elements LD3 may be disposed between the second side surface SS of the (1-2)-th electrode EL1_2 and the (2-2)-th electrode EL2_2 when viewed in a plan view.

Because the (1-1)-th electrode EL1_1 and the first side surface FS of the (2-1)-th electrode EL2_1 are spaced from each other at a certain distance on the first bank pattern BNK1, when the corresponding alignment signal (or alignment voltage) is applied to each of the first and second electrodes EL1 and EL2, the first light emitting elements LD1 may be aligned on the first bank pattern BNK1. That is, the first light emitting elements LD1 may be aligned on the first insulating layer INS1 on the first bank pattern BNK1.

Because the second side surface SS of the (2-1)-th electrode EL2_1 and the first side surface FS of the (1-2)-th electrode EL1_2 are spaced from each other at a certain distance on the second bank pattern BNK2, when the corresponding alignment signal is applied to each of the first and second electrodes EL1 and EL2, some of the light emitting elements LD may be aligned on the second bank pattern BNK2. That is, the second light emitting elements LD2 may be aligned on the first insulating layer INS1 on the second bank pattern BNK2.

Because the second side surface SS of the (1-2)-th electrode EL1_2 and the (2-2)-th electrode EL2_2 are spaced from each other at a certain distance on the third bank pattern BNK3, when the corresponding alignment signal is applied to each of the first and second electrodes EL1 and EL2, some of the light emitting elements LD may be aligned on the third bank pattern BNK3. That is, the third light emitting elements LD3 may be aligned on the first insulating layer INS1 on the third bank pattern BNK3.

The first and second electrodes EL1 and EL2 and the light emitting elements LD may be electrically stably connected through the contact electrode CNE.

The contact electrode CNE may include first to fourth contact electrodes CNE1 to CNE4.

The first contact electrode CNE1 may be provided on the (1-1)-th electrode EL1_1 to be electrically and/or physically connected to the (1-1)-th electrode EL1_1 through the first opening OPN1 of the first insulating layer INS1. The first contact electrode CNE1 may be provided and/or formed on one end portion of each of the first light emitting elements LD1. The (1-1)-th electrode EL1_1 and one end portion of each of the first light emitting elements LD1 may be electrically connected through the first contact electrode CNE1.

The second contact electrode CNE2 may be provided on the (2-1)-th electrode EL2_1 to be electrically and/or physically connected to the (2-1)-th electrode EL2_1 through the second opening OPN2 of the first insulating layer INS1. The second contact electrode CNE2 may be provided and/or formed on the other end portion of each of the first light emitting elements LD1 and one end portion of each of the second light emitting elements LD2. The (2-1)-th electrode EL2_1 and the other end portion of each of the first light emitting elements LD1 may be electrically connected through the second contact electrode CNE2. Further, the (2-1)-th electrode EL2_1 and one end portion of each of the second light emitting elements LD2 may be electrically connected through the second contact electrode CNE2.

The third contact electrode CNE3 may be provided on the (1-2)-th electrode EL1_2 to be electrically and/or physically connected to the (1-2)-th electrode EL1_2 through the third opening OPN3 of the first insulating layer INS1. The third contact electrode CNE3 may be provided and/or formed on the other end portion of each of the second light emitting elements LD2 and one end portion of each of the third light emitting elements LD3. The (1-2)-th electrode EL1_2 and the other end portion of each of the first light emitting elements LD2 may be electrically connected through the third contact electrode CNE3. Further, the (1-2)-th electrode EL1_2 and one end portion of each of the third light emitting elements LD3 may be electrically connected through the third contact electrode CNE3.

The fourth contact electrode CNE4 may be provided on the (2-2)-th electrode EL2_2 to be electrically and/or physically connected to the (2-2)-th electrode EL2_2 by the fourth opening OPN4 of the first insulating layer INS1. The fourth contact electrode CNE4 may be provided and/or formed on the other end portion of each of the third light emitting elements LD3. The (2-2)-th electrode EL2_2 and the other end portion of each of the third light emitting elements LD3 may be electrically connected through the fourth contact electrode CNE4.

The third insulating layer INS3 or the light conversion pattern layer LCP may be provided on the first to fourth contact electrodes CNE1 to CNE4.

As described above, as the light emitting elements LD are disposed on the first insulating layer INS1 on the corresponding bank pattern, the distance between the light conversion pattern layer LCP and the light emitting elements LD decreases, so that an amount of light being introduced into the light conversion pattern layer LCP may increase. Accordingly, the amount (or intensity) of light finally emitted from the light conversion pattern layer LCP may increase, so that the light emission efficiency of each pixel PXL may be improved.

Figure 16:
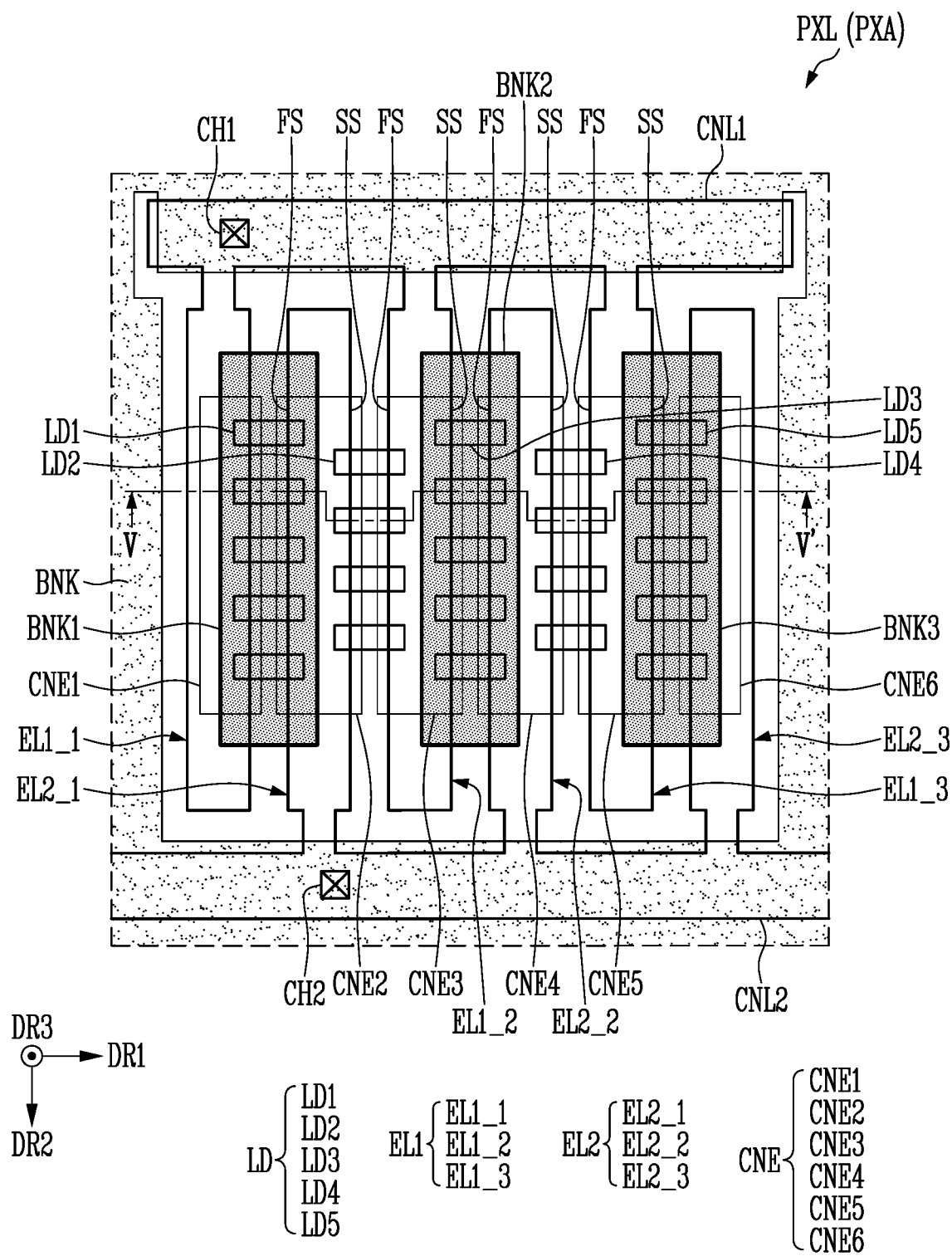
FIG. 16 illustrates a schematic top plan view of a pixel according to another embodiment of the present disclosure.
Figure 17:
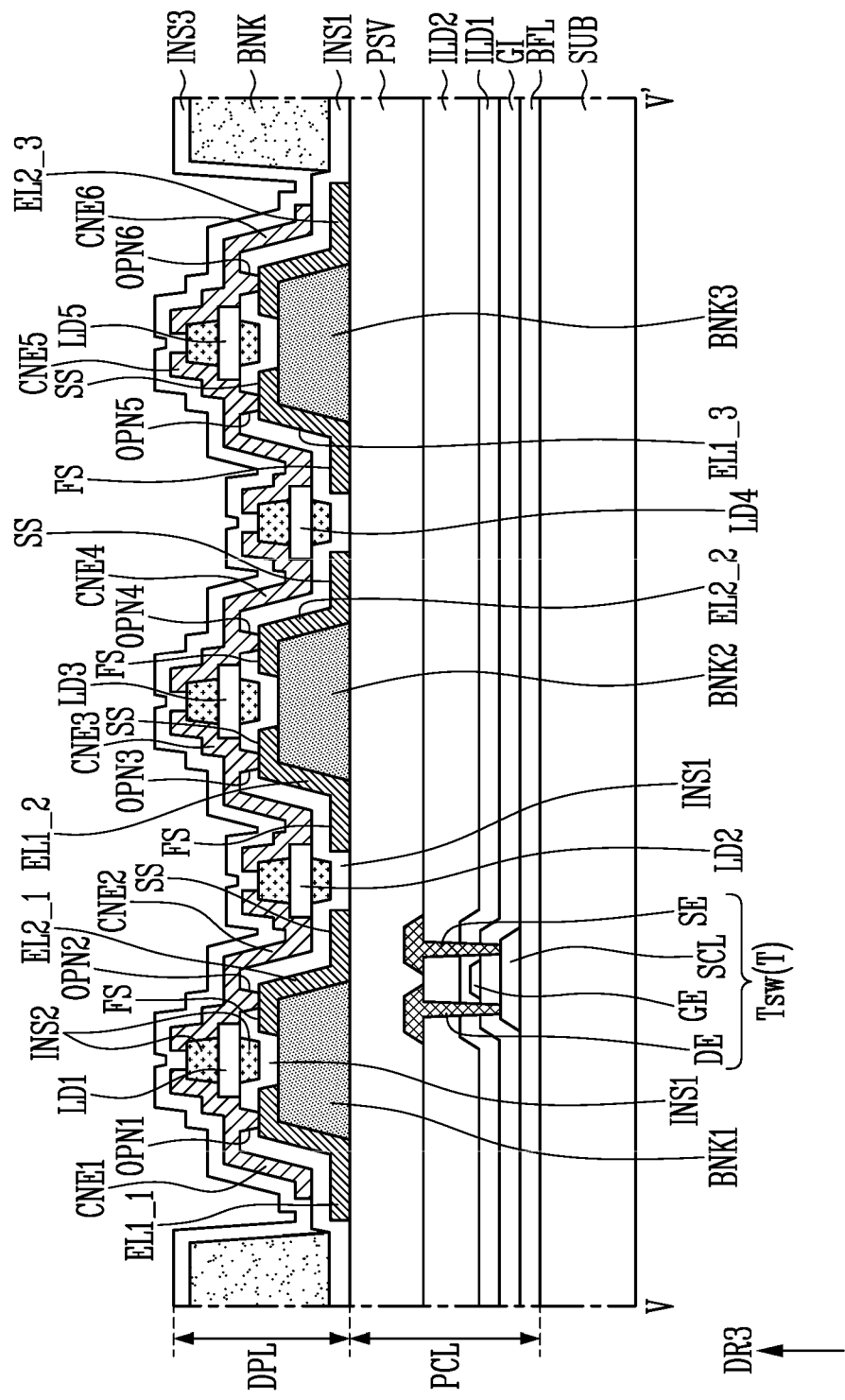
FIG. 17 illustrates a cross-sectional view taken along the line V-V' of FIG. 16.
Figure 18:
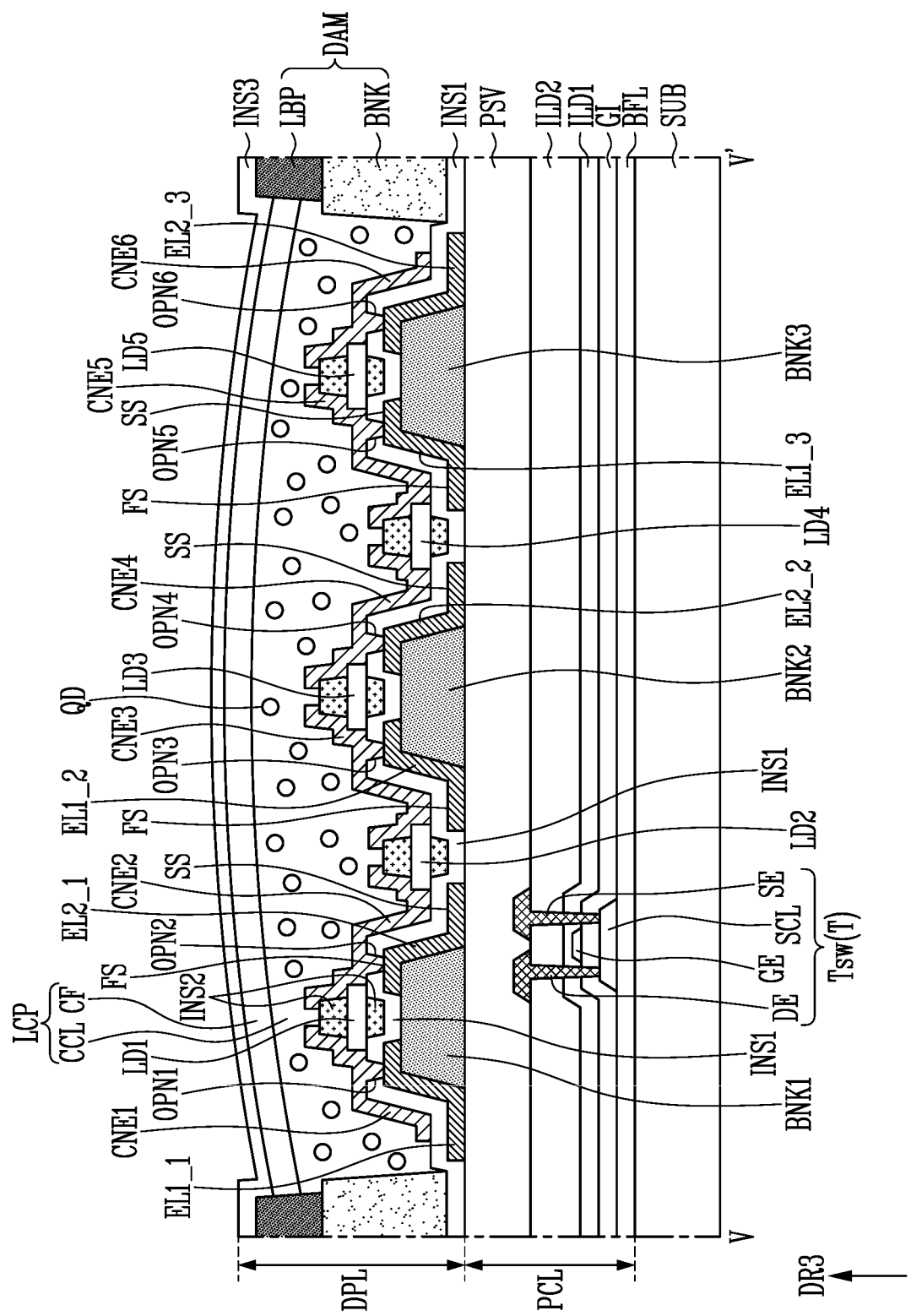
FIG. 18 schematically illustrates a state in which a display element layer includes a light conversion pattern layer in the pixel of FIG. 17, and illustrates a cross-sectional view corresponding to the line V-V' of FIG. 16.

FIG. 16 illustrates a schematic top plan view of a pixel according to another embodiment of the present disclosure, FIG. 17 illustrates a cross-sectional view taken along the line V-V' of FIG. 16, and FIG. 18 schematically illustrates a state in which a display element layer DPL includes a light conversion pattern layer LCP in the pixel of FIG. 17, and illustrates a cross-sectional view corresponding to the line V-V' of FIG. 16.

In relation to the pixel of FIG. 16-FIG. 18, differences from the above-described embodiment will be mainly described in order to avoid duplicate descriptions. Constituent elements not specifically described in the present disclosure refer to the embodiment described above, the same reference numerals designate the same constituent elements, and the similar reference numerals designate the similar constituent elements.

Referring to FIG. 1-FIG. 4A and FIG. 16-FIG. 18, the substrate SUB, the pixel circuit layer PCL, and the display element layer DPL may be disposed in the pixel area PXA of each of the pixels PXL.

In the described embodiments of the present disclosure, the display element layer DPL may include the first to third bank patterns BNK1 to BNK3, the first and second electrodes EL1 and EL2, the bank BNK, the light emitting elements LD, the contact electrode CNE, the light conversion pattern layer LCP, and an encapsulation layer ENC (e.g., similar to the encapsulation layer ENC of FIG. 15).

The first electrode EL1 and the second electrode EL2 may be spaced each other to be electrically and/or physically separated from each other.

The first electrode EL1 may include the (1-1)-th electrode EL1_1, the (1-2)-th electrode EL1_2, and a (1-3)-th electrode EL1_3 branched from the first connection wire CNL1 to the second direction DR2. The second electrode EL2 may include the (2-1)-th electrode EL2_1, the (2-2)-th electrode EL2_2, and a (2-3)-th electrode EL2_3 branched from the second connection wire CNL2 to the second direction DR2. When viewed in a plan view, in the first and second electrodes EL1 and EL2, the (1-1)-th electrode EL1_1, the (2-1)-th electrode EL2_1, the (1-2)-th electrode EL1_2, the (2-2)-th electrode EL2_2, the (1-3)-th electrode EL1_3, and the (2-3)-th electrode EL2_3 may be arranged in this order along the first direction DR1.

The (2-1)-th electrode EL2_1 may be disposed between the (1-1)-th electrode EL1_1 and the (1-2)-th electrode EL1_2, the (1-2)-th electrode EL1_2 may be disposed between the (2-1)-th electrode EL2_1 and the (2-2)-th electrode EL2_2, the (2-2)-th electrode EL2_2 may be disposed between the (1-2)-th electrode EL1_2 and the (1-3)-th electrode EL1_3, and the (1-3)-th electrode EL1_3 may be disposed between the (2-2)-th electrode EL2_2 and the (2-3)-th electrode EL2_3.

The first side surface FS of the (2-1)-th electrode EL2_1 may be an area of the (2-1)-th electrode EL2_1 facing (or opposite or disposed adjacent to) the (1-1)-th electrode EL1_1, and the second side surface SS of the (2-1)-th electrode EL2_1 may be an area of the (2-1)-th electrode EL2_1 facing (or opposite or disposed adjacent to) the (1-2)-th electrode EL1_2.

The first side surface FS of the (1-2)-th electrode EL1_2 may be an area of the (1-2)-th electrode EL1_2 facing (or opposite or disposed adjacent to) the (2-1)-th electrode EL2_1, and the second side surface SS of the (1-2)-th electrode EL1_2 may be an area of the (1-2)-th electrode EL1_2 facing (or opposite or disposed adjacent to) the (2-2)-th electrode EL2_2.

The first side surface FS of the (2-2)-th electrode EL2_2 may be an area of the (2-2)-th electrode EL2_2 facing (or opposite or disposed adjacent to) the (1-2)-th electrode EL1_2, and the second side surface SS of the (2-2)-th electrode EL2_2 may be an area of the (2-2)-th electrode EL2_2 facing (or opposite or disposed adjacent to) the (1-3)-th electrode EL1_3.

The first side surface FS of the (1-3)-th electrode EL1_3 may be an area of the (1-3)-th electrode EL1_3 facing (or opposite or disposed adjacent to) the (2-2)-th electrode EL2_2, and the second side surface SS of the (1-3)-th electrode EL1_3 may be an area of the (1-3)-th electrode EL1_3 facing (or opposite or disposed adjacent to) the (2-3)-th electrode EL2_3.

A distance between the (1-1)-th electrode EL1_1 and the (2-1)-th electrode EL2_1, a distance between the (2-1)-th electrode EL2_1 and the (1-2)-th electrode EL1_2, a distance between the (1-2)-th electrode EL1_2 and the (2-2)-th electrode EL2_2, a distance between the (2-2)-th electrode EL2_2 and the (1-3)-th electrode EL1_3, and a distance between the (1-3)-th electrode EL1_3 and the (2-3)-th electrode EL2_3 may be the same, but the present disclosure is not limited thereto.

The first bank pattern BNK1 may be provided on the passivation layer PSV between the (1-1)-th electrode EL1_1 and the first side surface FS of the (2-1)-th electrode EL2_1. The (1-1)-th electrode EL1_1 and the first side surface FS of the (2-1)-th electrode EL2_1 may be provided and/or formed on the first bank pattern BNK1. When viewed in a plan view, the (1-1)-th electrode EL1_1 and the first side surface FS of the (2-1)-th electrode EL2_1 may partially overlap the first bank pattern BNK1. The (1-1)-th electrode EL1_1 and the first side surface FS of the (2-1)-th electrode EL2_1 may be disposed to be spaced from each other in the first direction DR1 on the first bank pattern BNK1.

The second bank pattern BNK2 may be provided on the passivation layer PSV between the second side surface SS of the (1-2)-th electrode EL1_2 and the first side surface FS of the (2-2)-th electrode EL2_2. The second side surface SS of the (1-2)-th electrode EL1_2 and the first side surface FS of the (2-2)-th electrode EL2_2 may be provided and/or formed on the second bank pattern BNK2. When viewed in a plan view, the second side surface SS of the (1-2)-th electrode EL1_2 and the first side surface FS of the (2-2)-th electrode EL2_2 may partially overlap the second bank pattern BNK2. The second side surface SS of the (1-2)-th electrode EL1_2 and the first side surface FS of the (2-2)-th electrode EL2_2 may be disposed to be spaced from each other in the first direction DR1 on the second bank pattern BNK2.

The third bank pattern BNK3 may be provided on the passivation layer PSV between the second side surface SS of the (1-3)-th electrode EL1_3 and the (2-3)-th electrode EL2_3. The second side surface SS of the (1-3)-th electrode EL1_3 and the (2-3)-th electrode EL2_3 may be provided and/or formed on the third bank pattern BNK3. When viewed in a plan view, the second side surface SS of the (1-3)-th electrode EL1_3 and the (2-3)-th electrode EL2_3 may partially overlap the third bank pattern BNK3. The second side surface SS of the (1-3)-th electrode EL1_3 and the (2-3)-th electrode EL2_3 may be disposed to be spaced from each other in the first direction DR1 on the third bank pattern BNK3.

The first to third bank patterns BNK1 to BNK3 may be configured in a black matrix containing a light blocking material.

The second side surface SS of the (2-1)-th electrode EL2_1 and the first side surface FS of the (1-2)-th electrode EL1_2 may be disposed to be spaced from each other in the first direction DR1 on the passivation layer PSV. The second side surface SS of the (2-2)-th electrode EL2_2 and the first side surface FS of the (1-3)-th electrode EL1_3 may be disposed to be spaced from each other in the first direction DR1 on the passivation layer PSV. That is, the bank pattern is not provided between the second side surface SS of the (2-1)-th electrode EL2_1 and the first side surface FS of the (1-2)-th electrode EL1_2 and between the second side surface SS of the (2-2)-th electrode EL2_2 and the first side surface FS of the (1-3)-th electrode EL1_3.

The first insulating layer INS1 may be provided on the first and second electrodes EL1 and EL2.

The first insulating layer INS1 may include a first opening OPN1 exposing a portion of the (1-1)-th electrode EL1_1, a second opening OPN2 exposing a portion of the (2-1)-th electrode EL2_1, a third opening OPN3 exposing a portion of the (1-2)-th electrode EL1_2, a fourth opening OPN4 exposing a portion of the (2-2)-th electrode EL2_2, a fifth opening OPN5 exposing a portion of the (1-3)-th electrode EL1_3, and a sixth opening OPN6 exposing a portion of the (2-3)-th electrode EL2_3.

The light emitting elements LD may include first to fifth light emitting elements LD1 to LD5.

The first light emitting elements LD1 may be disposed between the (1-1)-th electrode EL1_1 and the first side surface FS of the (2-1)-th electrode EL2_1 when viewed in a plan view. The second light emitting elements LD2 may be disposed between the second side surface SS of the (2-1)-th electrode EL2_1 and the first side surface FS of the (1-2)-th electrode EL1_2 when viewed in a plan view. The third light emitting elements LD3 may be disposed between the second side surface SS of the (1-2)-th electrode EL1_2 and the first side surface FS of the (2-2)-th electrode EL2_2. The fourth light emitting elements LD4 may be disposed between the second side surface SS of the (2-2)-th electrode EL2_2 and the first side surface FS of the (1-3)-th electrode EL1_3. The fifth light emitting elements LD5 may be disposed between the second side surface SS of the (1-3)-th electrode EL1_3 and the (2-3)-th electrode EL2_3.

Because the (1-1)-th electrode EL1_1 and the first side surface FS of the (2-1)-th electrode EL2_1 are spaced from each other at a certain distance on the first bank pattern BNK1, when the corresponding alignment signal (or alignment voltage) is applied to each of the first and second electrodes EL1 and EL2, the first light emitting elements LD1 may be aligned on the first bank pattern BNK1. That is, the first light emitting elements LD1 may be aligned on the first insulating layer INS1 on the first bank pattern BNK1.

Because the second side surface SS of the (2-1)-th electrode EL2_1 and the first side surface FS of the (1-2)-th electrode EL1_2 are spaced from each other (e.g., spaced from each other at a set or predetermined distance) on the passivation layer PSV, when the corresponding alignment signal (or alignment voltage) is applied to each of the first and second electrodes EL1 and EL2, the second light emitting elements LD2 may be aligned on the passivation layer PSV. That is, the second light emitting elements LD2 may be aligned on the first insulating layer INS1 on the passivation layer PSV.

Because the second side surface SS of the (1-2)-th electrode EL1_2 and the first side surface FS of the (2-2)-th electrode EL2_2 are spaced from each other (e.g., spaced from each other at a set or predetermined distance) on the second bank pattern BNK2, when the corresponding alignment signal (or alignment voltage) is applied to each of the first and second electrodes EL1 and EL2, the third light emitting elements LD3 may be aligned on the second bank pattern BNK2. That is, the third light emitting elements LD3 may be aligned on the first insulating layer INS1 on the second bank pattern BNK2.

Because the second side surface SS of the (2-2)-th electrode EL2_2 and the first side surface FS of the (1-3)-th electrode EL1_3 are spaced from each other (e.g., spaced from each other at a set or predetermined distance) on the passivation layer PSV, when the corresponding alignment signal (or alignment voltage) is applied to each of the first and second electrodes EL1 and EL2, the fourth light emitting elements LD4 may be aligned on the passivation layer PSV. That is, the fourth light emitting elements LD4 may be aligned on the first insulating layer INS1 on the passivation layer PSV.

Because the second side surface SS of the (1-3)-th electrode EL1_3 and the (2-3)-th electrode EL2_3 are spaced from each other (e.g., spaced from each other at a set or predetermined distance) on the third bank pattern BNK3, when the corresponding alignment signal (or alignment voltage) is applied to each of the first and second electrodes EL1 and EL2, the fifth light emitting elements LD5 may be aligned on the third bank pattern BNK3. That is, the fifth light emitting elements LD5 may be aligned on the first insulating layer INS1 on the third bank pattern BNK3.

The first and second electrodes EL1 and EL2 and the light emitting elements LD may be electrically stably connected through the contact electrode CNE.

The contact electrode CNE may include first to sixth contact electrodes CNE1 to CNE6.

The first contact electrode CNE1 may be provided on the (1-1)-th electrode EL1_1 to be electrically and/or physically connected to the (1-1)-th electrode EL1_1 through the first opening OPN1 of the first insulating layer INS1. The first contact electrode CNE1 may be provided and/or formed on one end portion of each of the first light emitting elements LD1. The (1-1)-th electrode EL1_1 and one end portion of each of the first light emitting elements LD1 may be electrically connected through the first contact electrode CNE1.

The second contact electrode CNE2 may be provided on the (2-1)-th electrode EL2_1 to be electrically and/or physically connected to the (2-1)-th electrode EL2_1 through the second opening OPN2 of the first insulating layer INS1. The second contact electrode CNE2 may be provided and/or formed on the other end portion of each of the first light emitting elements LD1 and one end portion of each of the second light emitting elements LD2. The (2-1)-th electrode EL2_1 and the other end portion of each of the first light emitting elements LD1 may be electrically connected through the second contact electrode CNE2. In addition, the (2-1)-th electrode EL2_1 and one end portion of each of the first light emitting elements LD2 may be electrically connected through the second contact electrode CNE2.

The third contact electrode CNE3 may be provided on the (1-2)-th electrode EL1_2 to be electrically and/or physically connected to the (1-2)-th electrode EL1_2 through the third opening OPN3 of the first insulating layer INS1. The third contact electrode CNE3 may be provided and/or formed on the other end portion of each of the second light emitting elements LD2 and one end portion of each of the third light emitting elements LD3. The (1-2)-th electrode EL1_2 and the other end portion of each of the second light emitting elements LD2 may be electrically connected through the third contact electrode CNE3. In addition, the (1-2)-th electrode EL1_2 and one end portion of each of the third light emitting elements LD3 may be electrically connected through the third contact electrode CNE3.

The fourth contact electrode CNE4 may be provided on the (2-2)-th electrode EL2_2 to be electrically and/or physically connected to the (2-2)-th electrode EL2_2 through the fourth opening OPN4 of the first insulating layer INS1. The fourth contact electrode CNE4 may be provided and/or formed on the other end portion of each of the third light emitting elements LD3 and one end portion of each of the fourth light emitting elements LD4. The (2-2)-th electrode EL2_2 and the other end portion of each of the third light emitting elements LD3 may be electrically connected through the fourth contact electrode CNE4. In addition, the (2-2)-th electrode EL2_2 and one end portion of each of the fourth light emitting elements LD4 may be electrically connected through the fourth contact electrode CNE4.

The fifth contact electrode CNE5 may be provided on the (1-3)-th electrode EL1_3 to be electrically and/or physically connected to the (1-3)-th electrode EL1_3 through the fifth opening OPN5 of the first insulating layer INS1. The fifth contact electrode CNE5 may be provided and/or formed on the other end portion of each of the fourth light emitting elements LD4 and one end portion of each of the fifth light emitting elements LD5. The (1-3)-th electrode EL1_3 and the other end portion of each of the fourth light emitting elements LD4 may be electrically connected through the fifth contact electrode CNE5. The (1-3)-th electrode EL1_3 and one end portion of each of the fifth light emitting elements LD5 may be electrically connected through the fifth contact electrode CNE5.

The sixth contact electrode CNE6 may be provided on the (2-3)-th electrode EL2_3 to be electrically and/or physically connected to the (2-3)-th electrode EL2_3 through the sixth opening OPN6 of the first insulating layer INS1. The sixth contact electrode CNE6 may be provided and/or formed on the other end portion of each of the fifth light emitting elements LD5. The (2-3)-th electrode EL2_3 and the other end portion of each of the fifth light emitting elements LD5 may be electrically connected through the sixth contact electrode CNE6.

The third insulating layer INS3 or the light conversion pattern layer LCP may be provided on the first to sixth contact electrodes CNE1 to CNE6.

In the above-described embodiment, the first light emitting elements LD1, the third light emitting elements LD3, and the fifth light emitting elements LD5 may be disposed on the first insulating layer INS1 on the corresponding bank pattern between the first and second electrodes EL1 and EL2 spaced from each other, and the second and fourth light emitting elements LD2 and LD4 may be disposed on the first insulating layer INS1 on the corresponding passivation layer PSV between the first and second electrodes EL1 and EL2 spaced from each other.

As described above, as some of the light emitting elements LD are disposed on the first to third bank patterns BNK1 to BNK3 and the remainder of the light emitting elements LD are disposed on the passivation layer PSV, the number of light emitting elements LD arranged in the pixel area PXA of each pixel PXL may increase. That is, the number of the aligned light emitting elements LD per unit area may increase. Accordingly, the amount (or intensity) of the light emitted from each pixel PXL may increase, so that the light emission efficiency of the pixel PXL may be improved.

While the present disclosure has been shown and described with reference to certain embodiments thereof, it will be understood by those skilled in the art that various changes in forms and details may be made therein without departing from the spirit and scope of the present disclosure as defined by the appended claims and their equivalents.

Therefore, the technical scope of the present disclosure may be determined by on the technical scope of the accompanying claims, and equivalents thereof.

What is claimed is:

1. A pixel comprising:
   a first bank pattern on a substrate, the first bank pattern comprising a black matrix on a passivation layer;
   a first electrode and a second electrode on the first bank pattern and extending in a first direction;
   an insulating layer on the first electrode and the second electrode;
   a plurality of light emitting elements on the insulating layer between the first electrode and the second electrode;
   a first contact electrode electrically connecting the first electrode and the light emitting elements; and
   a second contact electrode electrically connecting the second electrode and the light emitting elements,
   wherein the first electrode and the second electrode are spaced from each other in a second direction different from the first direction on the first bank pattern.

2. The pixel of claim 1, wherein:
   the first electrode is on one side of the first bank pattern and partially overlaps the first bank pattern; and
   the second electrode is on an other side of the first bank pattern and partially overlaps the first bank pattern.

3. The pixel of claim 2, wherein the light emitting elements are on the insulating layer between the first electrode and the second electrode on the first bank pattern.

4. The pixel of claim 2, wherein the light emitting elements overlap the first bank pattern when viewed in a plan view and in a cross-sectional view.

5. The pixel of claim 3, wherein a width of the first bank pattern in the second direction is longer than a length of each of the light emitting elements.

6. The pixel of claim 5, further comprising:
   a bank surrounding the first and second electrodes; and
   a light blocking pattern on the bank,
   wherein the bank and the light blocking pattern comprise a same material.

7. The pixel of claim 6, wherein the bank and the light blocking pattern are a dam portion surrounding the first and second electrodes and the light emitting elements.

8. The pixel of claim 7, further comprising:
   a color conversion layer on the light emitting elements,
   wherein the color conversion layer fills an area in which the light emitting elements surrounded by the dam portion are located.

9. The pixel of claim 1, further comprising:
   a third electrode on the substrate adjacent the second electrode in the second direction.

10. The pixel of claim 9, wherein the second electrode includes a first side surface opposite the first electrode and a second side surface opposite the third electrode, in the second direction.

11. The pixel of claim 10, further comprising:
    a second bank pattern on the substrate adjacent to the first bank pattern in the second direction,
    wherein the second electrode and the third electrode are spaced from each other on the second bank pattern.

12. The pixel of claim 11, wherein:
    the first electrode is on one side of the first bank pattern and partially overlaps the first bank pattern;
    the first side surface of the second electrode is on an other side of the first bank pattern and partially overlaps the first bank pattern;
    the second side surface of the second electrode is on one side of the second bank pattern and partially overlaps the second bank pattern; and
    the third electrode is on an other side of the second bank pattern and partially overlaps the second bank pattern.

13. The pixel of claim 12, wherein the light emitting elements comprise:
    at least one first light emitting element on the first bank pattern between the first electrode and the second electrode; and
    at least one second light emitting element on the second bank pattern between the second electrode and the third electrode.

14. The pixel of claim 9, wherein:
    the second electrode and the third electrode are spaced from each other on the substrate; and the third electrode comprises a first side surface opposite the second electrode and a second side surface opposite the first side surface, in the second direction.

15. The pixel of claim 14, wherein:
the first electrode is on one side of the first bank pattern and partially overlaps the first bank pattern;
a first side surface of the second electrode on an other side of the first bank pattern and partially overlaps the first bank pattern;
a second side surface of the second electrode on the substrate and partially overlaps the substrate;
the first side surface of the third electrode is disposed on the substrate to partially overlaps the substrate; and
the second side surface of the third electrode on one side of a second bank pattern and partially overlaps the second bank pattern.

16. The pixel of claim 15, wherein the light emitting elements comprise:
at least one first light emitting element on the first bank pattern between the first electrode and the first side surface of the second electrode; and
at least one second light emitting element on the substrate between the second side surface of the second electrode and the first side surface of the third electrode.

17. A display device comprising:
a substrate including a plurality of pixel areas; and
a pixel in a corresponding one of the pixel areas,
wherein the pixel comprises:
a bank pattern on the substrate, the bank pattern comprising a black matrix on a passivation layer;
a first electrode and a second electrode on the bank pattern and extending in a first direction;
an insulating layer on the first electrode and the second electrode;
a plurality of light emitting elements on the insulating layer between the first electrode and the second electrode;
a first contact electrode electrically connecting the first electrode and the light emitting elements; and
a second contact electrode electrically connecting the second electrode and the light emitting elements,
wherein the first electrode and the second electrode are spaced from each other in a second direction different from the first direction on the bank pattern.

18. The display device of claim 17, wherein:
the first electrode is on one side of the bank pattern and partially overlaps the bank pattern, and
the second electrode on an other side of the bank pattern and partially overlaps the bank pattern.

19. The display device of claim 18, wherein the light emitting elements are on the insulating layer between the first electrode and the second electrode on the bank pattern.

* * * * *